United States Patent [19]
Yagi et al.

[11] Patent Number: 6,133,070
[45] Date of Patent: Oct. 17, 2000

[54] CIRCUIT MEMBER FOR SEMICONDUCTOR DEVICE, SEMICONDUCTOR DEVICE USING THE SAME, AND METHOD FOR MANUFACTURING THEM

[75] Inventors: Hiroshi Yagi; Osamu Nagasaki; Masato Sasaki, all of Shinjuku-Ku, Japan

[73] Assignee: Dai Nippon Printing Co., Ltd., Japan

[21] Appl. No.: 09/000,107

[22] PCT Filed: May 27, 1997

[86] PCT No.: PCT/JP97/01792

§ 371 Date: Jan. 26, 1998

§ 102(e) Date: Jan. 26, 1998

[87] PCT Pub. No.: WO97/45868

PCT Pub. Date: Dec. 4, 1997

[30] Foreign Application Priority Data

| May 27, 1996 | [JP] | Japan | 8-152900 |
| Sep. 6, 1996 | [JP] | Japan | 8-255290 |
| Jan. 8, 1997 | [JP] | Japan | 9-011851 |
| Mar. 12, 1997 | [JP] | Japan | 9-074680 |
| Apr. 2, 1997 | [JP] | Japan | 9-097886 |
| Apr. 14, 1997 | [JP] | Japan | 9-110070 |

[51] Int. Cl.[7] .......................... H01L 21/44; H01L 21/48; H01L 21/50

[52] U.S. Cl. .......................... 438/121; 438/108; 438/111; 438/123

[58] Field of Search .................. 438/121, 106, 438/107, 108, 110, 111, 123

[56] References Cited

U.S. PATENT DOCUMENTS 5,175,060  12/1992  Enomoto et al. .
5,497,032  3/1996  Tsuji et al. .
5,656,550  8/1997  Tsuji et al. .
5,759,047  6/1998  Brodsky et al. .

FOREIGN PATENT DOCUMENTS 0751561  1/1997  European Pat. Off. .
3-94459  4/1991  Japan .
95/26047  9/1995  WIPO .

*Primary Examiner*—Kevin M. Picardat
*Assistant Examiner*—D. M. Collins
*Attorney, Agent, or Firm*—Parkhurst & Wendel, L.L.P.

[57] ABSTRACT

Disclosed are a circuit member, which can cope with an ever-increasing demand for multiple terminals and is advantageous in productivity, cost, and quality, a semiconductor device using the circuit member, a process for producing the circuit member, and a process for producing a semiconductor device using the circuit member. The circuit member for a semiconductor device comprises: a conductive substrate; and a circuit section two-dimensionally formed using a conductive metal by plating on the conductive substrate, a part of the conductive metal constituting the circuit section being provided by plating on one side of the conductive substrate after subjecting the one side of the conductive substrate to surface treatment to create irregularities and to release treatment to impart releasability. The circuit section comprises a lead for electrical connection to a semiconductor element, and an external terminal section for electrical connection to an external circuit, a plurality of sets of the lead and the external terminal section integrally connected to each other being provided independently of each other. The external terminal section in the circuit section is provided directly on one side of the conductive substrate by electroplating, and the lead in the circuit section is provided on an insulating epoxy resin layer, the insulating epoxy resin layer having been provided directly on the conductive substrate excluding the external terminal forming area.

77 Claims, 44 Drawing Sheets

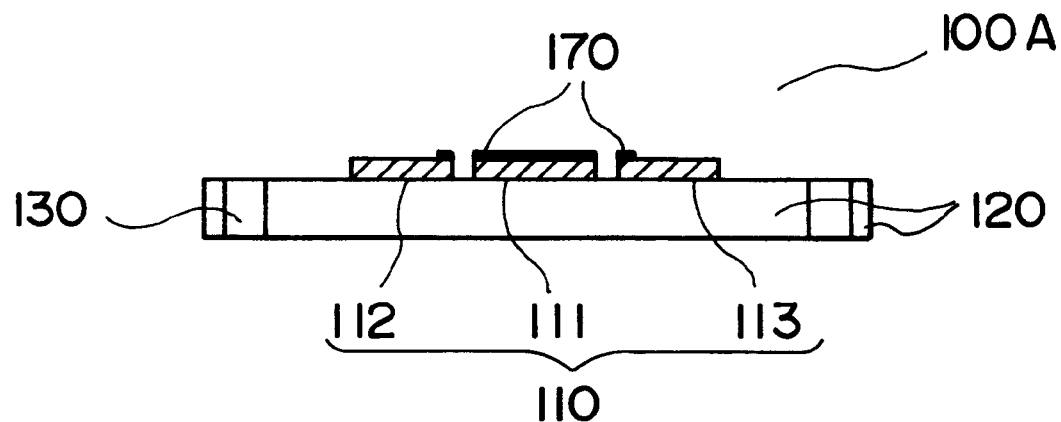
F I G. 3a
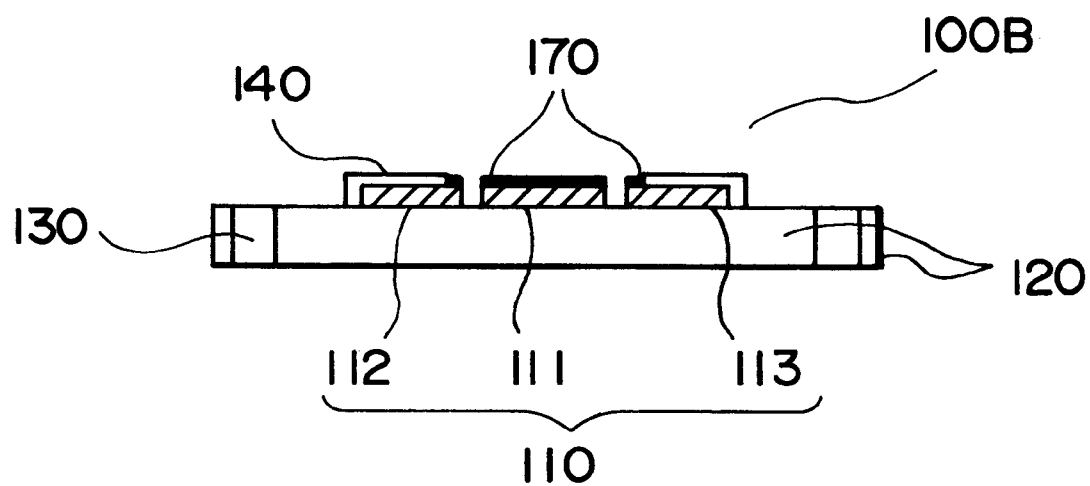
F I G. 3b

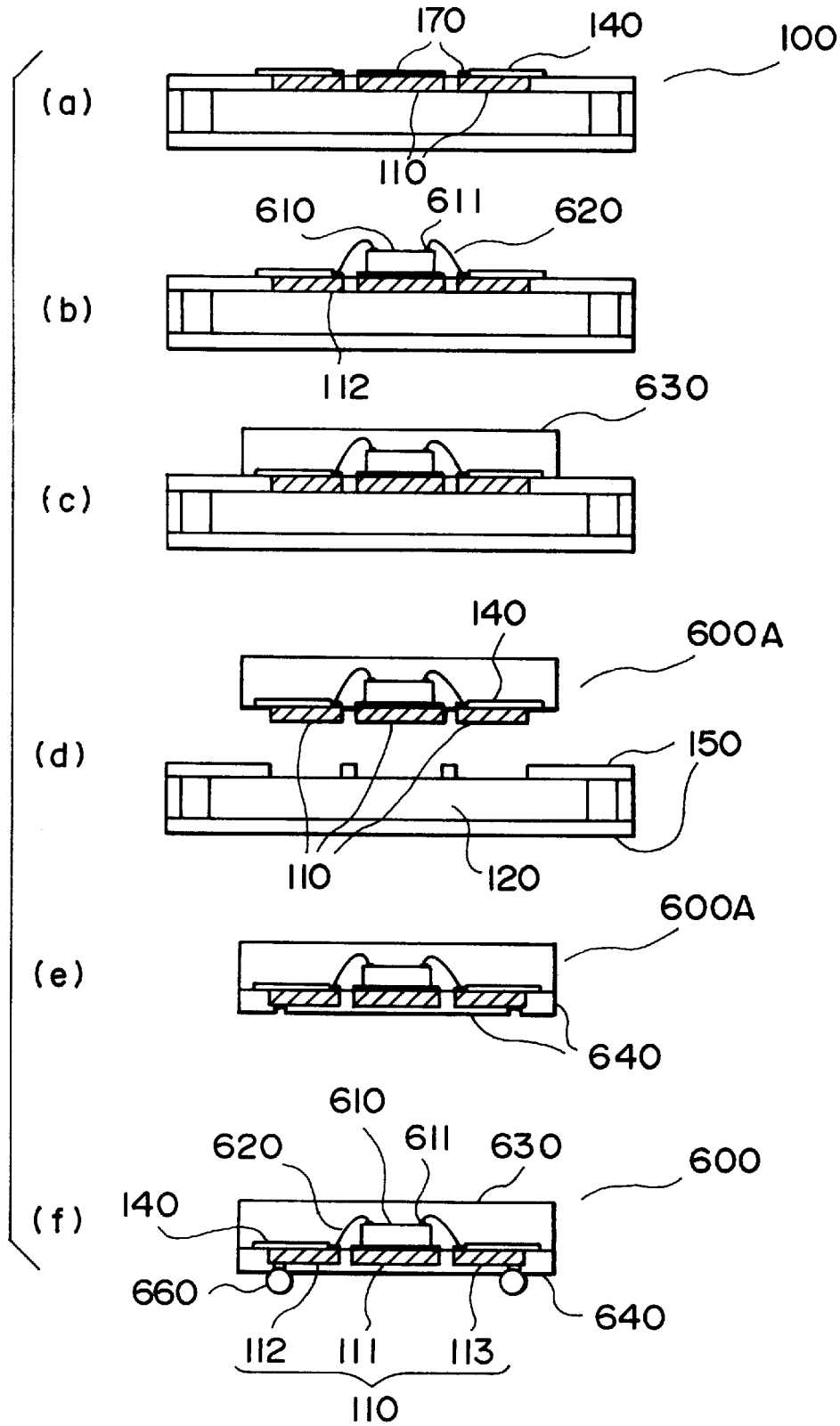
F I G. 7

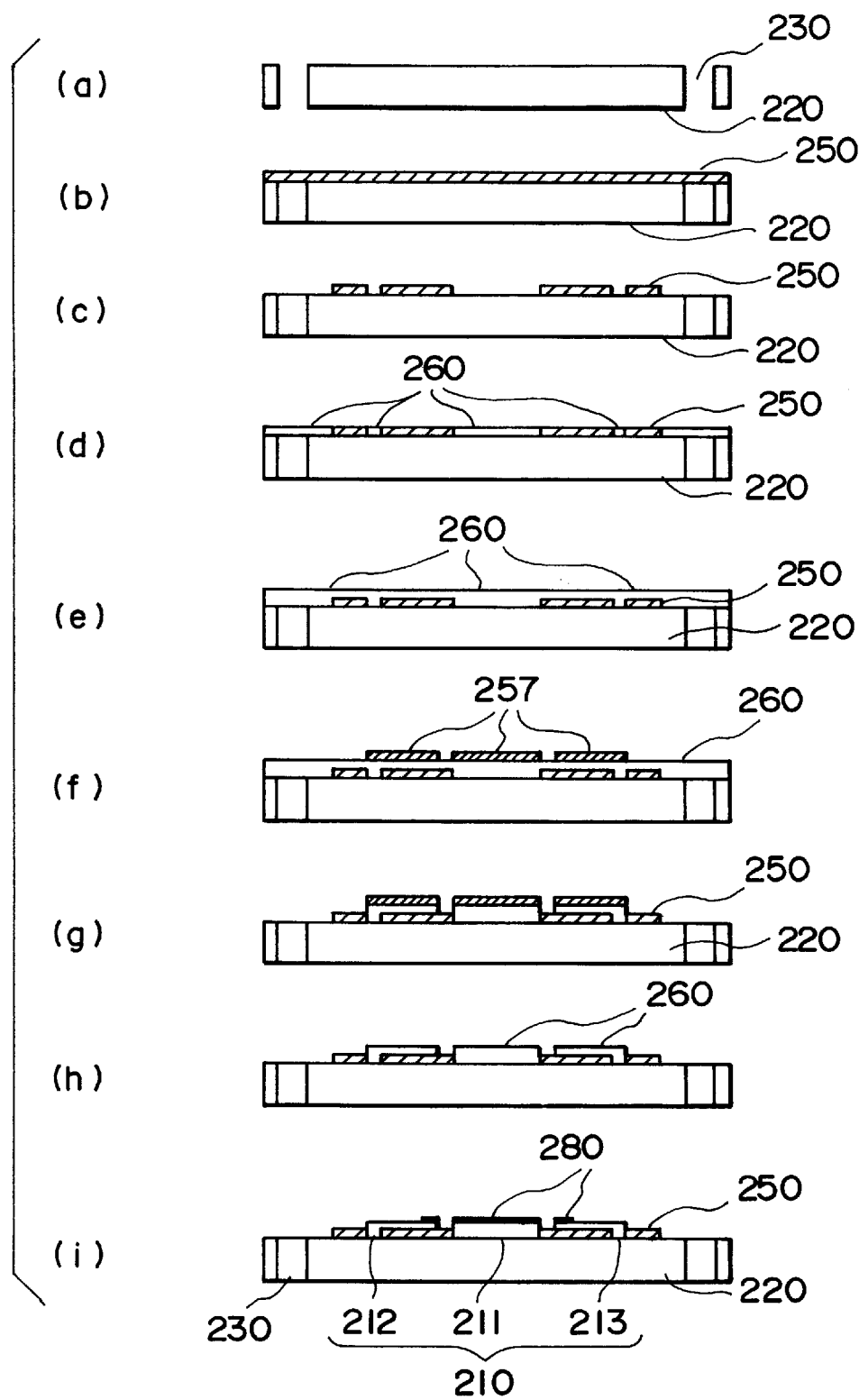
F I G. 9

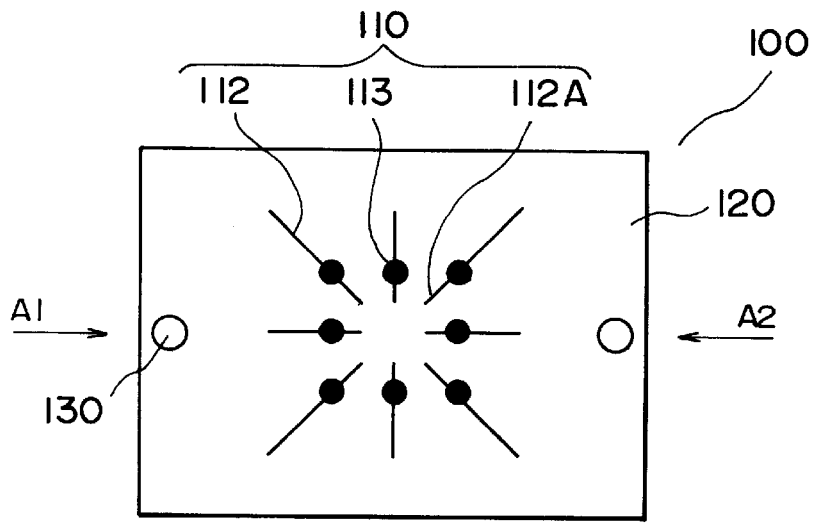
F I G. 12 a
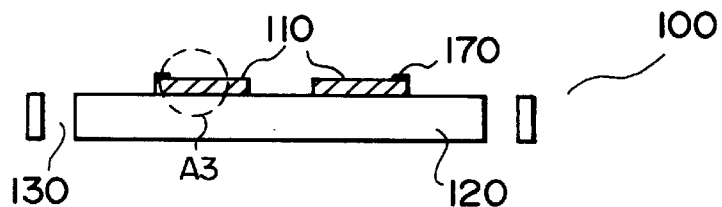
F I G. 12 b
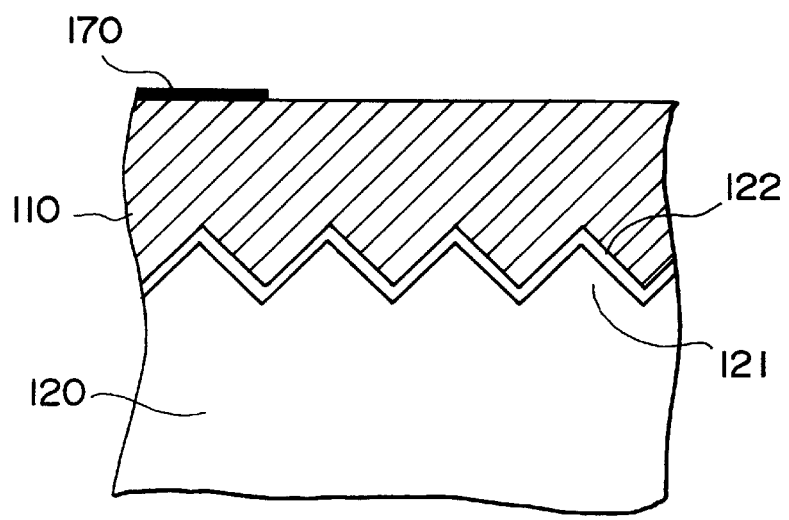
F I G. 12 c

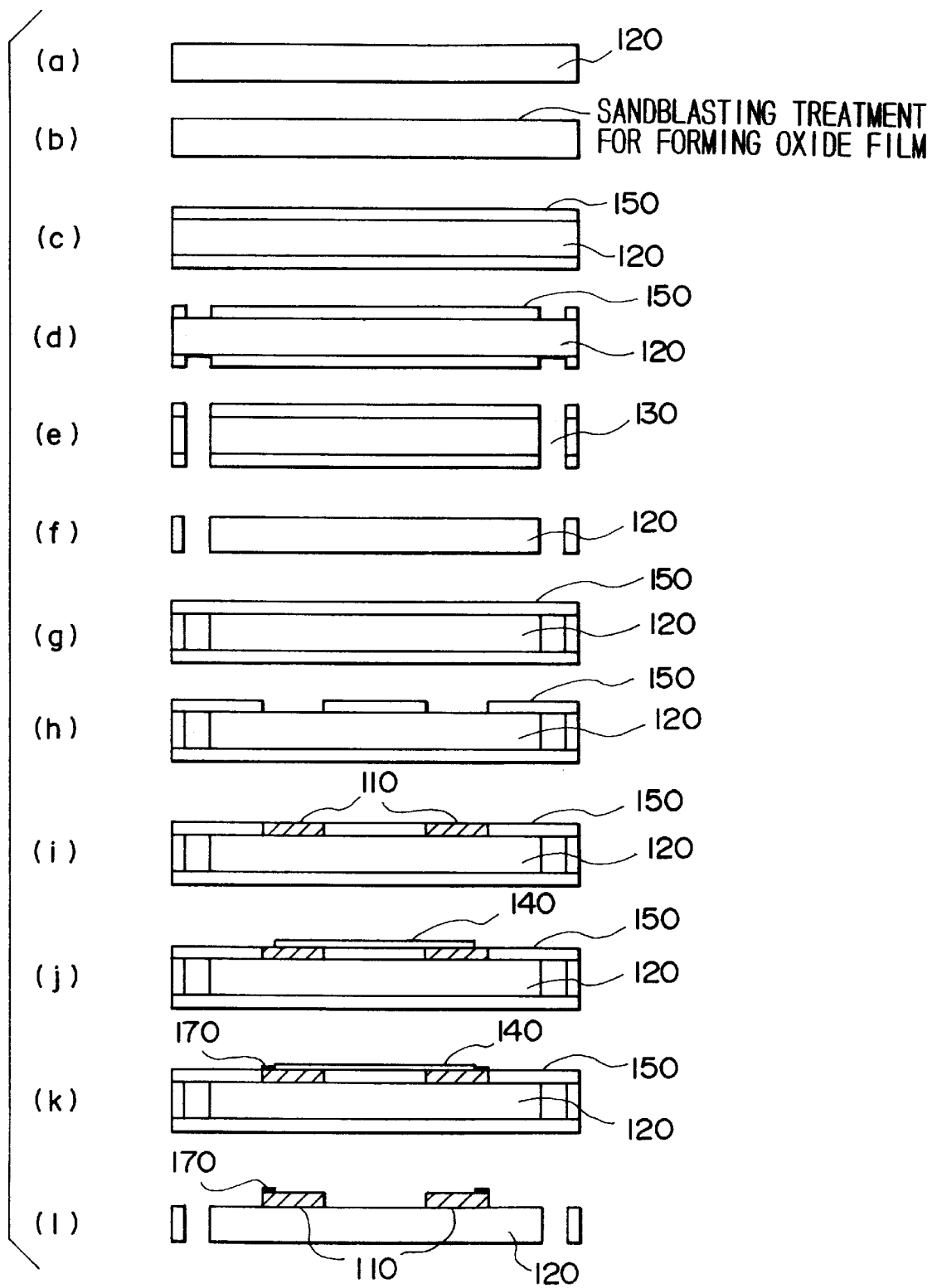
F I G. 15

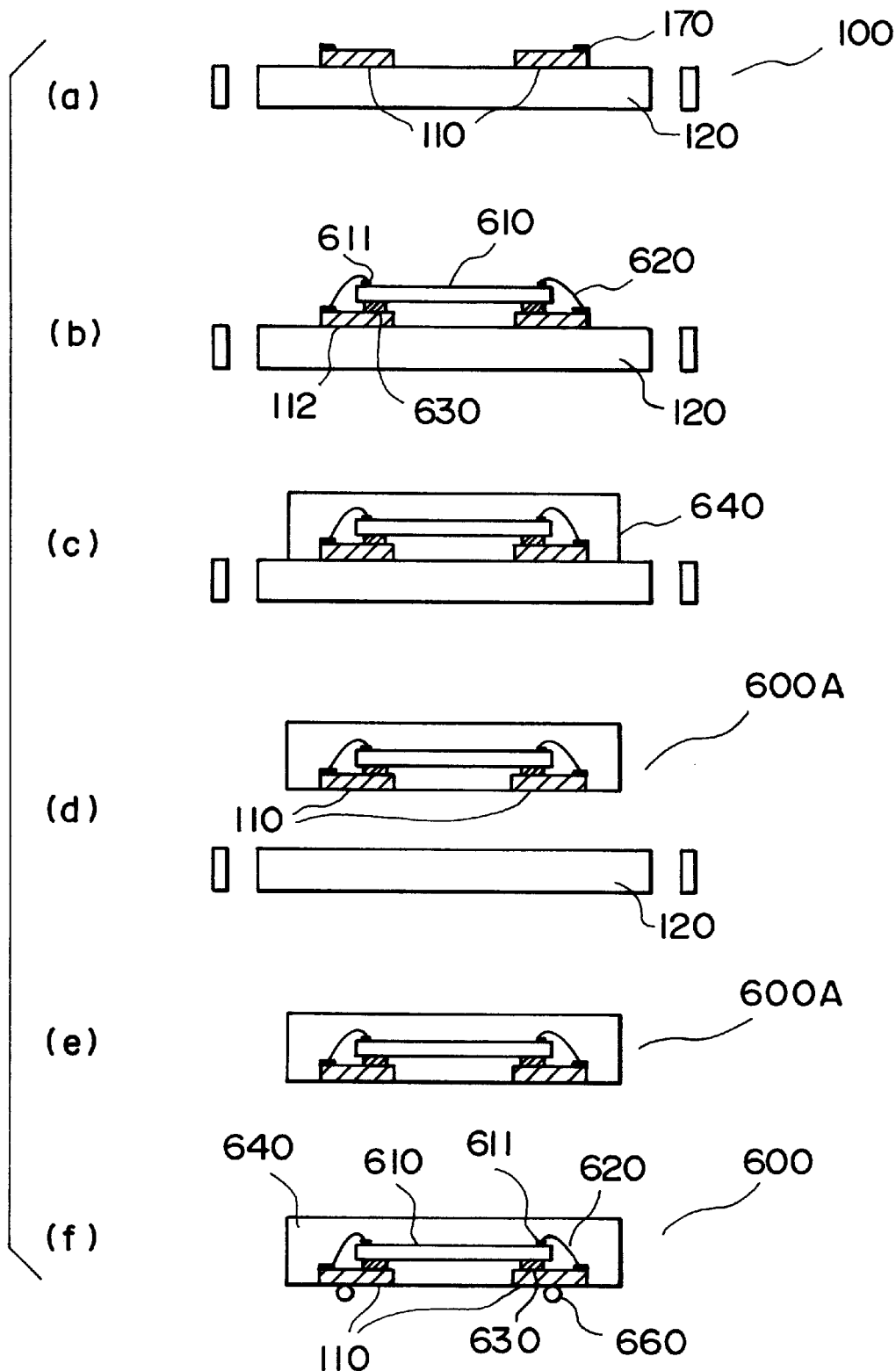
F I G. 17

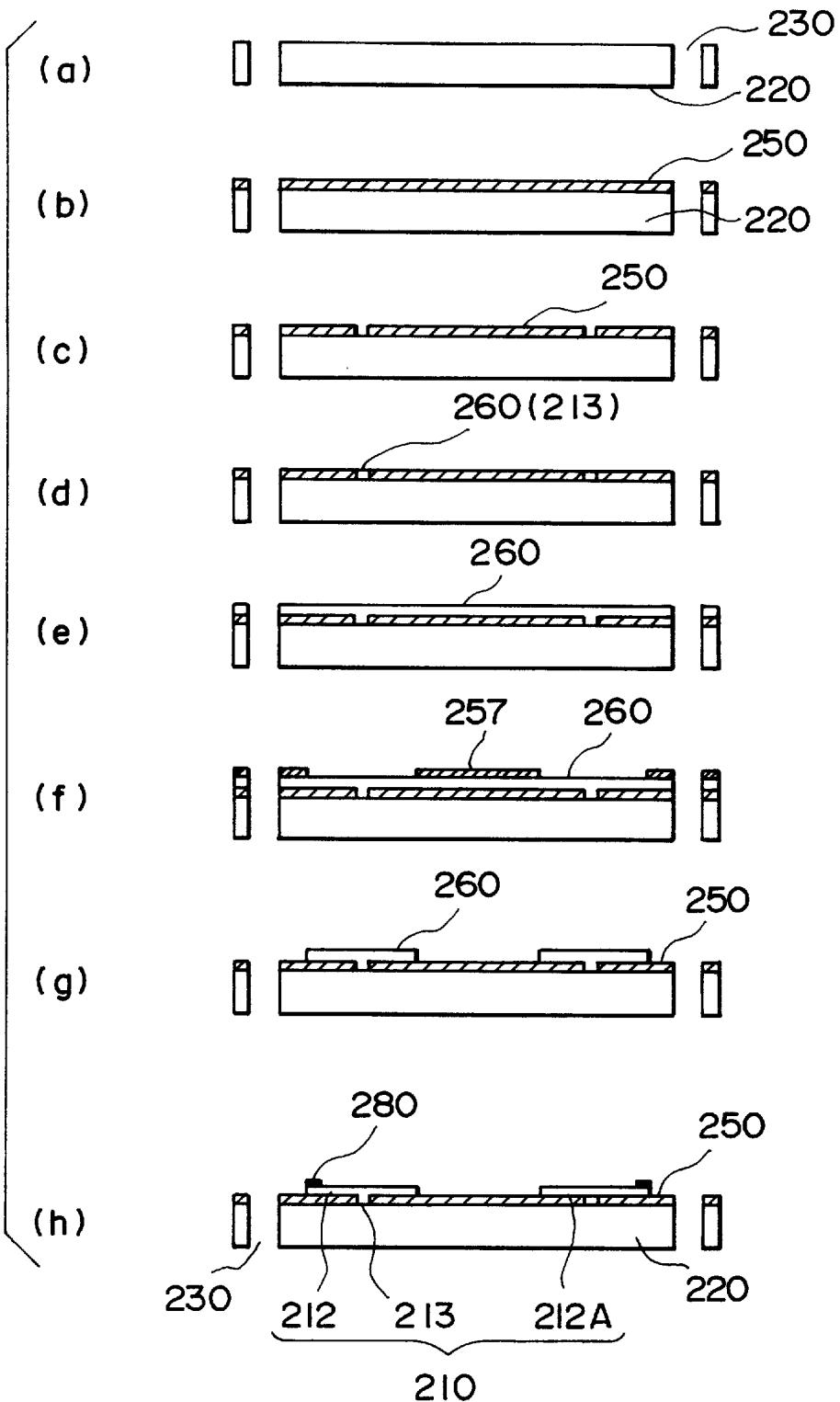
F I G. 19

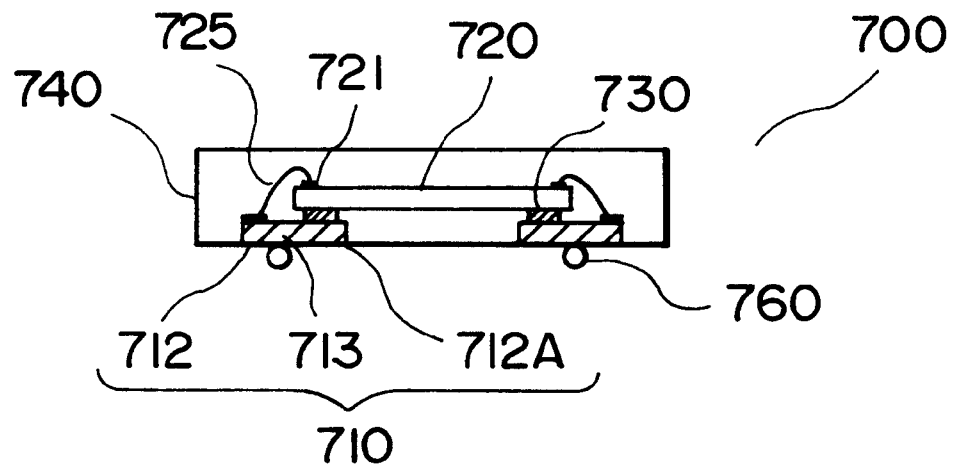
F I G. 21a
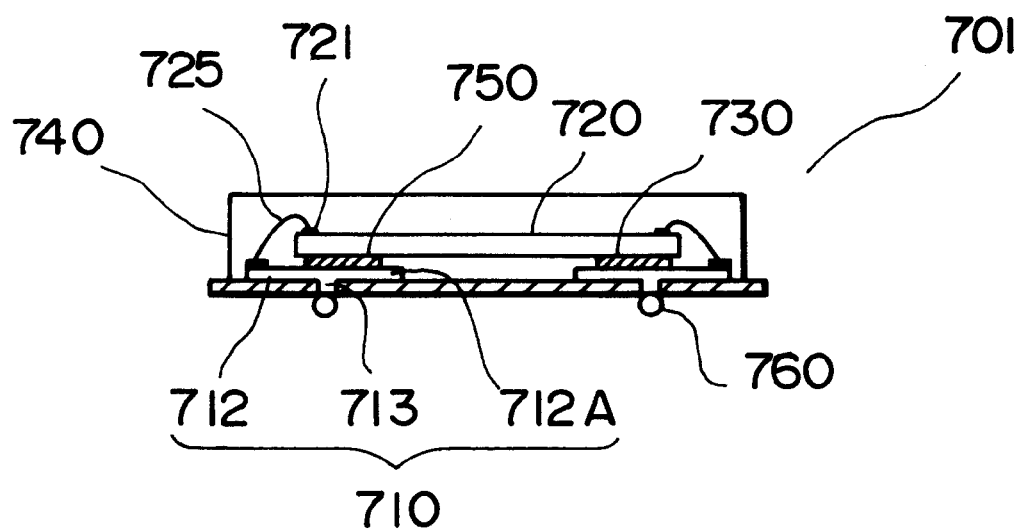
F I G. 21b

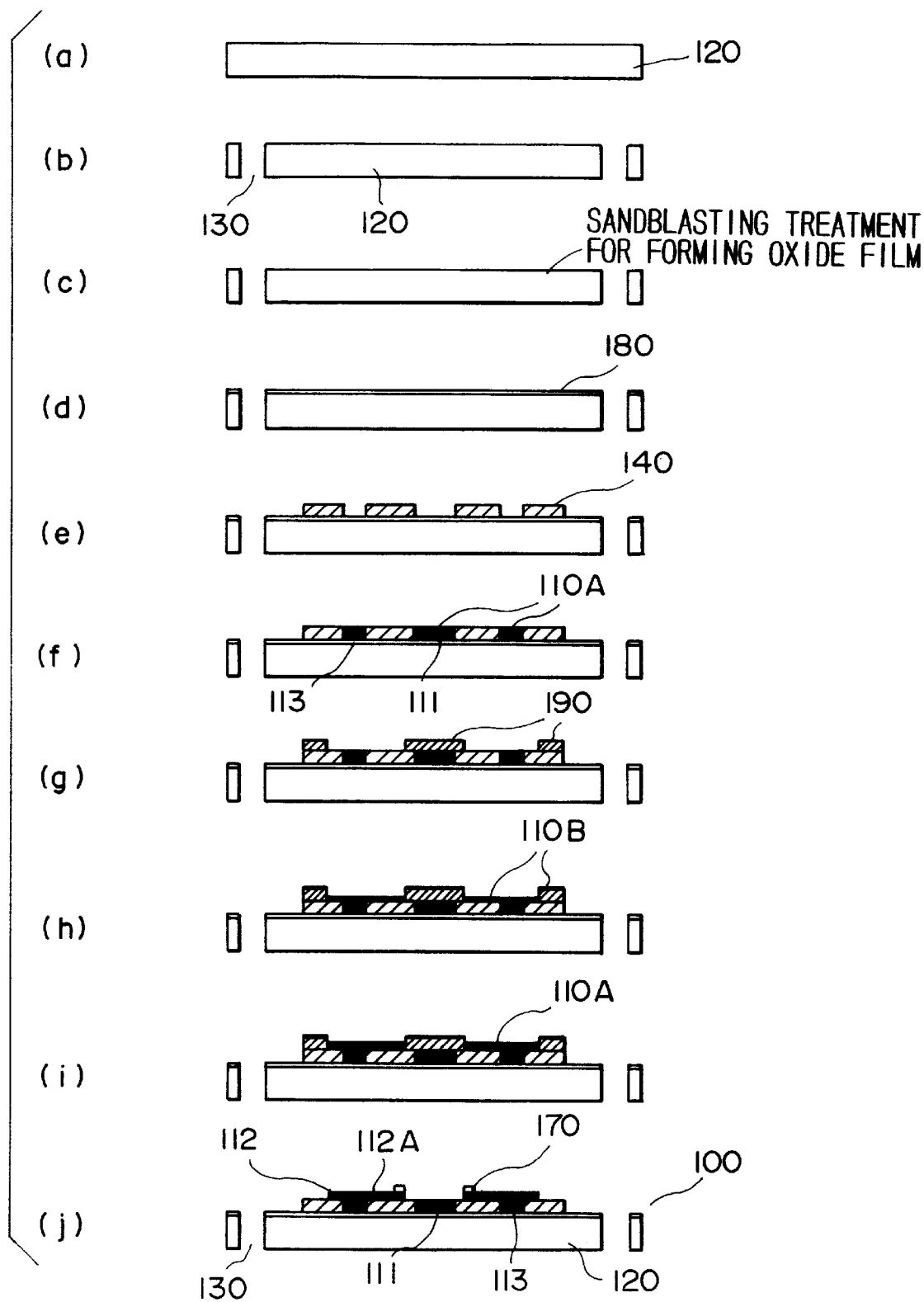
F I G. 24

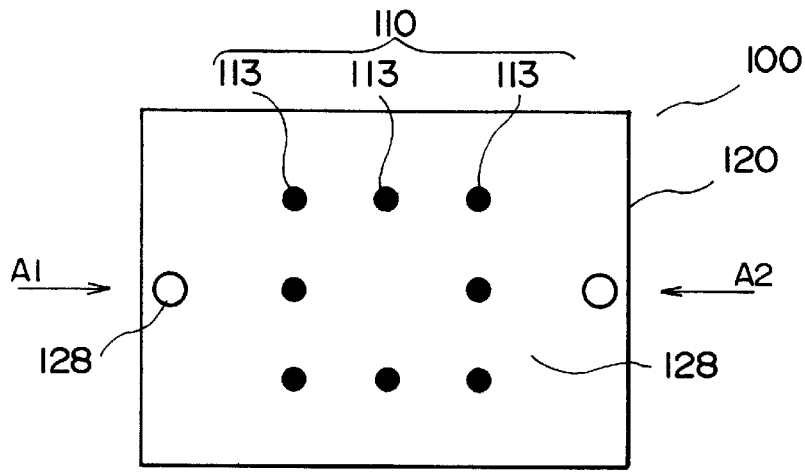
F I G. 29 a
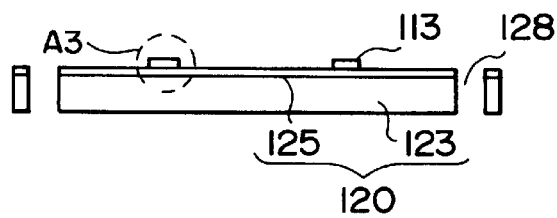
F I G. 29 b
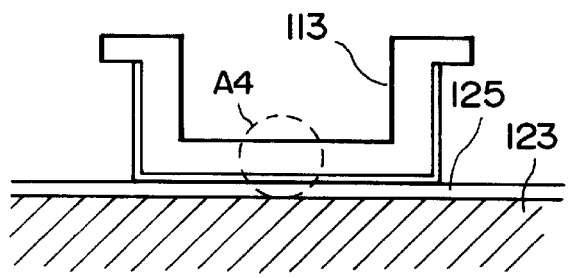
F I G. 29 c1
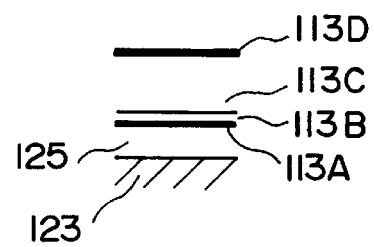
F I G. 29 c2
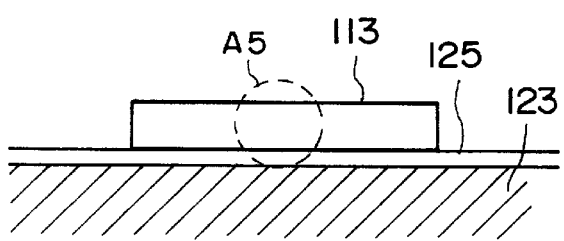
F I G. 29 d1
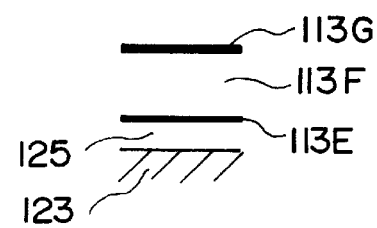
F I G. 29 d2

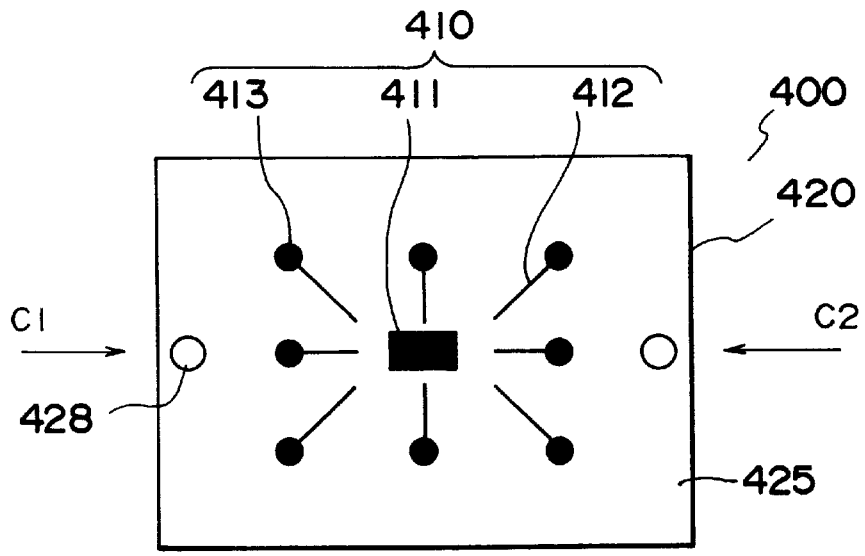
F I G. 31a
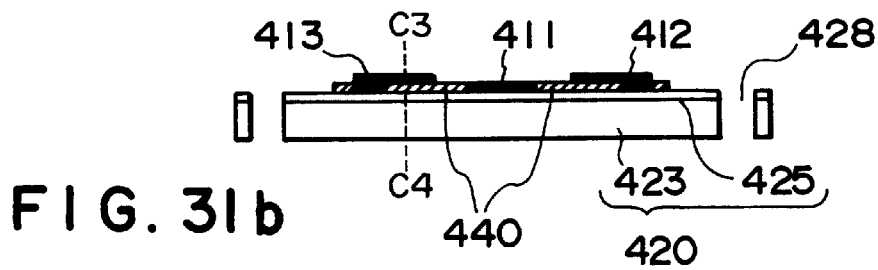
F I G. 31b
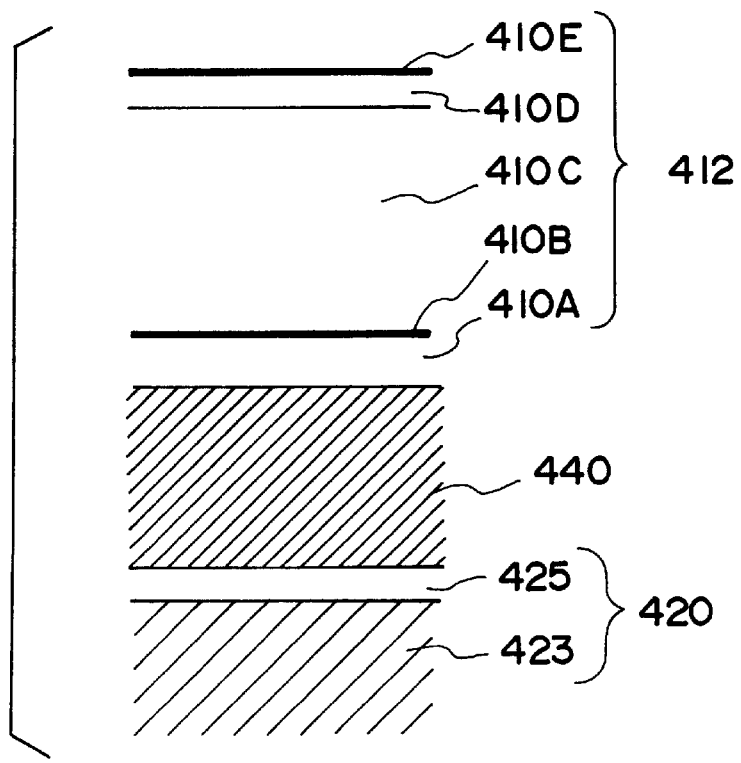
F I G. 31c

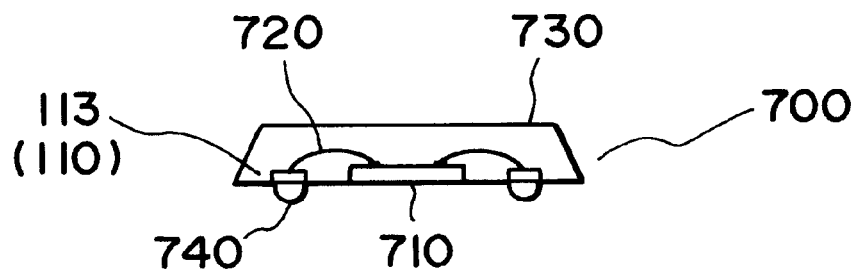
F I G. 38a
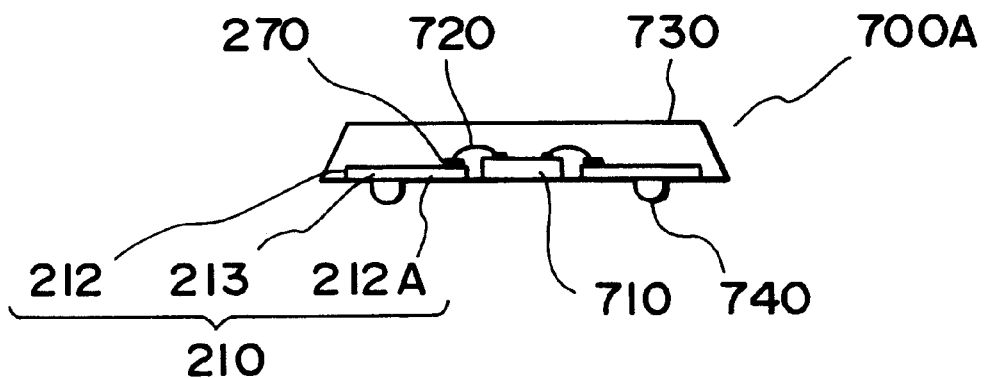
F I G. 38b
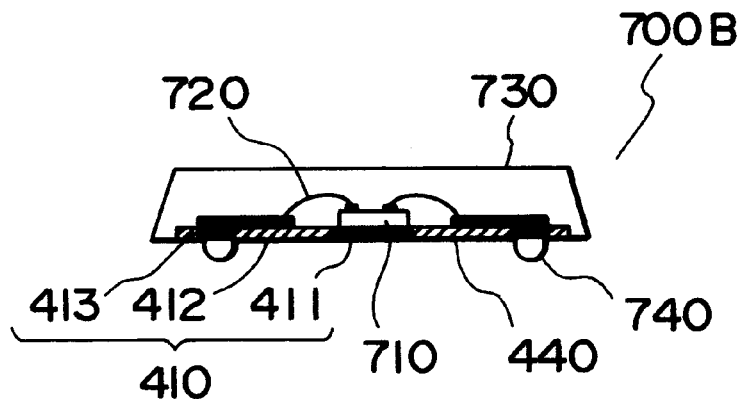
F I G. 38c

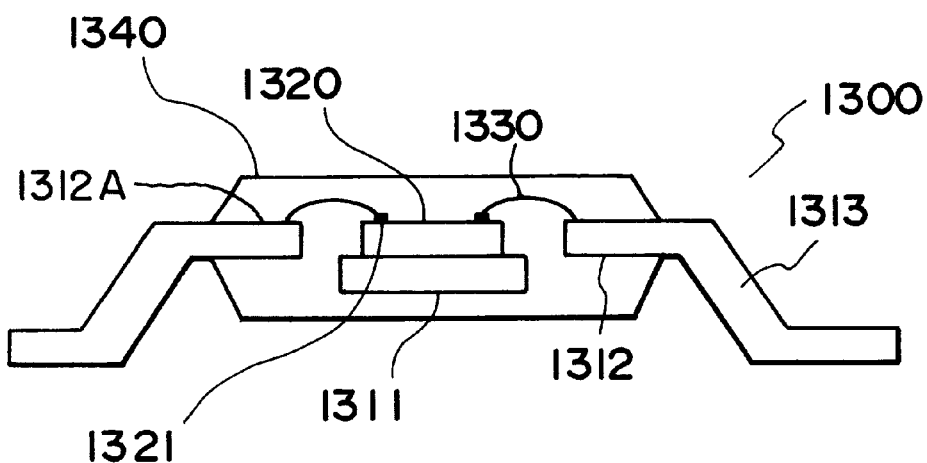
F I G. 44a
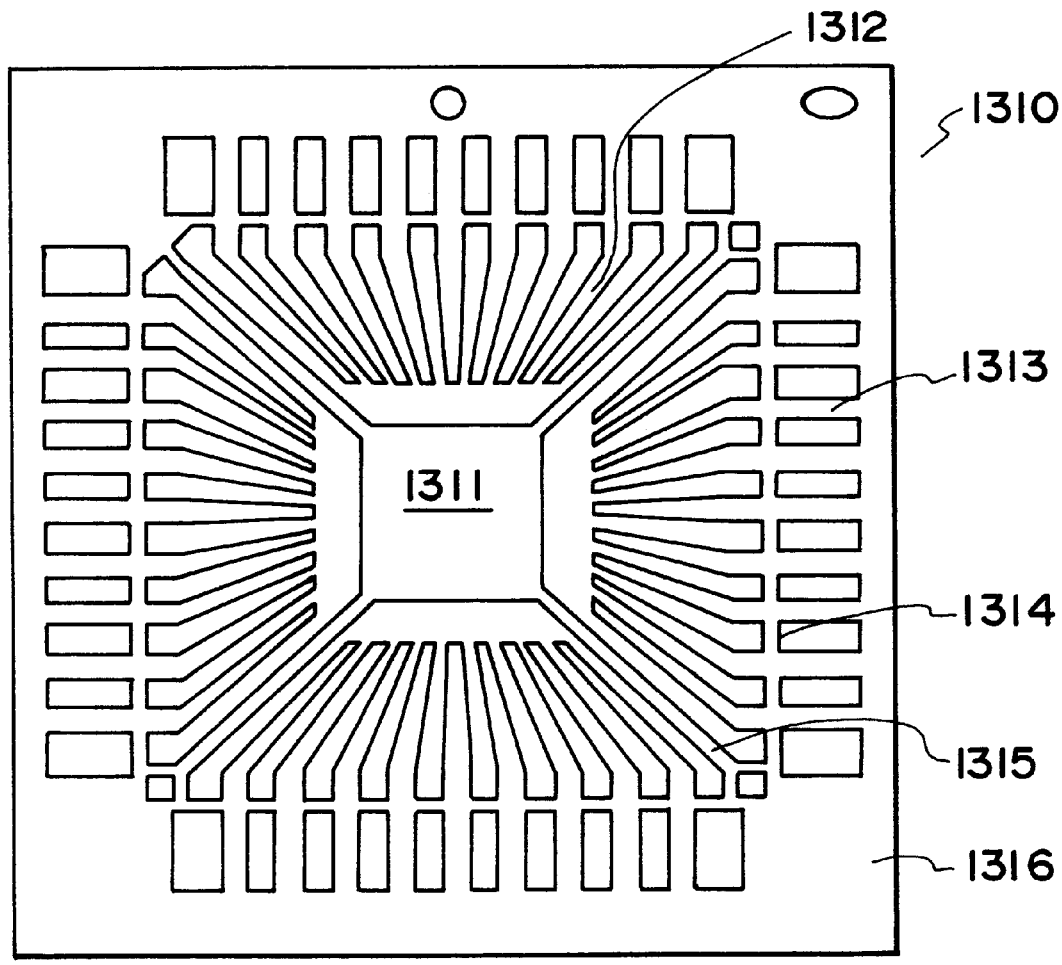
F I G. 44b

CIRCUIT MEMBER FOR SEMICONDUCTOR DEVICE, SEMICONDUCTOR DEVICE USING THE SAME, AND METHOD FOR MANUFACTURING THEM

TECHNICAL FIELD

The present invention relates to a circuit member for a surface mounting, plastic molded type semiconductor device having a circuit member thinly provided by plating, a semiconductor device using the circuit member, a process for producing the circuit member, and a process for producing the semiconductor device, particularly a circuit member for a plastic molded type BGA (ball grid array) type semiconductor device and a circuit member for a small package.

BACKGROUND ART

In recent years, for semiconductor devices, a tendency toward higher performance and reduction in thickness and size of electronic equipment have resulted in an ever-increasing demand for higher integration density and higher functions such as typified by ASIC (application-specific IC) of LSI.

In the semiconductor device having increased integration density and function, inductance within the package has become unnegligible for high-speed processing of signals. In order to reduce the inductance within the package, the number of connecting terminals of the power source and ground has been increased to lower the substantial inductance.

The higher integration density and higher function of the semiconductor device has resulted in increased total number of external terminals (pins) and an ever-increasing demand for an increase in number of terminals (pins).

In multi-terminal (pin) IC, particularly semiconductor devices, such as ASIC typified by gate array and standard cell, microprocessor unit, and DSP (digital signal processor), those using a lead frame include surface mounting type packages, such as QFP (quad flat package). In QFPs, the number of pins up to 300 pins has been put to practical use.

In QFPs, a single-layer lead frame 1310 as shown in FIG. 44*b* is used. As shown in FIG. 44*a* (cross-sectional view), a semiconductor element 1320 is mounted on a die pad 1311, an inner lead in its front end 1312A subjected to treatment, such as silver plating or gold plating, is connected to a terminal (an electrode pad) 1321 of the semiconductor element 1320 through a wire 1330, plastic molding is performed using a resin 1340, a dam bar section is cut, and an outer lead 1313 section is bent in a gull-wing form. In such QFP, the structure is such that an outer lead for electrical connection to an external circuit is provided in four directions of the package. This structure can cope with a demand for an increase in the number of terminals (pins). The single-layer lead frame 1310 used herein is generally prepared by fabricating a metal sheet having excellent electrical conductivity and high strength, such as Kovar, 42 alloy (42% Ni-iron), or copper-base alloy, by etching using photoetching, stamping or the like into a lead frame as shown in FIG. 44*b*.

A demand for an increase in signal processing speed and an increase in performance (function) of a semiconductor element in recent years, however, requires a further increase in number of terminals.

By contrast, in QFP, a reduction in external terminal pitch permits QFP to cope with a demand for a further increase in number of terminals. In the reduction in the external terminal pitch, however, the width of the external terminal per se should also be reduced, resulting in lowered external terminal strength. This unfavorably poses a problem associated with positional accuracy or flatness accuracy in molding of the terminal (formation of gull-wing). Further, in QFP, the step of mounting in a reduction in pitch becomes difficult with reducing the pitch of the outer lead to 0.4 mm, 0.3 mm or a smaller pitch, which necessitates realization of a highly advanced board mounting technique.

In order to avoid problems of mounting efficiency and mountability involved in the conventional QFP package, a plastic package semiconductor device called BGA (ball grid array), which is a surface mounting type package with the external terminal of the package being replaced by a solder ball, has been developed.

BGA is a generic name for a surface mounting type semiconductor device (plastic package) wherein the external terminal is constituted by solder balls which are arranged in a matrix form (an array form) on the back surface.

In general, in this BGA, in order to increase the number of input and output terminals, a semiconductor element is mounted on one side of the double-sided wiring board, an external terminal electrode for mounting a spherical solder thereon is provided on the other side, and the semiconductor element is electrically connected to the external terminal electrode through a through hole. Disposing solder spheres in array can widen the terminal pitch spacing as compared with the spacing in the semiconductor device using the conventional lead frame. As a result, the BGA can cope with a demand for an increase in number of input and output terminals without making it difficult to perform the step of mounting the semiconductor device.

BGA generally has a structure as shown in FIG. 39*a*. FIG. 39*b* is a diagram as viewed from the back surface (substrate) side in FIG. 39*a*. FIG. 39*c* is a diagram showing a through hole 850 section. This BGA comprises: a substrate 802 constituted by a heat-resistant flat sheet (resin sheet) typified by a BT resin (a bismaleimide resin); provided on one side of the substrate 802, a die pad 805 for mounting a semiconductor element 801 thereon and a bonding pad 810 for electrical connection from the semiconductor element 801 through a bonding wire 808; and, provided on the other side of the substrate 802, an external connecting terminal 806, constituted by a solder ball arranged in a lattice form or a zigzag form, for electrical and physical connection between the external circuit and the semiconductor device, the external connecting terminal 806 and the bonding pad 810 being electrically connected to each other through wiring 804, a through hole 850, and wiring 804A.

This BGA, however, has such a complicate structure that a circuit for connecting a semiconductor element mounted to a wire and an external terminal electrode for mounting a printed board after the formation of a semiconductor device are provided on both sides of the substrate 802 and these are electrically connected through a through hole 850. For this reason, influence of the thermal expansion of the resin often creates breaking in the through hole 850, posing a problem of reliability in the production.

In order to simplify the production process and to avoid the lowering of the reliability, various proposals have recently been made on PBGA (plastic ball grid array), wherein a circuit is provided using a lead frame as the core material, in addition to the structure shown in FIG. 39*a*.

The PBGA package using the lead frame generally has a structure, as shown in FIG. 40*a*, such that a lead frame 910 in its entirety is fixed onto an insulating, fixing film 960 with a predetermined hole formed in a place corresponding to an external terminal section 914 of a lead frame 910 and plastic molding is performed, or a structure, as shown in FIG. 40b, such that an inner lead is fixed with a fixing tape 960A.

The lead frame 910 used herein is constructed so that both the external terminal section 913 and the inner lead 912 have a thickness equal to the thickness of the lead frame material. After the fabrication of the external shape by etching, as shown in FIG. 41a, a connecting section 917, which extends to the front end of the inner lead 912 and is integrally connected to the inner lead to fix the inner leads to one another, is provided, and a supporting lead 915 for supporting the external terminal section is connected to a dam bar (a frame section) 914.

In the case of a semiconductor device 900 shown in FIG. 40a, as shown in FIG. 41, a lead frame (FIG. 41a) in its entirety is fixed using a fixing film 960 (FIG. 41b), the connecting section 917, for connecting inner leads to one another, which is primarily unnecessary, is removed by pressing to prepare a lead frame member 970, as shown in FIG. 41c, comprising a lead frame 910 and a fixing film 960. Numeral 920 designates an opening. In this case, use of an expensive mold is necessary for the production of the lead frame member 970, and the productivity is also low.

On the other hand, in the case of a semiconductor device 900A shown in FIG. 40b, a part, including the inner lead, of the lead frame rather than the whole lead frame is fixed with a fixing tape 960A, and a connecting section (not shown) for connecting inner leads to one another is then removed to prepare a lead frame member 970A comprising a lead frame 910 and a fixing tape 960A. Also in this case, use of an expensive mold is necessary for the production of the lead frame member 970A, and the productivity is also low.

Further, in the case of using the lead frame member 970 shown in FIG. 41c and in the case of using the lead frame member 970A with a part of the lead frame fixed (FIG. 40b), in the production of a semiconductor device, as shown in FIG. 42, the dam bar (frame section) 914 should be removed after plastic molding to separate the supporting leads 915 which have supported the external terminal section. In this case, the frame section is cut and removed by means of the mold, necessitating use of an expensive mold. In addition, the productivity is also low.

In the BGA, plastic molded type semiconductor device using a lead frame as the core material, as compared with a semiconductor device using the single-layer lead frame shown in FIG. 44b, when the number of terminals is the same, the pitch of the external terminals for connection to an external circuit can be widened, permitting the semiconductor to cope with a demand for an increase in the number of input and output terminals without rendering the step of mounting of the semiconductor device difficult. A reduction in pitch of the inner lead, however, is indispensable and has been required for a further increase in the number of terminals.

In order to cope with this, an etching method has been proposed wherein the inner lead section is formed in a smaller thickness than the lead frame material to achieve a narrow pitch.

One example of this type of the etching method will be described with reference to FIG. 43.

For simplification, the production of a lead frame, wherein only the inner lead has a smaller thickness than the lead frame material made of a copper alloy, will be described.

FIG. 43 is a cross-sectional view showing the front end of an inner lead in each step of forming an inner lead having a small thickness.

With respect to the place which should be subjected to external shaping to a thickness equal to the thickness of the lead frame material, a resist pattern having substantially the same shape and size is formed on both sides of the lead frame material, followed by etching.

In FIG. 43, numeral 1210 designates a lead frame material, numeral 1210A a small thickness section, numerals 1220A and 1220B each a resist pattern, numeral 1230 a first opening, numeral 1240 a second opening, numeral 1250 a first recessed section, numeral 1260 a second recessed section, numeral 1270 a flat face, numeral 1280 an etching resistant layer (a filler layer), and numeral 1290 an inner lead.

At the outset, both sides of a lead frame material constituted by a 0.15 mm-thick strip are subjected to cleaning, degreasing or the like, a resist composed of a mixed solution of an aqueous casein solution using potassium dichromate as a sensitizing agent is coated on both sides thereof, the resist is dried, and a predetermined area of the resist on both sides of the lead frame material using a plate having a predetermined pattern is exposed, followed by development to form resist patterns 1220A and 1220B respectively with a first opening 1230 and a second opening 1240 having respective predetermined shapes (FIG. 43a).

The first opening 1230 is provided for attacking the lead frame material 1210 in a solid form in the subsequent etching through this opening to a thickness smaller than the lead frame material 1210, and the second opening 1240 of the resist is provided for defining the shape of the front end of the inner lead.

Subsequently, both sides of the lead frame material 1210 with a resist pattern formed thereon are etched with a ferric chloride solution having a solution temperature of 50° C. and a specific gravity of 46 Baume degree at a spray pressure of 3.0 kg/cm$^2$, and the etching is stopped when the depth h of the first recessed section 1250 attacked in a solid form (a flat form) has reached a predetermined value (FIG. 43b).

Shortening the etching time in the second etching described below is the reason why the first etching is simultaneously performed from both sides of the lead frame material 1210. Simultaneous etching from both the sides in the first etching permits the total etching time of the first etching and the second etching to be shorter than that in the case of one side etching from the resist pattern 1220B side alone.

A resin resistant to etching is then coated as an etching resistant layer 1280 by die coating on the first recessed section 1250 attacked on the first opening 1230 side to fill up the first recessed section 1250 attacked in a solid form (a flat form). Further, the etching resistant layer 1280 is coated also onto the resist pattern 1220B (FIG. 43c).

The etching resistant layer 1280 is not always required to be coated on the whole surface of the resist pattern 1220B. Since, however, it is difficult to coat the etching resistant layer 1280 onto only a part including the first recessed section 1250, as shown in FIG. 43c, the etching resistant layer 1280 is coated onto the whole surface of the first opening 1230 side together with the first recessed section 1250.

Preferably, the resin constituting the etching resistant layer 1280 is fundamentally resistant to the etching solution and has flexibility to some extent at the time of etching. It may be of UV curable type.

When the first recessed section 1250 attacked on the side with a pattern for forming the inner lead front end being provided thereon is filled up with the etching resistant layer 1280, an advantage can be offered that the first recessed section 1250 is not attacked and does not become large during the etching in the subsequent step, the mechanical strength against high definition etching can be increased, and, hence, the spray pressure can be increased (3.0 kg/cm²) facilitating the progression of the etching in the direction of the depth.

Thereafter, the second etching is performed. In this case, the lead frame material 1210 is etched from the second recessed section 1260 side which is opposite to the side with the first recessed section 1250 attacked in a solid form (a flat form). By this etching, a through hole is formed to provide the small thickness section of the front end of the inner lead 1290 (FIG. 43d).

The face, parallel to the lead frame face, created by the first etching, is flat. On the other hand, two faces between which this face is sandwiched are recessed toward the inner lead side.

The second etching is followed by washing, removal of the etching resistant layer 1280, and removal of the resist film (resist patterns 1220A and 1220B) to prepare a lead frame wherein an inner lead 1290 has been finely fabricated (FIG. 43e).

The etching resistant layer 1280 and the resist layer (resist patterns 1220A and 1220B) are dissolved and removed with an aqueous sodium hydroxide solution.

The above etching which is performed in two separate stages is generally called two-step etching and is excellent particularly in accuracy.

In the production of a lead frame shown in FIG. 43, use of the two-step etching and devising of the shape of the pattern permit the external shape to be formed while partially reducing the thickness of the lead frame material.

The method for forming a thin inner lead in the lead frame is not limited to the above etching method.

Fine fabrication by the above method wherein the inner lead is formed in a small thickness is influenced by the shape of the second recessed section 1260 and the thickness t of the front end section of the final inner lead. For example, when the thickness t is reduced to 50 μm, fine fabrication can be performed to such an extent that as shown in FIG. 43e, when the flat section width W1 is 100 μm, the inner lead front end section pitch p is up to 0.15 mm. When the thickness t is reduced to about 30 μm with the flat section width W1 being about 70 μm, fine fabrication can be made to such an extent that the inner lead front end pitch p is up to about 0.12 mm. A further narrow inner lead front end section pitch becomes possible depending upon the thickness t and the flat section width W1.

In the lead frame prepared by the steps and the like shown in FIG. 43, the inner lead section becomes unstable with reducing the thickness of the inner lead, and, as shown in FIG. 44, the connecting section 917 for connecting the inner lead front end sections to one another should be removed. Further, as shown in FIG. 42, the dam bar (frame section) 914 should be cut and removed. This poses problems of productivity and cost, and, in addition, it is difficult to maintain the positional accuracy and quality of the inner lead. Therefore, solution to the above problems has been desired in the art.

On the other hand, in the plastic molded type semiconductor device, a reduction in package mainly by a reduction in thickness through the development of TSOP (thin small outline package) has been conducted. However, in small packages, such as TSOP, drawing of the lead, pin pitch, and adoption of multi-pin have reached the limit.

Under these circumstances, a semiconductor device, which, as compared with TSOP and the like, is smaller in size and lower in cost and has better mountability, and a circuit member for a semiconductor device, which can offer such a semiconductor device, have been desired in the art.

Various CSPs (chip scale packages), which have realized a reduction in size of a semiconductor device, have been proposed. In this case, however, a resin and a film substrate, which have not been used in the art, should be used for packaging, posing a problem of reliability.

As described above, BGA using a double-sided wiring board shown in FIG. 39 has a complicate construction and suffers from many problems associated with the production and the reliability. Further, BGA provided with a circuit using a lead frame as a core material as shown in FIG. 40 has a problem of productivity and, in addition, involves a problem that it is difficult to maintain the positional accuracy of the inner lead and the quality.

On the other hand, a semiconductor device, which, as compared with TSOP and the like, is smaller in size and lower in cost, and a circuit member for a semiconductor device, which can offer such a semiconductor device, have been desired in the art.

SUMMARY OF THE INVENTION

An object of the present invention is to provide a circuit member and a semiconductor device which can cope with an ever-increasing demand for multiple terminals and is advantageous in productivity and quality over the conventional lead frame member and semiconductor device.

Another object of the present invention is to provide a semiconductor device which can realize a smaller size and can be produced at a lower cost as compared with TSOP (thin small outline package) and a circuit member used therefor.

The circuit member for a semiconductor device, the process for producing a circuit member for a semiconductor device, the semiconductor device, and the process for producing a semiconductor device according to the present invention have the following features.

A. A circuit member for a semiconductor device according to the present invention comprises: a conductive substrate; and a circuit section and the like at least two-dimensionally formed using a conductive metal by plating on the conductive substrate, characterized in that at least a part of the conductive metal constituting the circuit section and the like is provided by plating on one side of the conductive substrate after subjecting the one side of the conductive substrate to surface treatment to create irregularities and to release treatment to impart releasability.

In the above circuit member for a semiconductor device, preferably, the circuit section comprises at least a die pad section for mounting a semiconductor element thereon, a lead for electrical connection to a semiconductor element, and an external terminal section for electrical connection to an external circuit and a plurality of sets of the lead and the external terminal section integrally connected to each other are provided independently of each other.

Further, in the circuit member for a semiconductor device, preferably, the two-dimensionally formed circuit section in its entirety has been formed directly on one side of the conductive substrate by plating, or otherwise, only the die pad section in the circuit section has been formed directly on one side of the conductive substrate by plating with the other sections having been formed through an insulating resist.

A process for producing a circuit member, for a semiconductor device, comprising: a conductive substrate; and a circuit section in its entirety two-dimensionally formed directly on one side of the conductive substrate by plating, according to the present invention, is characterized by comprising, in sequence, at least the steps of: (A) surface-treating one side of the conductive substrate to provide irregularities; (B) subjecting the conductive substrate on its one side with irregularities provided thereon to release treatment for imparting releasability; (C) coating a resist on the conductive substrate on its one side subjected to the surface treatment and the release treatment and exposing only an area to be plated with a conductive metal to prepare a plate; and (D) plating the plate on its exposed area with a conductive metal, or is characterized by comprising, in sequence, at least the steps of: (G) surface-treating one side of the conductive substrate to provide irregularities; (H) subjecting the conductive substrate on its one side with irregularities provided thereon to release treatment for imparting releasability; (I) plating the conductive substrate on its whole surface subjected to the surface treatment and the release treatment with a conductive metal; (J) coating a resist on the surface of the plating and treating the coating so as to cover an area where a circuit section and the like are formed, thereby preparing a plate; and (K) performing etching so as to pass through the section plated with a conductive metal to form a circuit section and the like.

A process for producing a circuit member, for a semiconductor device, comprising: a conductive substrate; and a circuit section and the like two-dimensionally formed using a conductive metal by plating on the conductive substrate, the circuit section comprising at least a die pad section for mounting a semiconductor element thereon, a lead for electrical connection to a semiconductor element, and an external terminal section for electrical connection to an external circuit, a plurality of sets of the lead and the external terminal section integrally connected to each other being provided independently of each other, only the die pad section and the external terminal section in the circuit section having been formed directly on one side of the conductive substrate by plating with the other sections in the circuit section having been formed through an insulating resist, according to the present invention, is characterized by comprising, in sequence, at least the steps of: (a) surface-treating one side of the conductive substrate to provide irregularities thereon; (b) subjecting the conductive substrate on its one side with irregularities provided thereon to release treatment for imparting releasability; (c) coating a first insulating resist on the conductive substrate on its one side subjected to the surface treatment and the release treatment and exposing only a die pad section and external terminal section forming area to prepare a plate; (d) subjecting the plate on its exposed area to first plating with a conductive metal by electroplating; (e) coating a second insulating resist on the surface of the first plating and exposing only an area where a circuit section is to be prepared by plating; and (f) subjecting the plate on its exposed area to second plating with a conductive metal by electroplating or electroless plating, or is characterized by comprising, in sequence, at least the steps of: (g) surface-treating one side of the conductive substrate to provide irregularities thereon; (h) subjecting the conductive substrate on its one side with irregularities provided thereon to release treatment for imparting releasability; (i) coating a first insulating resist on the conductive substrate on its one side subjected to the surface treatment and the release treatment and exposing only a die pad section and external terminal section forming area by plating to prepare a first plate; (j) subjecting the plate on its exposed area to first plating by electroplating or with a conductive metal; (k) subjecting the whole surface on the first plating side to second plating with a conductive metal by electroless plating; (l) covering the plating, prepared by electroless plating, in its area where a circuit section is formed, thereby preparing a second plate; and (m) removing the area, exposed in the step of preparing the plate, by etching.

A process for producing a semiconductor device using a circuit member, for a semiconductor device, comprising: a conductive substrate; and a circuit section and the like at least two-dimensionally formed using a conductive metal by plating on the conductive substrate, the circuit section comprising at least a die pad section for mounting a semiconductor element thereon, a lead for electrical connection to a semiconductor element, and an external terminal section for electrical connection to an external circuit, a plurality of sets of the lead and the external terminal section integrally connected to each other being provided independently of each other, the whole circuit section having been formed directly on one side of the conductive substrate by plating, according to the present invention, is characterized by comprising, in sequence, at least the steps of: (i) mounting a semiconductor element, with the terminal facing upward, on a die pad provided on a conductive substrate and wire-bonding the terminal of the semiconductor element to a lead; (ii) subjecting one side of the lead section, for a semiconductor device, to plastic molding so as to cover the semiconductor element, the wire, and the circuit section of the lead member for a semiconductor device in their entirety; and (iii) removing the conductive substrate in the lead member for a semiconductor device.

The above process for producing a semiconductor device preferably further comprises, after the step of removing the substrate, (iv) the step of coating a solder resist on the surface, exposed by removing the substrate, of the circuit section remote from the surface, with the semiconductor element mounted thereon, so as to expose only the external terminal section of the circuit section and (v) the step of attaching a solder ball to the external terminal section exposed from the solder resist.

A process for producing a semiconductor device according to the present invention is characterized by comprising, in sequence, at least the steps of: (vi) mounting a semiconductor element, with the terminal facing upward, on a die pad provided on a conductive substrate and wire-bonding the terminal of the semiconductor element to a lead; (vii) subjecting one side of the lead section, for a semiconductor device, to plastic molding so as to cover the semiconductor element, the wire, and the circuit section of the lead member for a semiconductor device in their entirety; and (viii) removing the conductive substrate in the lead member for a semiconductor device.

The above process for producing a semiconductor device preferably further comprises, after the step of removing the substrate, (ix) the step of attaching a solder ball to the exposed external terminal section.

B. Another circuit member for a semiconductor device according to the present invention is characterized by comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, at least a part of the conductive metal constituting the circuit section and the like being provided by plating on one side of the conductive substrate after subjecting the one side of the conductive substrate to surface treatment to create irregularities and to release treatment to impart releasability.

In the above circuit member for a semiconductor device, preferably, the two-dimensionally formed circuit section in its entirety has been formed directly on one side of the conductive substrate by plating.

Further, in the above circuit member for a semiconductor device, preferably, only the external terminal section in the circuit section has been formed directly on one side of the conductive substrate by plating with the other sections in the circuit section having been formed through an insulating resist.

Another process for producing a circuit member, for a semiconductor device, comprising: a conductive substrate; and a circuit section in its entirety two-dimensionally formed directly on one side of the conductive substrate by plating, the circuit section having no die pad section for mounting a semiconductor element thereon, according to the present invention, is characterized by comprising, in sequence, at least the steps of: (G) surface-treating one side of the conductive substrate to provide irregularities; (H) subjecting the conductive substrate on its one side with irregularities provided thereon to release treatment for imparting releasability; (I) plating the conductive substrate on its whole surface subjected to the surface treatment and the release treatment with a conductive metal; (J) coating a resist on the surface of the plating and treating the coating so as to cover only an area where a circuit section and the like are formed, thereby preparing a plate; and (K) performing etching so as to pass through the section plated with a conductive metal to form a circuit section and the like.

Further, another process for producing a circuit member, for a semiconductor device, comprising: a conductive substrate; and a circuit section and the like two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, only the external terminal section in the circuit section having been formed directly on one side of the conductive substrate by plating with the other sections in the circuit section having been formed through an insulating resist, according to the present invention, is characterized by comprising, in sequence, at least the steps of: (a) surface-treating one side of the conductive substrate to provide irregularities thereon; (b) subjecting the conductive substrate on its one side with irregularities provided thereon to release treatment for imparting releasability; (c) coating a first insulating resist on the conductive substrate on its one side subjected to the surface treatment and the release treatment and exposing only an external terminal section forming area to prepare a plate; (d) subjecting the plate on its exposed area to first plating with a conductive metal by electroplating; (e) coating a second insulating resist on the surface of the first plating and exposing only an area where a circuit section is prepared by plating; and (f) subjecting the plate on its exposed area to second plating with a conductive metal by electroplating or electroless plating, or is characterized by comprising, in sequence, at least the steps of: (g) surface-treating one side of the conductive substrate to provide irregularities thereon; (h) subjecting the conductive substrate on its one side with irregularities provided thereon to release treatment for imparting releasability; (i) coating a first insulating resist on the conductive substrate on its one side subjected to the surface treatment and the release treatment and exposing only an external terminal section forming area to prepare a first plate; (j) subjecting the plate on its exposed area to first plating with a conductive metal by electroplating; (k) subjecting the whole surface on the first plating side to second plating with a conductive metal by electroless plating; (l) covering the plating, prepared by electroless plating, only in its area where a circuit section is formed, thereby preparing a second plate; and (m) removing the area, exposed in the step of preparing the plate, by etching.

Another process for producing a semiconductor device using a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, the whole circuit section having been formed directly on one side of the conductive substrate by plating, according to the present invention, is characterized by comprising, in sequence, at least the steps of: (i) mounting a semiconductor element, with the terminal facing upward, on a circuit section provided on a conductive substrate and wire-bonding the terminal of the semiconductor element to a lead; (ii) subjecting one side of the lead section, for a semiconductor device, to plastic molding so as to cover the semiconductor element, the wire, and the circuit section of the lead member for a semiconductor device in their entirety; and (iii) removing the conductive substrate in the lead member for a semiconductor device.

The above process for producing a semiconductor device preferably further comprises, after the step of removing the substrate, (iv) the step of coating a solder resist on the surface, exposed by removing the substrate, of the circuit section remote from the surface, with the semiconductor element mounted thereon, so as to expose only the external terminal section of the circuit section and (v) the step of attaching a solder ball to the external terminal section exposed from the solder resist.

Further, another process for producing a semiconductor device according to the present invention is characterized by comprising, in sequence, at least the steps of: (iv) mounting a semiconductor element, with the terminal facing upward, on a circuit section provided on a conductive substrate and wire-bonding the terminal of the semiconductor element to a lead; (vii) subjecting one side of the lead section, for a semiconductor device, to plastic molding so as to cover the semiconductor element, the wire, and the circuit section of the lead member for a semiconductor device in their entirety; and (viii) removing the conductive substrate in the lead member for a semiconductor device.

The above process for producing a semiconductor device preferably further comprises, after the step of removing the substrate, (ix) the step of attaching a solder ball to the exposed external terminal section.

C. Still another circuit member for a semiconductor device according to the present invention is characterized by comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, a plurality of sets of the lead and the external terminal section integrally connected to each other being provided independently of each other, the external terminal section in the circuit section having been formed directly on one side of the conductive substrate by electroplating, the lead in the circuit section having been formed on an insulating epoxy resin layer, the epoxy resin layer having been provided directly on the conductive substrate excluding the external terminal section forming area by transfer molding.

In the above circuit member for a semiconductor device, preferably, the conductive substrate on its side having the circuit section has been surface-treated to create irregularities and the conductive substrate on its side subjected to surface treatment for creating irregularities thereon has been subjected to release treatment to impart releasability.

Still another process for producing a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, a plurality of sets of the lead and the external terminal section integrally connected to each other being provided independently of each other, the external terminal section in the circuit section having been formed directly on one side of the conductive substrate by electroplating, the lead in the circuit section having been formed on an insulating epoxy resin layer, the epoxy resin layer having been provided directly on the conductive substrate excluding the external terminal section forming area by transfer molding, according to the present invention, is characterized by comprising, in sequence, at least the steps of: (a) surface-treating one side of the conductive substrate to provide irregularities thereon; (b) subjecting the conductive substrate on its one side with irregularities provided thereon to release treatment for imparting releasability; (c) providing an insulating epoxy resin layer by transfer molding on the conductive substrate in its one side subjected to the surface treatment and the release treatment so as to expose only the external terminal section forming area; (d) electroplating the conductive substrate on its exposed area, not covered with the insulating epoxy resin layer, with a conductive metal to a plating thickness approximately equal to the thickness of the insulating epoxy resin layer; (e) coating an insulating resist on the surface of the plating and exposing only a circuit section forming area to prepare a plate; and (f) imparting electrical conductivity to only the exposed area, where a circuit section is to be formed, by plating or coating of a conductive paint or the like to form a circuit section, or is characterized by comprising, in sequence, at least the steps of: (g) surface-treating one side of the conductive substrate to provide irregularities thereon; (h) subjecting the conductive substrate on its one side with irregularities provided thereon to release treatment for imparting releasability; (i) providing an insulating epoxy resin layer by transfer molding on the conductive substrate in its one side subjected to the surface treatment and the release treatment so as to expose only the external terminal section forming area; (j) subjecting the conductive substrate on its exposed area, not covered with the insulating epoxy resin layer, to first plating with a conductive metal by electroplating to a plating thickness approximately equal to the thickness of the insulating epoxy resin layer; (k) subjecting the whole surface of the first plating to second plating either by electroless plating alone or by electroless plating followed by electroplating, thereby forming a plating of a conductive metal on the whole surface of the first plating; (l) coating an insulating resist on the surface of the electroless plating and preparing a plate in such a manner that only an area, where a circuit section is to be formed, is covered; and (m) etching the electroless plating using the resist as an etching-resistant mask.

Still another process for producing a semiconductor device using a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, a plurality of sets of the lead and the external terminal section integrally connected to each other being provided independently of each other, only the external terminal section in the circuit section having been formed directly on one side of the conductive substrate by plating with the other sections in the circuit section having been formed through an insulating epoxy resin layer provided by transfer molding, according to the present invention, is characterized by comprising, in sequence, at least the steps of: (i) mounting a semiconductor element, with the terminal facing upward, on a circuit section provided on a conductive substrate and wire-bonding the terminal of the semiconductor element to a lead; (ii) subjecting one side of the lead section, for a semiconductor device, to plastic molding so as to cover the semiconductor element, the wire, and the circuit section of the lead member for a semiconductor device in their entirety; and (iii) removing the conductive substrate in the lead member for a semiconductor device.

The above process for producing a semiconductor device preferably further comprises, after the step of removing the substrate, (iv) the step of attaching a solder ball to the exposed external terminal section.

D. A further circuit member for a semiconductor device according to the present invention is characterized by comprising: a conductive substrate; and a circuit section and the like at least two-dimensionally formed using a conductive metal layer provided by plating on the conductive substrate, at least a part of the circuit section having been provided directly on one side of the conductive substrate by plating, said conductive substrate on its one side having a circuit section being provided with a separating metal plating serving to separate the conductive substrate from the circuit section in the production of a semiconductor device.

In the above circuit member for a semiconductor device, preferably, the circuit section comprises at least a lead for electrical connection to a semiconductor element and an external terminal section for electrical connection to an external circuit, a plurality of sets of the lead and the external terminal section integrally connected to each other are provided independently of each other and at least a part of the circuit section has been provided directly on one side of the conductive substrate by plating, and, preferably, the external terminal section in the circuit section has been formed directly on the conductive substrate by plating and the lead in the circuit section has been formed on an insulating layer provided directly on the conductive substrate excluding the external terminal section forming area.

A further process for producing a circuit member for a semiconductor device according to the present invention comprises: a conductive substrate; and a circuit section and the like at least two-dimensionally formed using a conductive metal by plating on the conductive substrate, at least a part of the circuit section having been provided directly on one side of the conductive substrate by plating, said conductive substrate on its one side having a circuit section being provided with a separating metal plating serving to separate the conductive substrate from the circuit section in the production of a semiconductor device, said process being characterized by comprising, in sequence, using a conductive substrate having a separating metal plating on one side thereof, at least the steps of: (a) coating a resist on one side of the conductive substrate and exposing only an area to be plated with a conductive metal to prepare a plate; and (b) plating the plate on its exposed area with a conductive metal, or is characterized by comprising, in sequence, using a conductive substrate having a separating metal plating on one side thereof, at least the steps of: (d) providing an insulating layer on one side of the conductive substrate so as to expose at least the external terminal section in the circuit section and to cover a lead forming area; (e) electrolessly plating the conductive substrate on its whole surface provided with the insulating layer to form a first conductive layer, thereby covering said whole surface; (f) providing a resist so as to expose an external terminal section forming area and a lead section forming area in the circuit section of the conductive substrate on its side provided with the first conductive layer; (g) plating the exposed area to form a second conductive layer, thereby simultaneously forming the external terminal section and the lead section; (h) separating and removing the resist alone; and (i) removing the exposed first conductive layer by etching, or is characterized by comprising, in sequence, using a conductive substrate having a separating metal plating on one side thereof, at least the steps of: (k) providing an insulating layer on one side of the conductive substrate so as to expose at least the external terminal section in the circuit section and to cover a lead forming area; (l) covering the conductive substrate on its whole surface, provided with the insulating layer, with a resist, subjecting the surface of the resist to water repellent treatment, and treating the resist so as to expose the external terminal section forming area and the lead section forming section in the circuit section of the conductive substrate; (m) providing and activating a catalyst and then providing a first conductive layer by electroless plating on the exposed areas; (n) providing a second conductive layer by electroplating on the first conductive layer to simultaneously form an external terminal section and a lead section; and (o) separating and removing the resist alone.

A further process for producing a semiconductor device using a circuit member, for a semiconductor device, comprising: a conductive substrate; and a circuit section and the like at least two-dimensionally formed using a conductive metal by plating on the conductive substrate, at least a part of the circuit section having been provided directly on one side of the conductive substrate by plating, said conductive substrate on its one side having a circuit section being provided with a separating metal plating serving to separate the conductive substrate from the circuit section in the production of a semiconductor device, according to the present invention, is characterized by comprising, in sequence, at least the steps of: (A) conducting die attachment by mounting a semiconductor element on the circuit member for a semiconductor device in its place excluding an external terminal section area; (B) wire-bonding the terminal of the semiconductor element to the circuit section to electrically connect the terminal of the semiconductor element to the external terminal section; (C) subjecting one side of the circuit member for a semiconductor device to plastic molding so as to cover the semiconductor element, the wire, and the circuit section in their entirety; and (D) dissolving and removing the separating metal plating section in the conductive substrate to separate the conductive substrate alone.

In the above process for producing a semiconductor device, preferably, the circuit section in the circuit member for a semiconductor device comprises a plurality of external terminal sections, for electrical connection to an external circuit, provided independently of each other and the external terminal sections are formed directly on one side of the conductive substrate by plating.

Further, the process for producing a semiconductor device preferably further comprises, after the step of removing the conductive substrate, (e) the step of attaching a solder ball to the exposed external terminal section.

The present invention has the following effects or advantages.

The circuit member for a semiconductor device according to the present invention can be produced in a small thickness, permits a circuit to be finely fabricated, has good adhesion between the conductive substrate and the conductive metal and hence can prevent the conductive substrate from being separated from the conductive metal in the plastic molding in the production of a semiconductor device, and, after the production of a semiconductor device, permits the conductive substrate to be easily separated from the semiconductor device. Further, a plurality of sets of the lead and the external terminal section can be stably fixed independently of each other.

The process for producing a circuit member for a semiconductor device according to the present invention enables the whole circuit to be held without deformation and a semiconductor device to be stably produced.

The semiconductor device according to the present invention can satisfactorily cope with a demand for an increase in number of terminals and, in addition, has an excellent quality.

Thus, according to the present invention, a BGA type semiconductor device and a small package can be provide which is superior to the conventional products in productivity and quality and, in addition, can cope with an ever-increasing demand for an increase in number of terminals.

BRIEF DESCRIPTION OF THE INVENTION

FIGS. 3a–3b are cross-sectional views of a circuit member for a semiconductor device which is a variant of Example A1 of the present invention;

FIG. 7 is a process diagram showing a process for producing a semiconductor device of Example A7 of the present invention;

FIG. 9 is a process diagram showing a process for producing a circuit member for a semiconductor device of Example A6 of the present invention;

FIGS. 12a–12c are cross-sectional views of a schematic diagram showing a circuit member for a semiconductor device of Example B1 of the present invention;

FIG. 15 is a process diagram showing a process for producing a circuit member for a semiconductor device of Example B3 of the present invention;

FIG. 17 is a process diagram showing a process for producing a semiconductor device of Example B7 of the present invention;

FIG. 19 is a process diagram showing a process for producing a circuit member for a semiconductor device of Example B6 of the present invention;

FIGS. 21a–21b are cross-sectional views showing a semiconductor device of Example B9 of the present invention;

FIG. 24 is a process diagram showing a process for producing a circuit member for a semiconductor device of Example C2 of the present invention;

Figure 30A:
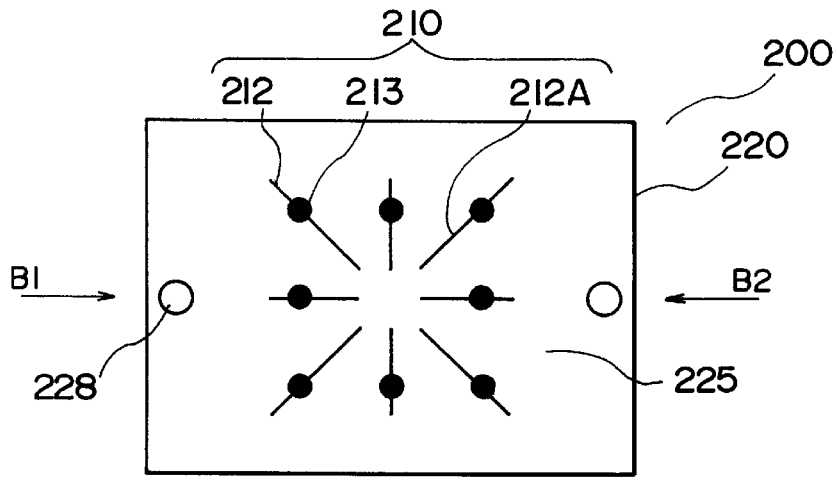
Figure 30B:
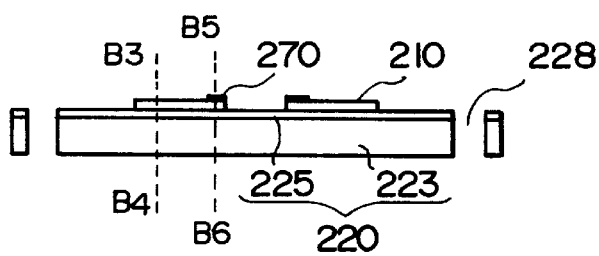
Figure 32:
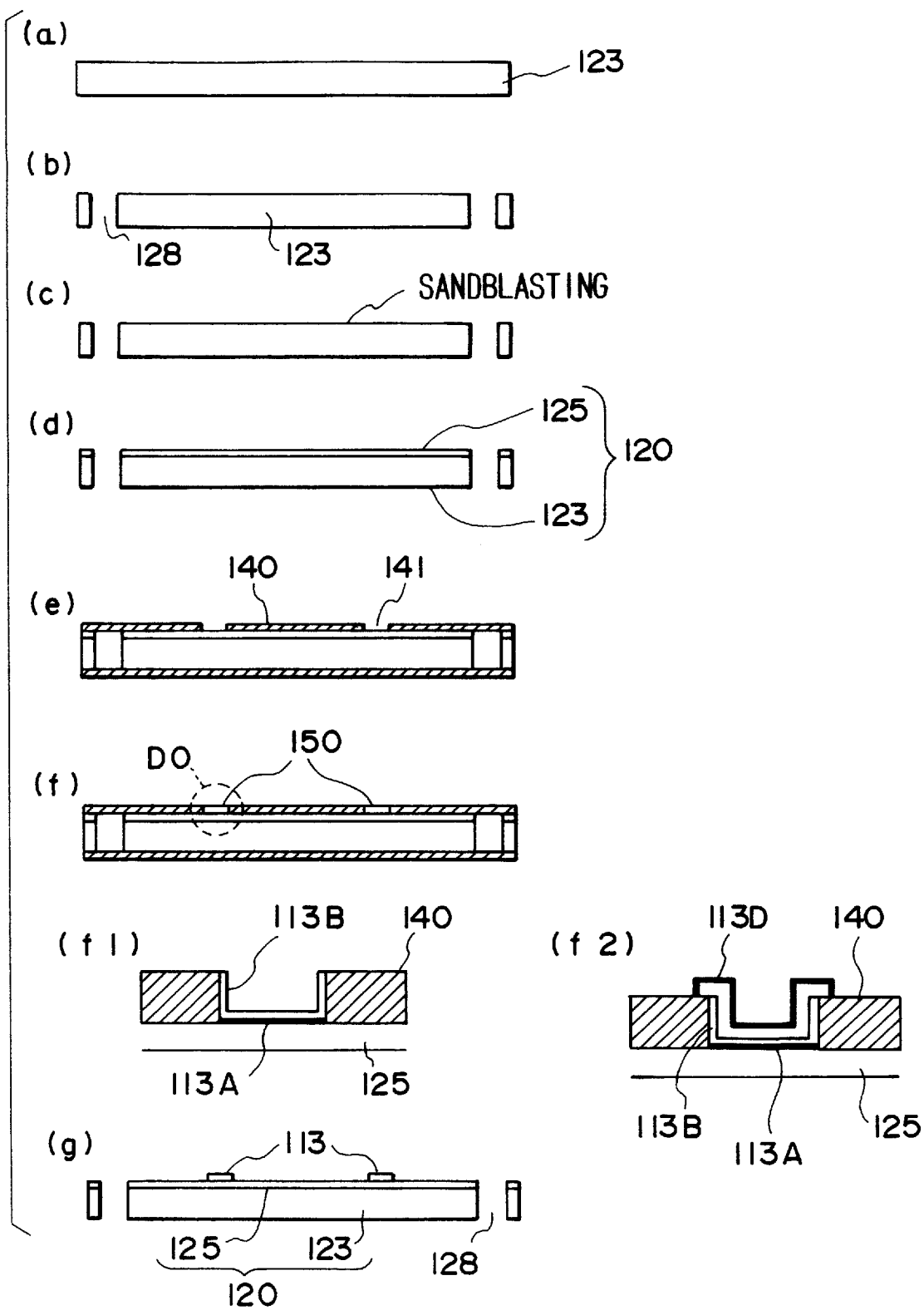
Figure 33:
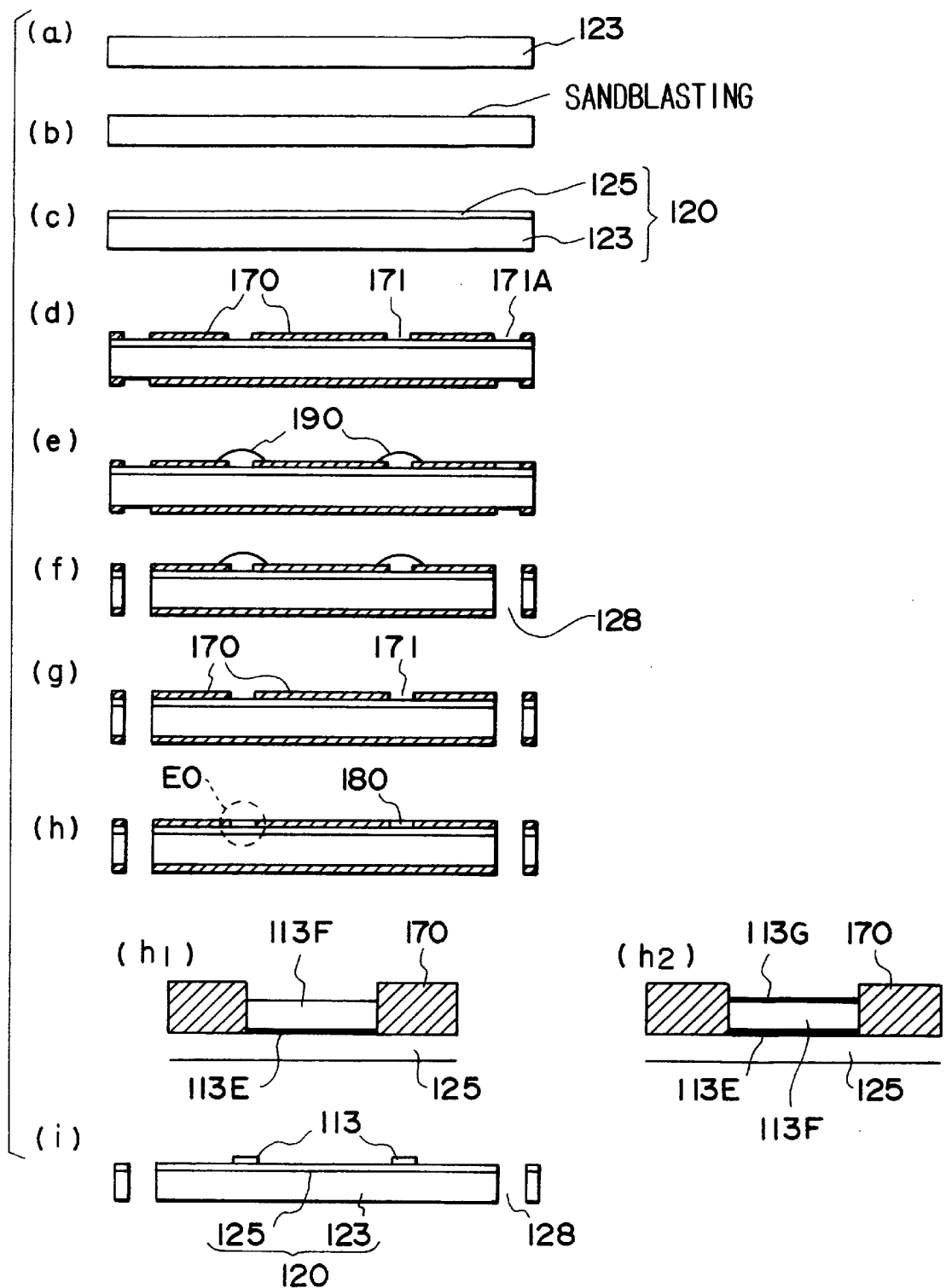
Figure 34:
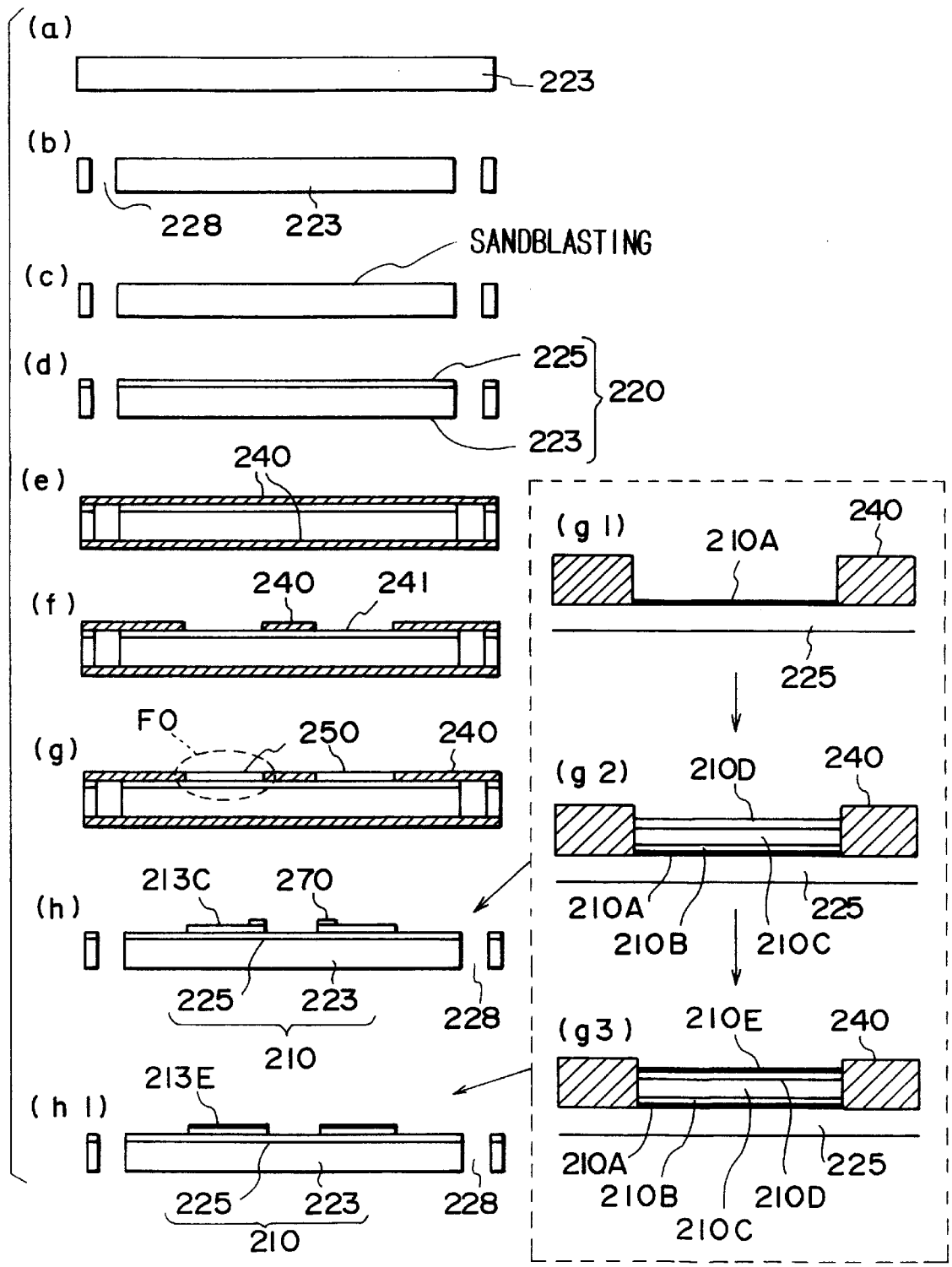
Figure 35:
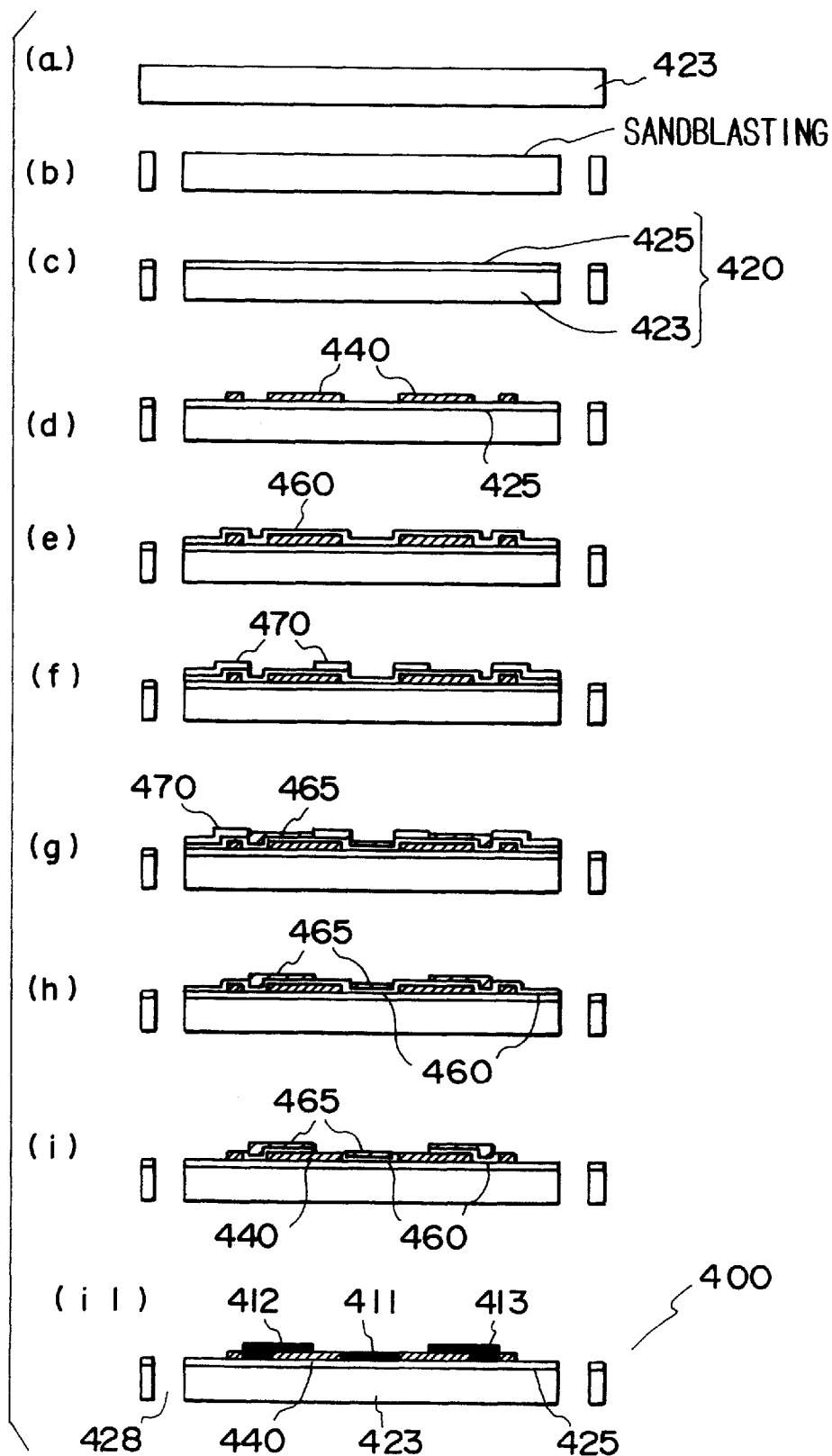
Figure 36:
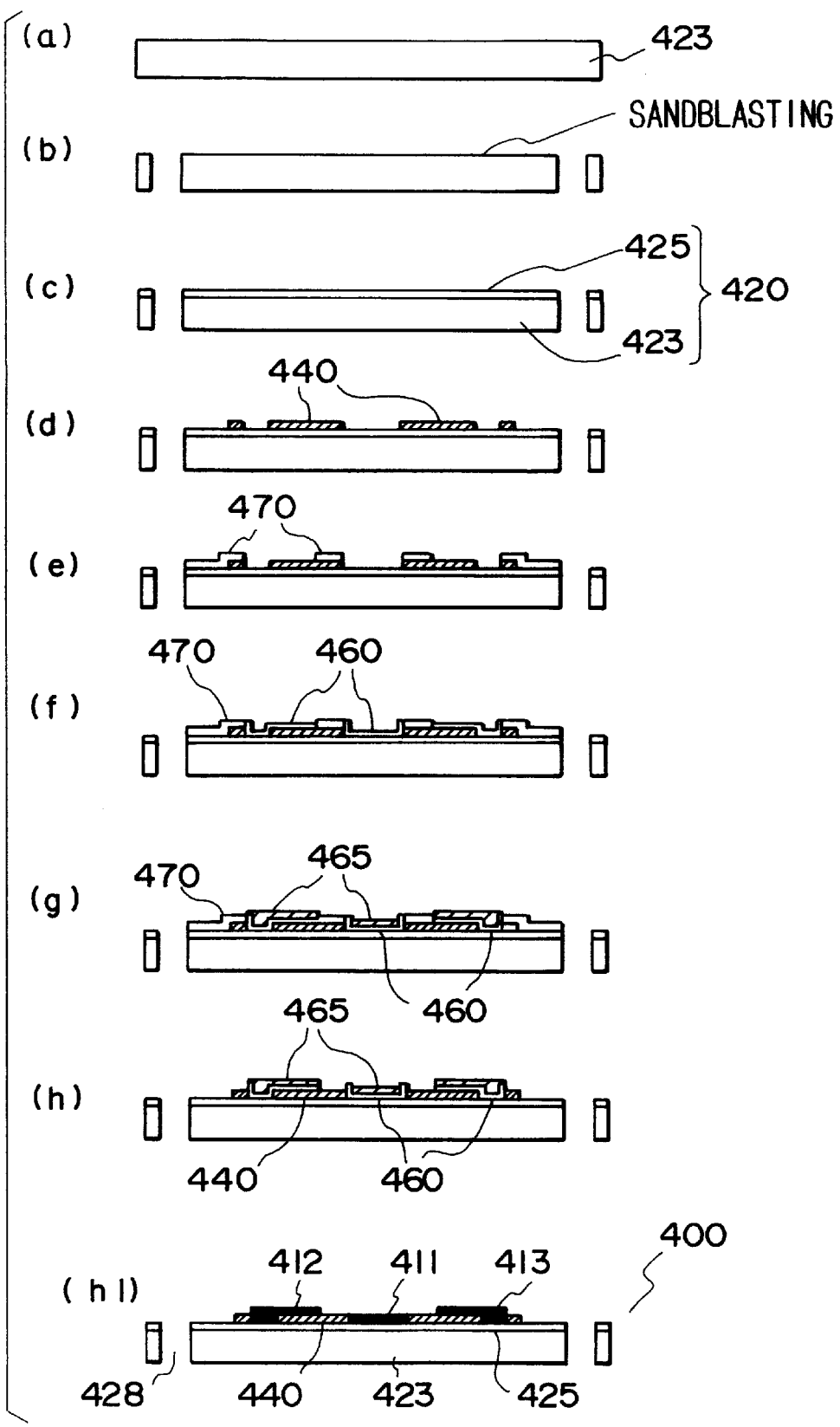
Figure 37:
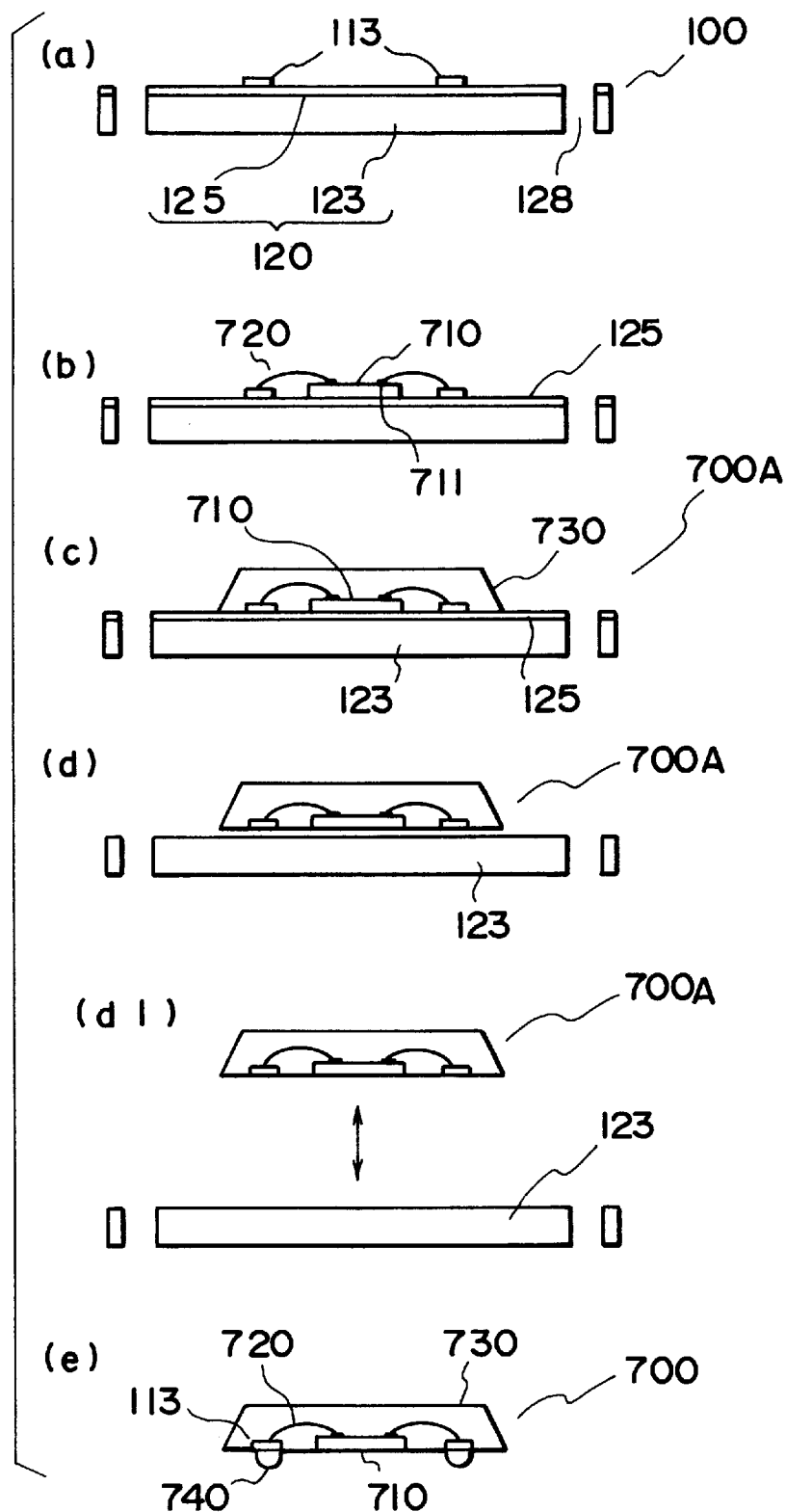
Figure 39A:
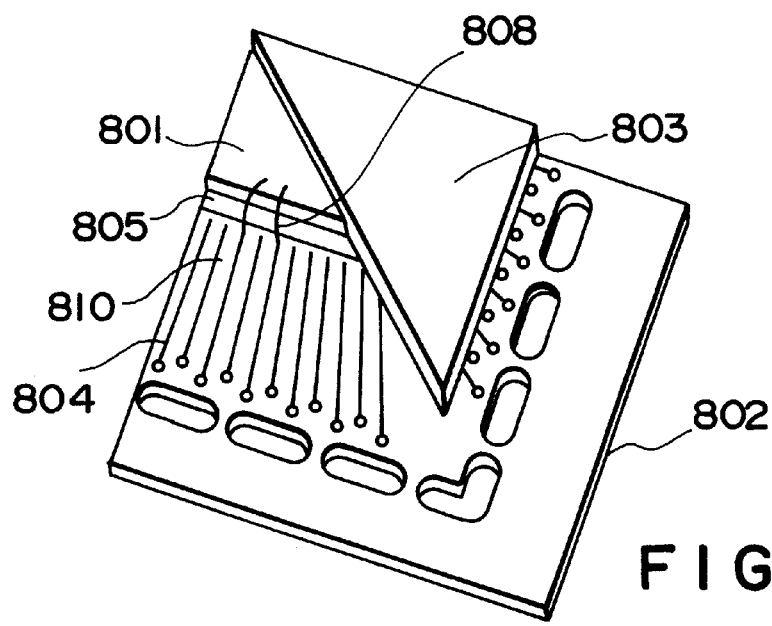
Figure 39B:
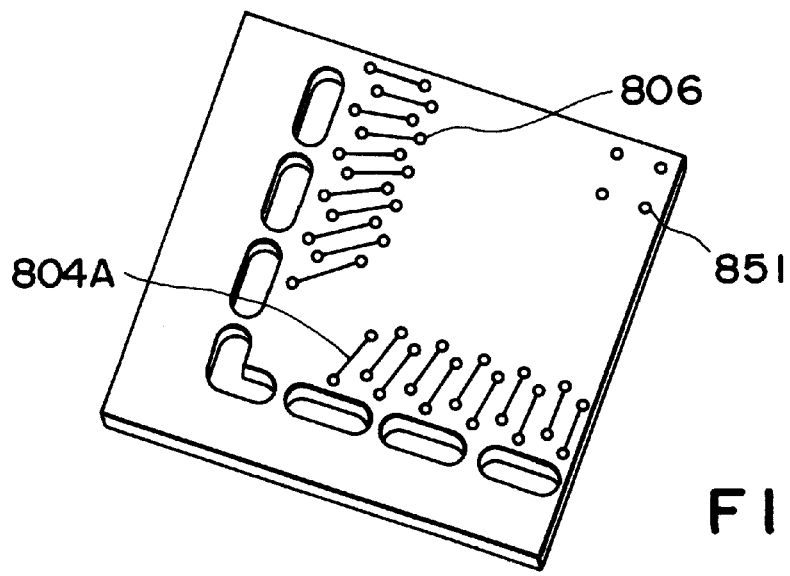
Figure 39C:
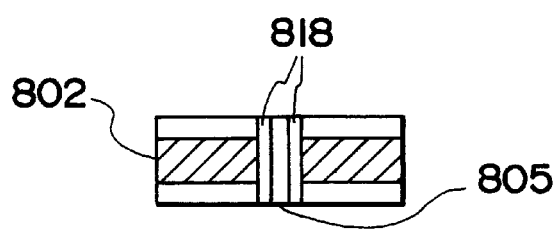
Figure 40A:
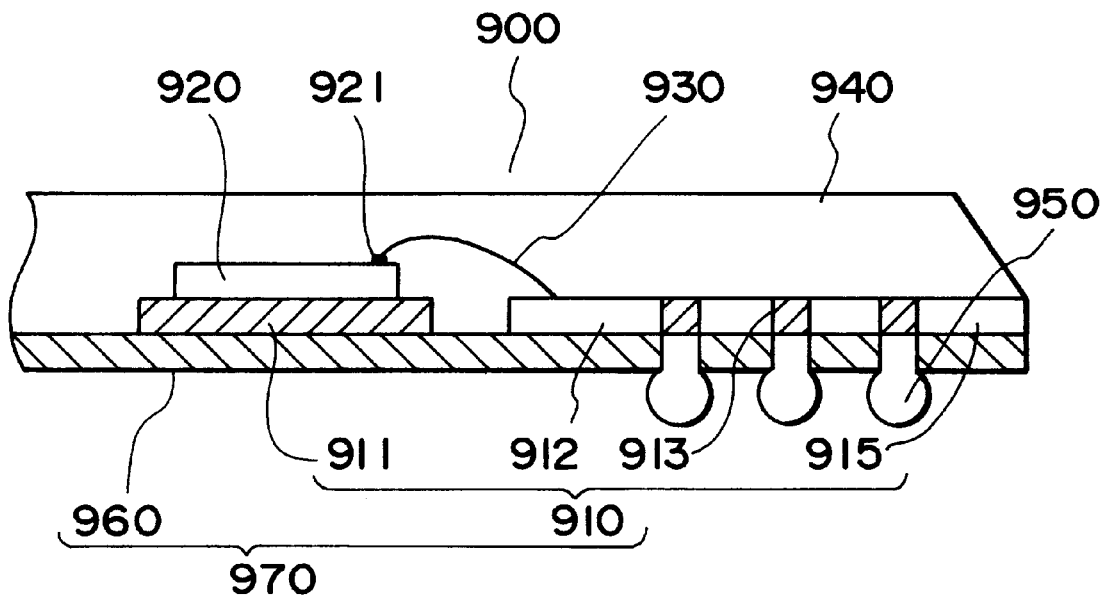
Figure 40B:
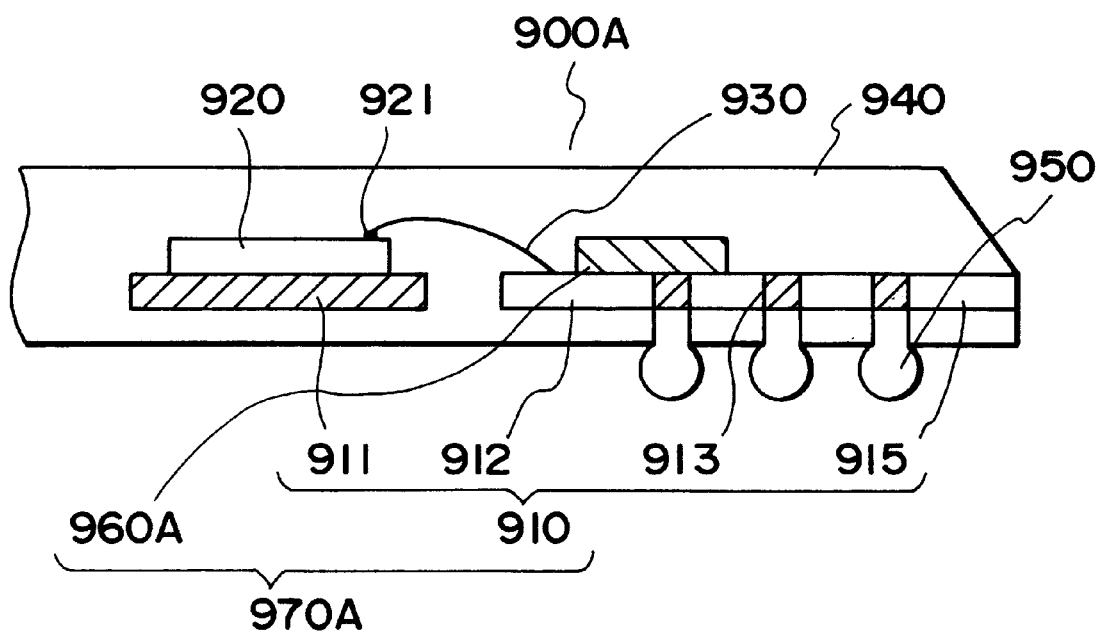
Figure 41A:
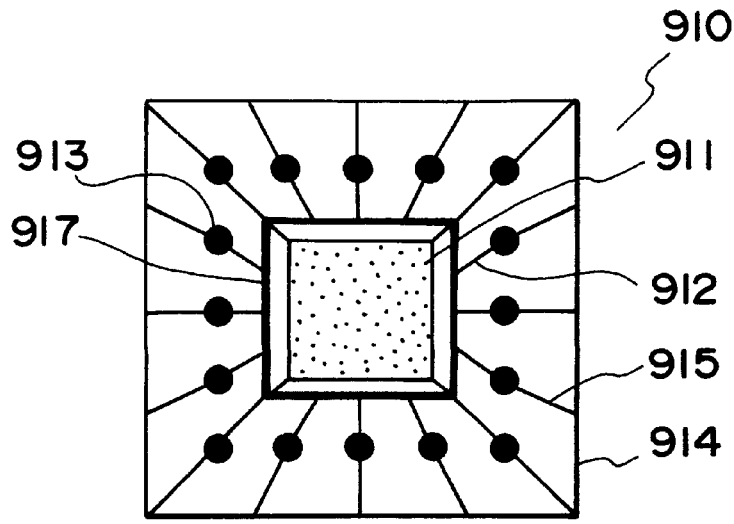
Figure 41B:
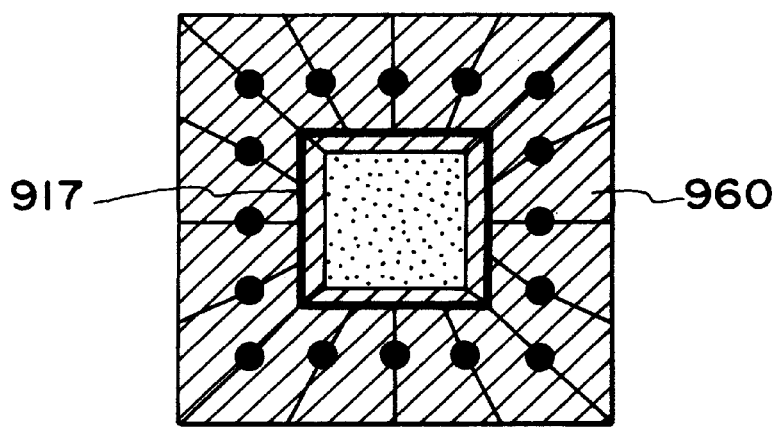
Figure 41C:
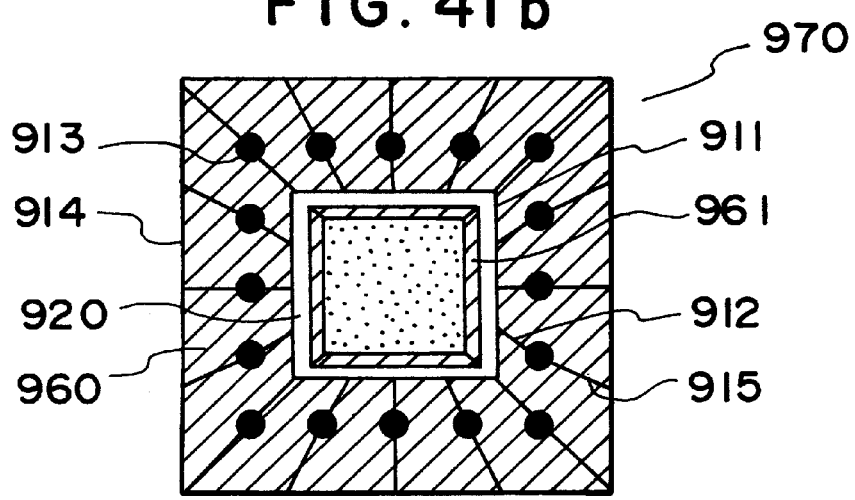
Figure 42A:
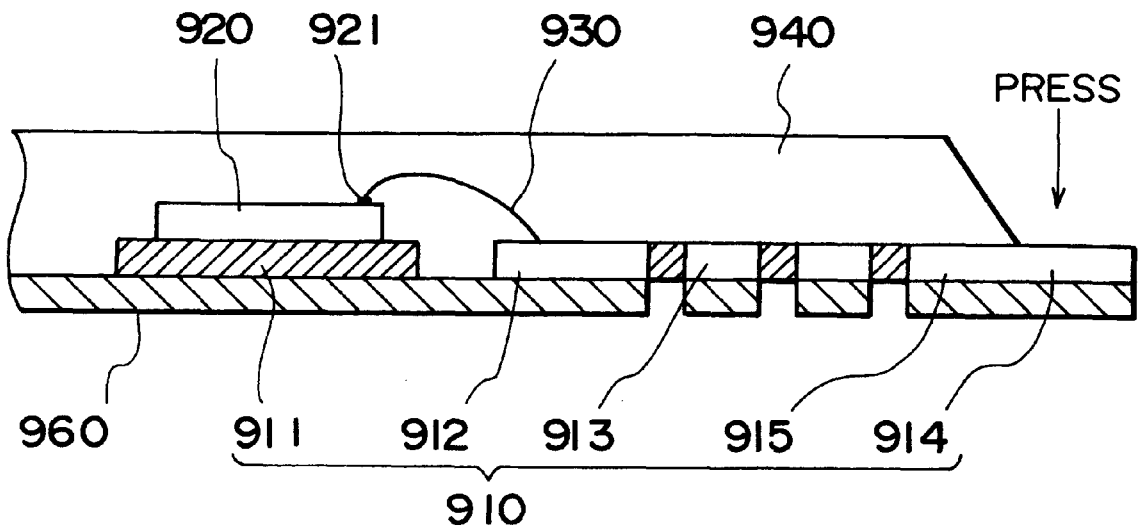
Figure 42B:
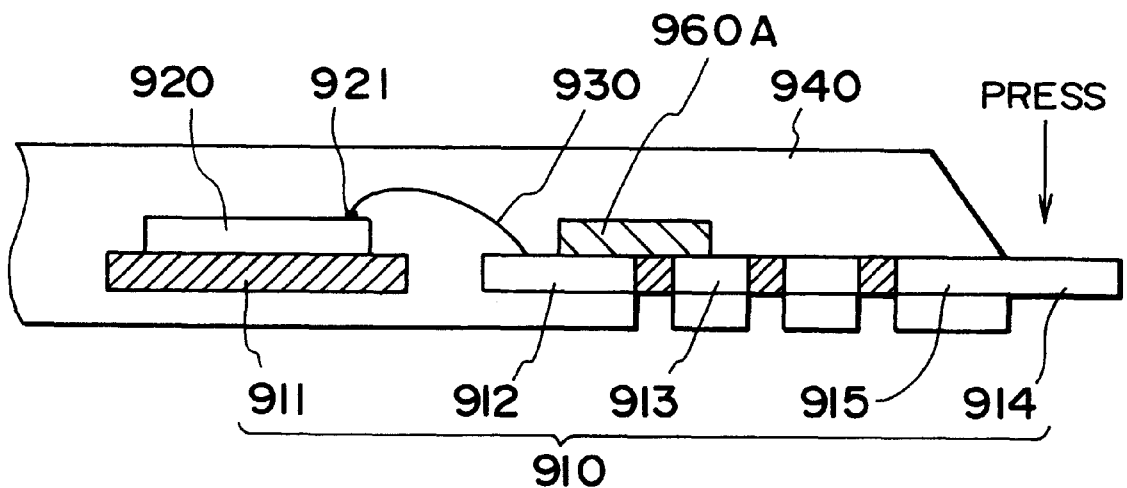
Figure 43:
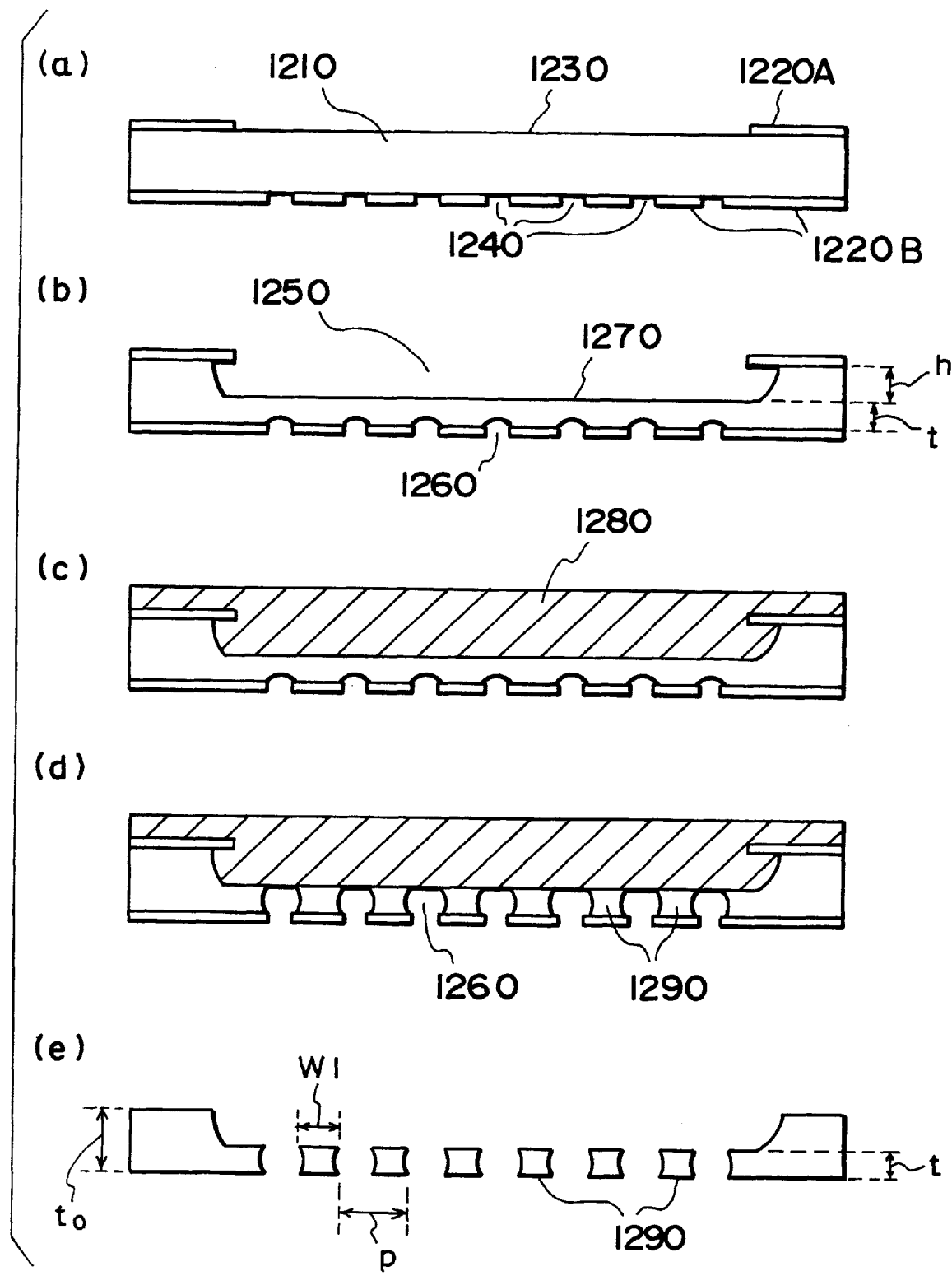

FIGS. 29a–29b; 29c1–29c2; and 29d1–29d2 are schematic diagrams showing circuit members for a semiconductor device of Examples D1 and D2 of the present invention;

FIGS. 30a–30b; 30c1–30c2; and 30d are a schematic diagrams showing a circuit member for a semiconductor device of Example D3 of the present invention;

FIGS. 31a–31c are schematic diagrams showing circuit member for a semiconductor device of Examples D4 and D5 of the present invention;

FIG. 32 is a process diagram showing a process for producing a circuit member for a semiconductor device of Example D6 of the present invention;

FIG. 33 is a process diagram showing a process for producing a circuit member for a semiconductor device of Example D7 of the present invention;

FIG. 34 is a process diagram showing a process for producing a circuit member for a semiconductor device of Example D8 of the present invention;

FIG. 35 is a process diagram showing a process for producing a circuit member for a semiconductor device of Example D9 of the present invention;

FIG. 36 is a process diagram showing a process for producing a circuit member for a semiconductor device of Example D10 of the present invention;

FIG. 37 is a process diagram showing a process for producing a semiconductor device of Example D11 of the present invention;

FIGS. 38a–38c are sectional views showing semiconductor devices of Examples D12 to D14 of the present invention;

FIGS. 39a–39c are explanatory views of a BGA semiconductor device;

FIGS. 40a–40b are cross-sectional views of a BGA type semiconductor device comprising the conventional lead frame as a core material;

FIGS. 41a–41c are explanatory views of the conventional lead frame member;

FIGS. 42a–42d are diagrams showing a process for producing a BGA type semiconductor device comprising the conventional lead frame as a core material;

FIG. 43 is a process diagram showing two-step etching; and

FIGS. 44a–44b are diagrams showing a lead frame having s single layer structure and a semiconductor device using the lead frame.

DETAILED DESCRIPTION OF THE INVENTION

A. A circuit member for a semiconductor device according to the present invention comprises: a conductive substrate; and a circuit section and the like at least two-dimensionally formed using a conductive metal by plating on the conductive substrate, characterized in that at least a part of the conductive metal constituting the circuit section is provided by plating on one side of the conductive substrate after subjecting the one side of the conductive substrate to surface treatment to create irregularities and to release treatment to impart releasability.

In the above circuit member for a semiconductor device, preferably, the circuit section comprises at least a die pad section for mounting a semiconductor element thereon, a lead for electrical connection to a semiconductor element, and an external terminal section for electrical connection to an external circuit and a plurality of sets of the lead and the external terminal section integrally connected to each other are provided independently of each other.

Further, in the above circuit member for a semiconductor device, preferably, the two-dimensionally formed circuit section in its entirety has been formed directly on one side of the conductive substrate by plating, or otherwise, only the die pad section and the external terminal section in the circuit section have been formed directly on one side of the conductive substrate by plating with the other sections in the circuit section having been formed through an insulating resist.

Further, in the above circuit member for a semiconductor device, preferably, the surface treatment is sand blasting.

Further, in the above circuit member for a semiconductor device, preferably, the release treatment is a treatment for forming an oxide film or an organic film on the surface of the conductive substrate.

Further, in the above circuit member for a semiconductor device, preferably, a plurality of semiconductor elements can be mounted.

Further, in the above circuit member for a semiconductor device, preferably, the conductive substrate is made of an iron-nickel-chromium-base metal, an iron-chromium-base metal, an iron-nickel-base metal, or an iron-carbon-base metal and the conductive metal plating is either copper plating or copper plating using nickel as a substrate.

A process for producing a circuit member for a semiconductor device according to the present invention comprises: a conductive substrate; and a circuit section in its entirety two-dimensionally formed directly on one side of the conductive substrate by plating, said process being characterized by comprising, in sequence, at least the steps of: (A) surface-treating one side of the conductive substrate to provide irregularities; (B) subjecting the conductive substrate on its one side with irregularities provided thereon to release treatment for imparting releasability; (C) coating a resist on the conductive substrate on its one side subjected to the surface treatment and the release treatment and exposing only an area to be plated with a conductive metal to prepare a plate; and (D) plating the plate on its exposed area with a conductive metal.

In the above process for producing a circuit member for a semiconductor device, preferably, the conductive substrate is made of an iron-nickel-chromium-base metal, an iron-chromium-base metal, an iron-nickel-base metal, or an iron-carbon-base metal and the conductive metal plating is either copper plating or copper plating using nickel as a substrate.

A process for producing a circuit member for a semiconductor device according to the present invention comprises: a conductive substrate; and a circuit section in its entirety two-dimensionally formed directly on one side of the conductive substrate by plating, said process being characterized by comprising, in sequence, at least the steps of: (G) surface-treating one side of the conductive substrate to provide irregularities; (H) subjecting the conductive substrate on its one side with irregularities provided thereon to release treatment for imparting releasability; (I) plating the conductive substrate on its whole surface subjected to the surface treatment and the release treatment with a conductive metal; (J) coating a resist on the surface of the plating and treating the coating so as to cover an area where a circuit section and the like are formed, thereby preparing a plate; and (K) performing etching so as to pass through the section plated with a conductive metal to form a circuit section and the like.

In the above process for producing a circuit member for a semiconductor device, preferably, the conductive substrate is made of an iron-nickel-chromium-base metal, an iron-chromium-base metal, an iron-nickel-base metal, or an iron-carbon-base metal and the conductive metal plating is copper plating.

In the above process for producing a circuit member for a semiconductor device, preferably, the step of forming a jig hole for registration is carried out before the preparation of the plate.

In the above process for producing a circuit member for a semiconductor device, preferably, the step of forming a jig hole is etching using a resist plate.

A process for producing a circuit member for a semiconductor device according to the present invention comprises: a conductive substrate; and a circuit section and the like two-dimensionally formed using a conductive metal by plating on the conductive substrate, the circuit section comprising at least a die pad section for mounting a semiconductor element thereon, a lead for electrical connection to a semiconductor element, and an external terminal section for electrical connection to an external circuit, a plurality of sets of the lead and the external terminal section integrally connected to each other being provided independently of each other, only the die pad section and the external terminal section in the circuit section having been formed directly on one side of the conductive substrate by plating with the other sections in the circuit section having been formed through an insulating resist, said process being characterized by comprising, in sequence, at least the steps of: (a) surface-treating one side of the conductive substrate to provide irregularities thereon; (b) subjecting the conductive substrate on its one side with irregularities provided thereon to release treatment for imparting releasability; (c) coating a first insulating resist on the conductive substrate on its one side subjected to the surface treatment and the release treatment and exposing only a die pad section and external terminal section forming area by plating to prepare a plate; (d) subjecting the plate on its exposed area to first plating with a conductive metal by electroplating; (e) coating a second insulating resist on the surface of the first plating and exposing only an area where a circuit section is to be prepared by plating; and (f) subjecting the plate on its exposed area to second plating with a conductive metal by electroplating or electroless plating.

A process for producing a circuit member for a semiconductor device according to the present invention comprises: a conductive substrate; and a circuit section and the like two-dimensionally formed using a conductive metal by plating on the conductive substrate, the circuit section comprising at least a die pad section for mounting a semiconductor element thereon, a lead for electrical connection to a semiconductor element, and an external terminal section for electrical connection to an external circuit, a plurality of sets of the lead and the external terminal section integrally connected to each other being provided independently of each other, only the die pad section and the external terminal section in the circuit section having been formed directly on one side of the conductive substrate by plating with the other sections in the circuit section having been formed through an insulating resist, said process being characterized by comprising, in sequence, at least the steps of: (g) surface-treating one side of the conductive substrate to provide irregularities thereon; (h) subjecting the conductive substrate on its one side with irregularities provided thereon to release treatment for imparting releasability; (i) coating a first insulating resist on the conductive substrate on its one side subjected to the surface treatment and the release treatment and exposing only a die pad section and external terminal section forming area by plating to prepare a first plate; (j) subjecting the plate on its exposed area to first plating with a conductive metal by electroplating; (k) subjecting the whole surface on the first plating side to second plating with a conductive metal by electroless plating; (l) covering the plating, prepared by electroless plating, in its area where a circuit section is formed, thereby preparing a second plate; and (m) removing the area, exposed in the step of preparing the plate, by etching.

In the above process for producing a circuit member for a semiconductor device, preferably, the conductive substrate is made of an iron-nickel-chromium-base metal, an iron-chromium-base metal, an iron-nickel-base metal, or an iron-carbon-base metal and the conductive metal plating in the step of the first plating is either copper plating or copper plating using nickel as a substrate and the conductive metal plating in the step of the second plating is copper plating.

In the above process, preferably, the surface treatment is sand blasting.

Further, in the above process, preferably, the release treatment is a treatment for forming an oxide film or an organic film on the surface of the conductive substrate.

A process for producing a semiconductor device using a circuit member, for a semiconductor device, comprising: a conductive substrate; and a circuit section and the like at least two-dimensionally formed using a conductive metal by plating on the conductive substrate, the circuit section comprising at least a die pad section for mounting a semiconductor element, a lead for electrical connection to a semiconductor element, and an external terminal section for electrical connection to an external circuit, a plurality of sets of the lead and the external terminal section integrally connected to each other being provided independently of each other, the whole circuit section having been formed directly on one side of the conductive substrate by plating, according to the present invention is characterized by comprising, in sequence, at least the steps of: (i) mounting a semiconductor element, with the terminal facing upward, on a die pad provided on a conductive substrate and wire-bonding the terminal of the semiconductor element to a lead; (ii) subjecting one side of the lead member, for a semiconductor device, to plastic molding so as to cover the semiconductor element, the wire, and the circuit section of the lead member for a semiconductor device in their entirety; and (iii) removing the conductive substrate in the lead member for a semiconductor device.

The above process for producing a semiconductor device preferably further comprises, after the step of removing the substrate, (iv) the step of coating a solder resist on the surface, exposed by removing the substrate, of the circuit section remote from the surface, with the semiconductor element mounted thereon, so as to expose only the external terminal section of the circuit section and (v) the step of attaching a solder ball to the external terminal section exposed from the solder resist.

Further, a process for producing a semiconductor device using a circuit member, for a semiconductor device, comprising: a conductive substrate; and a circuit section and the like at least two-dimensionally formed using a conductive metal by plating on the conductive substrate, the circuit section comprising at least a die pad section for mounting a semiconductor element thereon, a lead for electrical connection to a semiconductor element, and an external terminal section for electrical connection to an external circuit, a plurality of sets of the lead and the external terminal section integrally connected to each other being provided independently of each other, only the die pad section and the external terminal section in the circuit section having been formed directly on one side of the conductive substrate by plating with the other sections in the circuit section having been formed through an insulating resist, according to the present invention, is characterized by comprising, in sequence, at least the steps of: (vi) mounting a semiconductor element, with the terminal facing upward, on a die pad provided on a conductive substrate and wire-bonding the terminal of the semiconductor element to a lead; (vii) subjecting one side of the lead member, for a semiconductor device, to plastic molding so as to cover the semiconductor element, the wire, and the circuit section of the lead member for a semiconductor device in their entirety; and (viii) removing the conductive substrate in the lead member for a semiconductor device.

The above process for producing a semiconductor device preferably further comprises, after the step of removing the substrate, (ix) the step of attaching a solder ball to the exposed external terminal section.

The circuit member for a semiconductor device according to the present invention, by virtue of the above constitution, can surely fix a lead and an external terminal section and, as compared with the conventional lead frame member, enables a lead to be more finely fabricated.

Specifically, provision of a circuit section or the like two-dimensionally formed using a conductive metal by plating on the conductive substrate enables the conductive metal to be surely fixed onto the conductive substrate without deformation, and, since the conductive metal is formed by plating, the conductive metal section can be formed in a desired small thickness, enabling a lead and the like to be finely fabricated.

Further, since at least a part of the conductive metal constituting the circuit section and the like is provided by plating on one side of the conductive substrate after subjecting the one side of the conductive substrate to surface treatment to create irregularities and to release treatment to impart releasability, the fabricability in the production of a semiconductor device is good.

For example, when the circuit section in the circuit member for a semiconductor device comprises a die pad section for mounting a semiconductor element thereon and a lead for electrical connection to a semiconductor element, in the production of a semiconductor device in such a manner that a semiconductor element is mounted on the die pad in a circuit section constituted by a conductive metal provided on the conductive substrate by plating, wire bonding is performed, and the semiconductor element side alone is molded, an advantage can be provided that the circuit section can withstand the pressure and the like created by the molding resin during the plastic molding, the conductive substrate can be surely adhered to the conductive metal provided by the plating, and, at the same time, after the molding, the whole semiconductor device can be easily separated from the conductive substrate. This is because the surface treatment for creating surface irregularities permits the conductive metal provided by plating to be formed on the conductive substrate so as to have high resistance to transverse force and, in addition, the release treatment offers good releasability by perpendicular force.

Specifically, according to a preferred embodiment, the circuit section comprises at least a die pad section for mounting a semiconductor element thereon, a lead for electrical connection to a semiconductor element, and an external terminal section for electrical connection to an external circuit, a plurality of sets of the lead and the external terminal section integrally connected to each other are provided independently of each other, and the whole circuit section has been two-dimensionally formed directly on one side of the conductive substrate by plating. This constitution permits the practice of a single plating step to suffice for satisfactory results and can render the production process relatively simple.

Further, according to a preferred embodiment, the circuit section comprises at least a die pad section for mounting a semiconductor element thereon, a lead for electrical connection to a semiconductor element, and an external terminal section for electrical connection to an external circuit, a plurality of sets of the lead and the external terminal section integrally connected to each other are provided independently of each other, and only the die pad section and the external terminal section in the circuit section have been formed directly on one side of the conductive substrate by plating with the other sections in the circuit section having been formed through an insulating resist. This constitution can eliminate the need to prepare a plate for exposing only a solder ball area in the step of preparing a solder ball external electrode in the production of a semiconductor device.

An example of the release treatment is oxidation treatment wherein the surface of the conductive substrate is oxidized with a chromic acid or the like to form an oxide film which inhibits a metallic bond between the conductive metal provided by plating and the conductive substrate. Sand blasting is an example of the surface treatment. Further, it is also possible to use a brushing method wherein a mixture of abrasive grains with a liquid is allowed to collide against the object to be treated.

When the circuit member is constructed so that a plurality of semiconductor elements can be mounted, it can be applied also to a multi-chip type semiconductor device. Further, it is applicable to CSP.

According to a preferred embodiment, the conductive substrate is made of an iron-nickel-chromium-base metal or an iron-chromium-base metal, and the conductive metal plating is either copper plating or copper plating using nickel as a substrate. By virtue of this constitution, the above surface treatment for creating surface irregularities and the release treatment for imparting the releasability become more effective.

In the conventional lead frame member shown in FIG. 41c, when a lead frame prepared by finely fabricating an inner lead is used, a complicate process is necessary such that, as shown in FIG. 41a, etching is performed in such a state that a connecting section 917 for connecting inner leads among one another to fix them, an inner lead fixing tape 920 is then applied (FIG. 41b) and the connecting section 917 is removed. Further, when the conventional lead frame member shown in FIG. 41c is used to produce a semiconductor device, as shown in FIG. 42, plastic molding of a supporting lead 915 for supporting an external terminal section 913 followed by removal of the dam bar (frame section) 914 by pressing is necessary. This poses problems of productivity and cost. By contrast, in the circuit member for a semiconductor device according to the present invention, a plurality of sets of the external terminal section and the lead integrally connected to each other are provided independently of each other. This can solve the above problems.

By virtue of the above constitution, the process for preparing a circuit member for a semiconductor device according to the present invention can produce the circuit member for a semiconductor device according to the present invention, and the formation of a circuit section using a conductive metal provided by plating on the conductive substrate can realize a fine circuit section without creating significant deformation and with an excellent accuracy.

The process for producing a semiconductor device according to the present invention, by virtue of the above constitution, can cope with a demand for multiple terminals and, at the same time, can surely produce a semiconductor device having good quality.

The semiconductor device of the present invention is one produced using the circuit member, for a semiconductor device, of the present invention by the process for producing a semiconductor device according to the present invention, and, as compared with the conventional semiconductor device shown in FIG. 40, the production process of the semiconductor device is simplified, which is advantageous in productivity as well as in cost. Further, the production of a BGA, plastic molded type semiconductor device, which can cope with a demand for a further increase in terminals, can be realized. Furthermore, the provision of a multi-chip semiconductor device, with a plurality of semiconductor devices mounted thereon, and CSP (chip scale package) can also be realized.

Furthermore, it is needless to say that, unlike the conventional BGA using a printed circuit board as shown in FIG. 39, the semiconductor device of the present invention requires no complicate production process and poses no problem of the moisture resistance.

B. Another circuit member for a semiconductor device according to the present invention is characterized by comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, at least a part of the conductive metal constituting the circuit section and the like being provided by plating on one side of the conductive substrate after subjecting the one side of the conductive substrate to surface treatment to create irregularities and to release treatment to impart releasability.

In the above circuit member for a semiconductor device, preferably, the two-dimensionally formed circuit section in its entirety has been formed directly on one side of the conductive substrate by plating.

Further, in the above circuit member for a semiconductor device, preferably, only the external terminal section in the circuit section has been formed directly on one side of the conductive substrate by plating with the other sections in the circuit section having been formed through an insulating resist.

Furthermore, in the above circuit member for a semiconductor device, preferably, the surface treatment is sand blasting.

Furthermore, in the above circuit member for a semiconductor device, preferably, the release treatment is a treatment for forming an oxide film on the surface of the conductive substrate.

Furthermore, in the above circuit member for a semiconductor device, preferably, a plurality of semiconductor elements can be mounted.

Furthermore, in the above circuit member for a semiconductor device, preferably, the conductive substrate is made of an iron-nickel-chromium-base metal, an iron-chromium-base metal, an iron-nickel-base metal, or an iron-carbon-base metal and the conductive metal plating is either copper plating or copper plating using nickel as a substrate.

Another process for producing a circuit member, for a semiconductor device, comprising: a conductive substrate; and a circuit section in its entirety two-dimensionally formed directly on one side of the conductive substrate by plating, the circuit section having no die pad section for mounting a semiconductor element thereon, according to the present invention, is characterized by comprising, in sequence, at least the steps of: (G) surface-treating one side of the conductive substrate to provide irregularities; (H) subjecting the conductive substrate on its one side with irregularities provided thereon to release treatment for imparting releasability; (I) plating the conductive substrate on its whole surface subjected to the surface treatment and the release treatment with a conductive metal; (J) coating a resist on the surface of the plating and treating the coating so as to cover only an area where a circuit section and the like are formed, thereby preparing a plate; and (K) performing etching so as to pass through the section plated with a conductive metal to form a circuit section and the like.

In the above process for producing a circuit member for a semiconductor device, preferably, the conductive substrate is made of an iron-nickel-chromium-base metal, an iron-chromium-base metal, an iron-nickel-base metal, or an iron-carbon-base metal and the conductive metal plating is copper plating.

Further, in the above process for producing a circuit member for a semiconductor device, preferably, the step of forming a jig hole for registration is carried out before the preparation of the plate.

Furthermore, in the above process for producing a circuit member for a semiconductor device, preferably, the step of forming a jig hole is etching using a resist plate.

Another process for producing a circuit member, for a semiconductor device, comprising: a conductive substrate; and a circuit section and the like two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, only the external terminal section in the circuit section having been formed directly on one side of the conductive substrate by plating with the other sections in the circuit section having been formed through an insulating resist, according to the present invention, is characterized by comprising, in sequence, at least the steps of: (a) surface-treating one side of the conductive substrate to provide irregularities thereon; (b) subjecting the conductive substrate on its one side with irregularities provided thereon to release treatment for imparting releasability; (c) coating a first insulating resist on the conductive substrate on its one side subjected to the surface treatment and the release treatment and exposing only an external terminal section forming area to prepare a plate; (d) subjecting the plate on its exposed area to first plating with a conductive metal by electroplating; (e) coating a second insulating resist on the surface of the first plating and exposing only an area where a circuit section is prepared by plating; and (f) subjecting the plate on its exposed area to second plating with a conductive metal by electroplating or electroless plating.

Further, another process for producing a circuit member, for a semiconductor device, comprising: a conductive substrate; and a circuit section and the like two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, only the external terminal section in the circuit section having been formed directly on one side of the conductive substrate by plating with the other sections in the circuit section having been formed through an insulating resist, according to the present invention, is characterized by comprising, in sequence, at least the steps of: (g) surface-treating one side of the conductive substrate to provide irregularities thereon; (h) subjecting the conductive substrate on its one side with irregularities provided thereon to release treatment for imparting releasability; (i) coating a first insulating resist on the conductive substrate on its one side subjected to the surface treatment and the release treatment and exposing only an external terminal section forming area to prepare a first plate; (j) subjecting the plate on its exposed area to first plating with a conductive metal by electroplating; (k) subjecting the whole surface on the first plating side to second plating with a conductive metal by electroless plating; (l) covering the plating, prepared by electroless plating, only in its area where a circuit section is formed, thereby preparing a second plate; and (m) removing the area, exposed in the step of preparing the plate, by etching.

In the above process for producing a circuit member for a semiconductor device, preferably, the conductive substrate is made of an iron-nickel-chromium-base metal, an iron-chromium-base metal, an iron-nickel-base metal, or an iron-carbon-base metal and the conductive metal plating in the step of the first plating is either copper plating or copper plating using nickel as a substrate and the conductive metal plating in the step of the second plating is copper plating.

Further, in the above process for producing a circuit member for a semiconductor device, preferably, the surface treatment is sand blasting.

Furthermore, in the above process for producing a circuit member for a semiconductor device, preferably, the release treatment is a treatment for forming an oxide film on the surface of the conductive substrate.

Further, another process for producing a semiconductor device using a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, the whole circuit section having been formed directly on one side of the conductive substrate by plating, according to the present invention, is characterized by comprising, in sequence, at least the steps of: (i) mounting a semiconductor element, with the terminal facing upward, on a circuit section provided on a conductive substrate and wire-bonding the terminal of the semiconductor element to a lead; (ii) subjecting one side of the lead member, for a semiconductor device, to plastic molding so as to cover the semiconductor element, the wire, and the circuit section of the lead member for a semiconductor device in their entirety; and (iii) removing the conductive substrate in the lead member for a semiconductor device.

The above process for producing a semiconductor device preferably further comprises, after the step of removing the substrate, (iv) the step of coating a solder resist on the surface, exposed by removing the substrate, of the circuit section remote from the surface, with the semiconductor element mounted thereon, so as to expose only the external terminal section of the circuit section and (v) the step of attaching a solder ball to the external terminal section exposed from the solder resist.

Further, another process for producing a semiconductor device using a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, only the external terminal section in the circuit section having been formed directly on one side of the conductive substrate by plating with the other sections in the circuit section having been formed through an insulating resist, according to the present invention, is characterized by comprising, in sequence, at least the steps of: (vi) mounting a semiconductor element, with the terminal facing upward, on a circuit section provided on a conductive substrate and wire-bonding the terminal of the semiconductor element to a lead; (vii) subjecting one side of the lead member, for a semiconductor device, to plastic molding so as to cover the semiconductor element, the wire, and the circuit section of the lead member for a semiconductor device in their entirety; and (viii) removing the conductive substrate in the lead member for a semiconductor device.

The above process for producing a semiconductor device preferably further comprises, after the step of removing the substrate, (ix) the step of attaching a solder ball to the exposed external terminal section.

The circuit member for a semiconductor device according to the present invention, by virtue of the above constitution, can surely fix a lead and an external terminal section and, as compared with the conventional lead frame member, enables a lead to be more finely fabricated and, in addition, can be advantageously cope with a demand for multiple terminals.

Specifically, provision of a circuit section and the like two-dimensionally formed using a conductive metal by plating on the conductive substrate enables the conductive metal to be surely fixed onto the conductive substrate without deformation, and, since the conductive metal is formed by plating, the conductive metal section can be formed in a desired small thickness, enabling a lead and the like to be finely fabricated. Further, since no die pad is provided, the lead and the external terminal section can be provided in a wide area.

Further, since at least a part of the conductive metal constituting the circuit section and the like is provided by plating on one side of the conductive substrate after subjecting the one side of the conductive substrate to surface treatment to create irregularities and to release treatment to impart releasability, the fabricability in the production of a semiconductor device is good.

For example, in the production of a semiconductor device in such a manner that a semiconductor element is mounted through an insulating adhesive tape on a lead of a conductive metal provided by plating on the conductive substrate, wire bonding is performed, and the semiconductor element side alone is then molded, an advantage can be provided that the circuit section can withstand the pressure and the like created by the molding resin during the plastic molding, the conductive substrate can be surely adhered to the conductive metal provided by the plating, and, at the same time, after the molding, the whole semiconductor device can be easily separated from the conductive substrate. This is because the surface treatment for creating surface irregularities permits the conductive metal provided by plating to be formed on the conductive substrate so as to have high resistance to transverse force and, in addition, the release treatment offers good releasability by perpendicular force.

Specifically, according to a preferred embodiment, the circuit section comprises at least a lead for electrical connection to a semiconductor element and an external terminal section for electrical connection to an external circuit and does not have any die pad section for mounting a semiconductor element thereon, a plurality of sets of the lead and the external terminal section integrally connected to each other are provided independently of each other, and the whole circuit section has been two-dimensionally formed directly on one side of the conductive substrate by plating. This constitution permits the practice of a single plating step to suffice for satisfactory results and can render the production process relatively simple.

Further, according to a preferred embodiment, the circuit section comprises at least a lead for electrical connection to a semiconductor element and an external terminal section for electrical connection to an external circuit and does not have any die pad section for mounting a semiconductor element thereon, a plurality of sets of the lead and the external terminal section integrally connected to each other are provided independently of each other, and only the external terminal section in the circuit section has been formed directly on one side of the conductive substrate by plating with the other sections in the circuit section having been formed through an insulating resist. This constitution can eliminate the need to prepare a plate for exposing only a solder ball area in the step of preparing a solder ball external electrode in the production of a semiconductor device.

By virtue of the above constitution, the process for preparing a circuit member for a semiconductor device according to the present invention can produce the circuit member for a semiconductor device according to the present invention, and the formation of a circuit section using a conductive metal provided by plating on the conductive substrate can realize a fine circuit section without creating significant deformation and with an excellent accuracy.

The process for producing a semiconductor device according to the present invention, by virtue of the above constitution, can cope with a demand for multiple terminals and, at the same time, can surely produce a semiconductor device having good quality.

C. Still another circuit member for a semiconductor device according to the present invention is characterized by comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, a plurality of sets of the lead and the external terminal section integrally connected to each other being provided independently of each other, the external terminal section in the circuit section having been formed directly on one side of the conductive substrate by electroplating, the lead in the circuit section having been formed on an insulating epoxy resin layer, the insulating epoxy resin layer having been provided directly on the conductive substrate excluding the external terminal section forming area by transfer molding.

In the above circuit member for a semiconductor device, the conductive substrate on its side having the circuit section has been surface-treated to create irregularities and the conductive substrate on its side subjected to surface treatment for creating irregularities thereon has been subjected to release treatment to impart releasability.

The conductive substrate may be made of an iron-nickel-chromium-base metal, an iron-chromium-base metal, an iron-nickel-base metal, or an iron-carbon-base metal, and the conductive metal plating may be either copper plating or copper plating using nickel as a substrate.

The circuit member for a semiconductor device may be constructed so that a plurality of semiconductor elements can be mounted.

The expression "only the external terminal section in the circuit section has been formed directly on one side of the conductive substrate by plating" used herein connotes the case where one side of the conductive substrate has been oxidized or coated with a thin release layer of stearic acid or the like followed by electroplating of the oxidized or coated side. Likewise, the expression "insulating epoxy resin layer provided directly on the conductive substrate" used herein connotes the case where one side of the conductive substrate has been oxidized or coated with a thin release layer of stearic acid or the like followed by provision of an insulating epoxy resin layer provided on the oxidized or coated surface.

Still another process for producing a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, a plurality of sets of the lead and the external terminal section integrally connected to each other being provided independently of each other, the external terminal section in the circuit section having been formed directly on one side of the conductive substrate by electroplating, the lead in the circuit section having been formed on an insulating epoxy resin layer, the insulating epoxy resin layer having been provided directly on the conductive substrate excluding the external terminal section forming area by transfer molding, according to the present invention, is characterized by comprising, in sequence, at least the steps of: (a) surface-treating one side of the conductive substrate to provide irregularities thereon; (b) subjecting the conductive substrate on its one side with irregularities provided thereon to release treatment for imparting releasability; (c) providing an insulating epoxy resin layer by transfer molding on the conductive substrate in its one side subjected to the surface treatment and the release treatment so as to expose only the external terminal section forming area; (d) electroplating the conductive substrate on its exposed area, not covered with the insulating epoxy resin layer, with a conductive metal to a plating thickness approximately equal to the thickness of the insulating epoxy resin layer; (e) coating an insulating resist on the surface of the plating and exposing only a circuit section forming area to prepare a plate; and (f) imparting electrical conductivity to only the exposed area, where a circuit section is to be formed, by plating or coating of a conductive paint or the like to form a circuit section.

Still another process for producing a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, a plurality of sets of the lead and the external terminal section integrally connected to each other being provided independently of each other, the external terminal section in the circuit section having been formed directly on one side of the conductive substrate by electroplating, the lead in the circuit section having been formed on an insulating epoxy resin layer, the insulating epoxy resin layer having been provided directly on the conductive substrate excluding the external terminal section forming area by transfer molding, according to the present invention, is characterized by comprising, in sequence, at least the steps of: (g) surface-treating one side of the conductive substrate to provide irregularities thereon; (h) subjecting the conductive substrate on its one side with irregularities provided thereon to release treatment for imparting releasability; (i) providing an insulating epoxy resin layer by transfer molding on the conductive substrate in its one side subjected to the surface treatment and the release treatment so as to expose only the external terminal section forming area; (j) subjecting the conductive substrate on its exposed area, not covered with the insulating epoxy resin layer, to first plating with a conductive metal by electroplating to a plating thickness approximately equal to the thickness of the insulating epoxy resin layer; (k) subjecting the whole surface of the first plating to second plating either by electroless plating alone or by electroless plating followed by electroplating, thereby forming a plating of a conductive metal on the whole surface of the first plating; (l) coating an insulating resist on the surface of the electroless plating and preparing a plate in such a manner that only an area, where a circuit section is to be formed, is covered; and (m) etching the electroless plating using the resist as an etching-resistant mask.

In the above process for producing a circuit member for a semiconductor device, preferably, the step of forming a jig hole for registration is carried out before the preparation of the plate.

In the above process for producing a circuit member for a semiconductor device, preferably, the surface treatment is sand blasting.

In the above process for producing a circuit member for a semiconductor device, preferably, the release treatment is a treatment for forming an oxide film on the surface of the conductive substrate.

In the above process for producing a circuit member for a semiconductor device, preferably, the conductive substrate is made of an iron-nickel-chromium-base metal, an iron-chromium-base metal, an iron-nickel-base metal, or an iron-carbon-base metal and the conductive metal plating in the step of the first plating is either copper plating or copper plating using nickel as a substrate and the conductive metal plating in the step of the second plating is copper plating.

Also in this case, the expression "only the external terminal section in the circuit section has been formed directly on one side of the conductive substrate by plating" used herein connotes the case where one side of the conductive substrate has been oxidized or coated with a thin release layer of stearic acid or the like followed by electroplating of the oxidized or coated side. Likewise, the expression "insulating epoxy resin layer provided directly on the conductive substrate" used herein connotes the case where one side of the conductive substrate has been oxidized or coated with a thin release layer of stearic acid or the like followed by provision of an insulating epoxy resin layer provided on the oxidized or coated surface.

Still another process for producing a semiconductor device using a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, a plurality of sets of the lead and the external terminal section integrally connected to each other being provided independently of each other, only the external terminal section in the circuit section having been formed directly on one side of the conductive substrate by plating with the other sections in the circuit section having been formed through an insulating epoxy resin layer provided by transfer molding, according to the present invention, is characterized by comprising, in sequence, at least the steps of: (i) mounting a semiconductor element, with the terminal facing upward, on a circuit section provided on a conductive substrate and wire-bonding the terminal of the semiconductor element to a lead; (ii) subjecting one side of the lead section, for a semiconductor device, to plastic molding so as to cover the semiconductor element, the wire, and the circuit section of the lead member for a semiconductor device in their entirety; and (iii) removing the conductive substrate in the lead member for a semiconductor device.

The above process for producing a semiconductor device preferably further comprises, after the step of removing the substrate, (iv) the step of attaching a solder ball to the exposed external terminal section.

The still another circuit member for a semiconductor device according to the present invention, by virtue of the above constitution, can cope with a tendency toward a further increase in the number of terminals and is excellent in productivity and cost as well as in quality.

Specifically, this is attained by a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, a plurality of sets of the lead and the external terminal section integrally connected to each other being provided independently of each other, the external terminal section in the circuit section having been formed directly on one side of the conductive substrate by electroplating, the lead in the circuit section having been formed on an insulating epoxy resin layer, the insulating epoxy resin layer having been provided directly on the conductive substrate excluding the external terminal section forming area by transfer molding.

Surface treatment for creating irregularities on the conductive substrate in its surface having a circuit member and release treatment for imparting releasability to the surface having irregularities facilitate the separation of the conductive substrate in the production of a semiconductor device.

Figure 26:
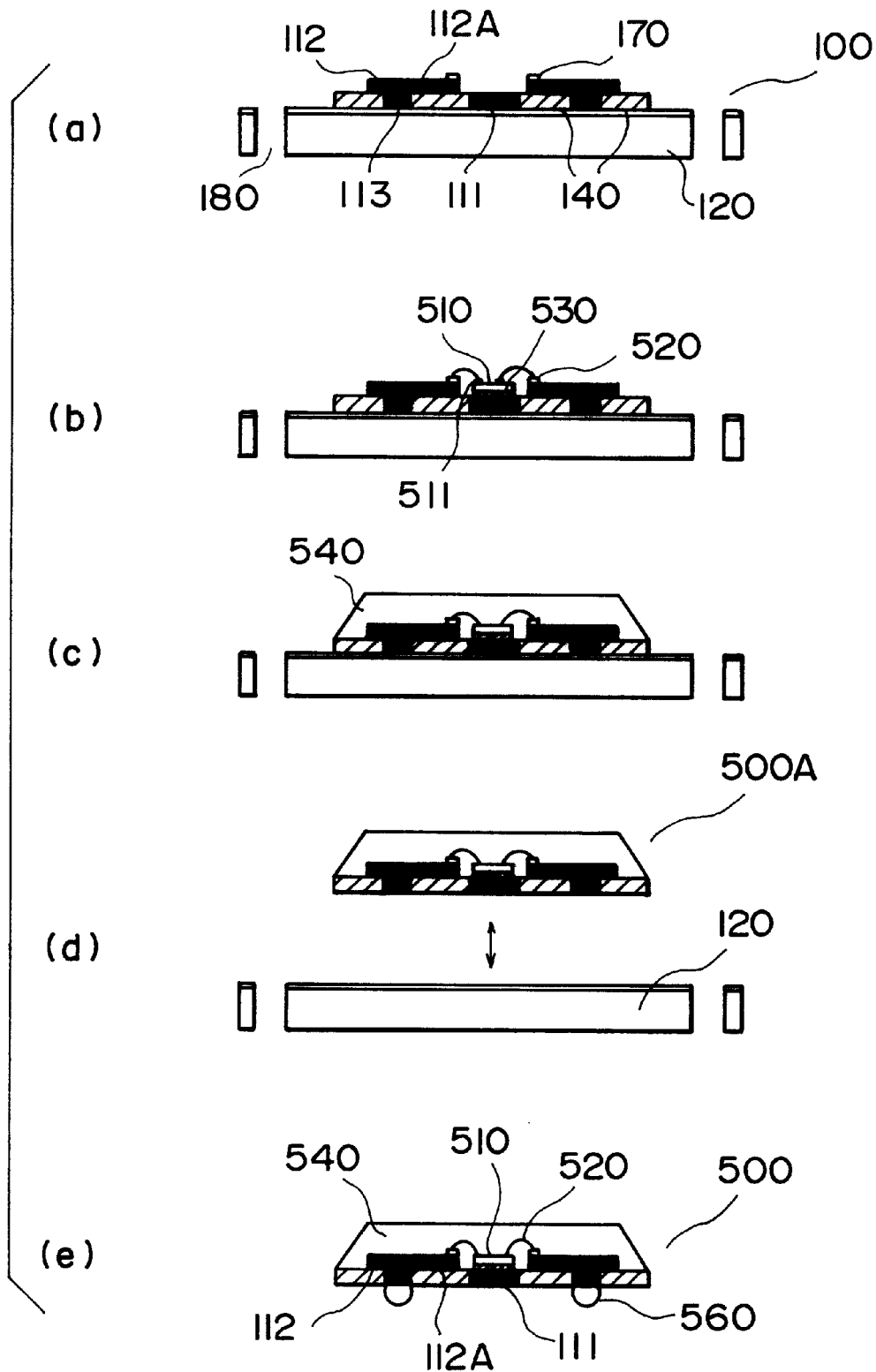
FIG. 26 is a process diagram showing a process for producing a semiconductor device of Example C4 of the present invention.
Figure 27:
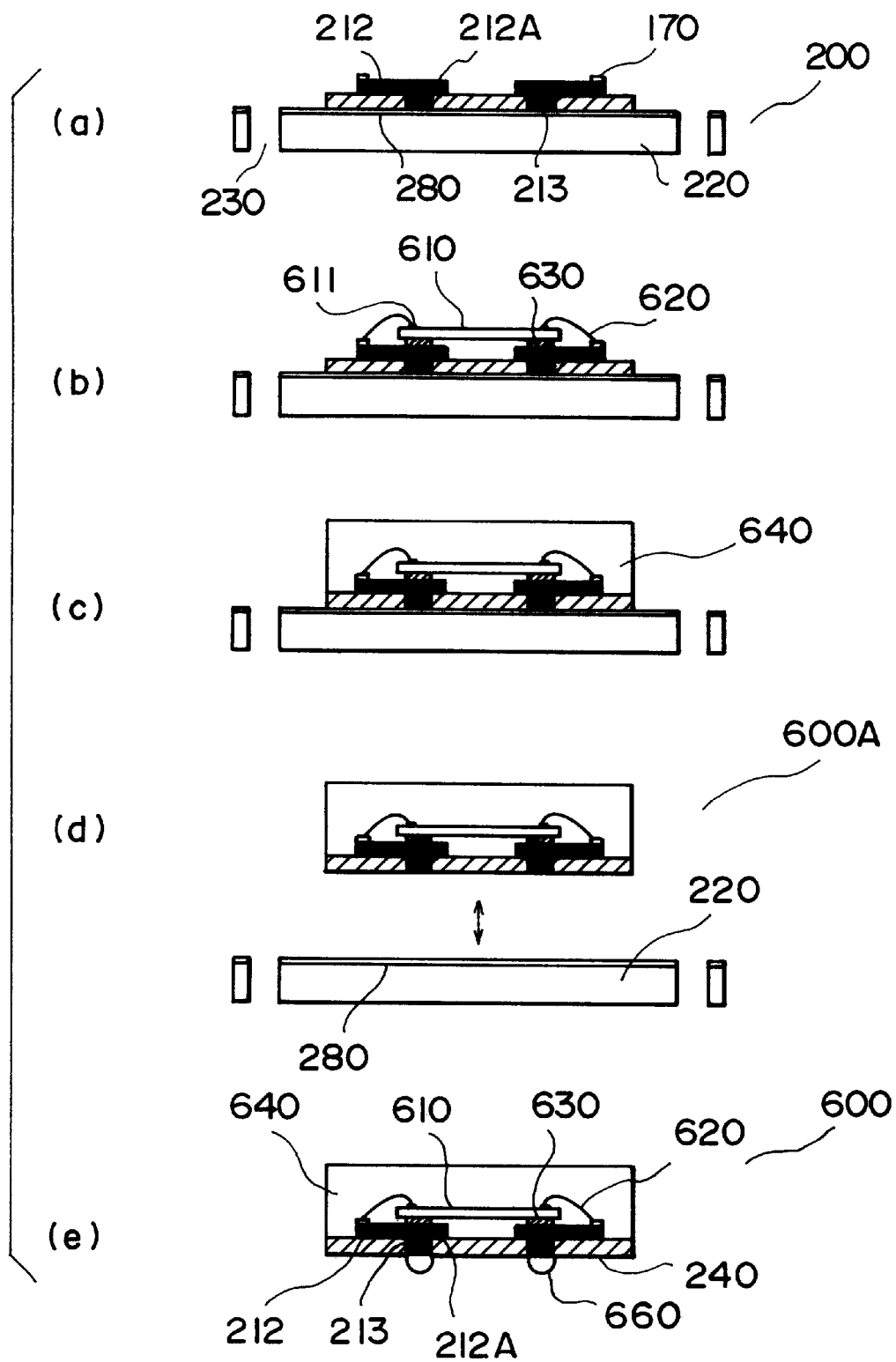
FIG. 27 is a process diagram showing a process for producing a semiconductor device of Example C5 of the present invention.

Further, as shown in FIGS. 26 and 27, in the production of a semiconductor device, mere separation of the conductive substrate permits the preparation of a solder ball external electrode, simplifying the process for producing a semiconductor device.

Furthermore, the preparation of the lead section in the circuit section by plating permits the whole circuit to be made fine.

Furthermore, when the circuit member is constructed so that a plurality of semiconductor elements can be mounted, it can be applied also to a multi-chip type semiconductor device. Further, it is applicable to CSP.

The still another process for producing a circuit member for a semiconductor device according to the present invention, by virtue of the above constitution, can cope with a tendency toward a further increase in the number of terminals and is excellent in productivity and cost as well as in quality.

Specifically, the formation of a circuit section using a conductive metal provided by plating on the conductive substrate can realize a fine circuit section without creating significant deformation and with an excellent accuracy.

Surface treatment for creating irregularities on the conductive substrate in its one surface and release treatment for imparting releasability result in improved treatability (separability of the conductive substrate) in the production of a semiconductor device.

For example, in the production of a semiconductor device in such a manner that a semiconductor element is mounted through an insulating adhesive tape on a lead of a conductive metal provided by plating on the conductive substrate, wire bonding is performed, and the semiconductor element side alone is then molded, an advantage can be provided that the circuit section can withstand the pressure and the like created by the molding resin during the plastic molding, the conductive substrate can be surely adhered to the conductive metal provided by the plating, and, at the same time, after the molding, the whole semiconductor device can be easily separated from the conductive substrate. This is because the surface treatment for creating surface irregularities permits the conductive metal provided by plating to be formed on the conductive substrate so as to have high resistance to transverse force and, in addition, the release treatment offers good releasability by perpendicular force.

When the step of preparing a jig hole for registration is provided before the step of preparing a plate, the plate preparation accuracy can be ensured.

An example of the release treatment is oxidation treatment wherein the surface of the conductive substrate is oxidized with a chromic acid or the like to form an oxide film which inhibits a metallic bond between the conductive metal provided by plating and the conductive substrate. Sand blasting is an example of the surface treatment. Further, it is also possible to use a brushing method wherein a mixture of abrasive grains with a liquid is allowed to collide against the object to be treated.

When the conductive substrate is made of an iron-nickel-chromium-base metal or an iron-chromium-base metal and the conductive metal plating is either copper plating or copper plating using nickel as a substrate, the above surface treatment for creating surface irregularities and the release treatment for imparting the releasability become more effective.

Still another process for producing a semiconductor device, by virtue of the above constitution, can cope with a demand for multiple terminals and, at the same time, can surely produce a semiconductor device having good quality.

D. A further circuit member for a semiconductor device according to the present invention is characterized by comprising: a conductive substrate; and a circuit section and the like at least two-dimensionally formed using a conductive metal layer provided by plating on the conductive substrate, at least a part of the circuit section having been provided directly on one side of the conductive substrate by plating, said conductive substrate on its one side having a circuit section being provided with a separating metal plating serving to separate the conductive substrate from the circuit section in the production of a semiconductor device.

In the above circuit member for a semiconductor device, preferably, the circuit section comprises at least a lead for electrical connection to a semiconductor element and an external terminal section for electrical connection to an external circuit, a plurality of sets of the lead and the external terminal section integrally connected to each other are provided independently of each other and at least a part of the circuit section has been provided directly on one side of the conductive substrate by plating, or preferably, the external terminal section in the circuit section has been formed directly on the conductive substrate by plating and the lead in the circuit section has been formed on an insulating layer provided directly on the conductive substrate excluding the external terminal section forming area.

Further, in the above circuit member for a semiconductor device, preferably, the circuit section comprises a plurality of external terminal sections, for electrical connection to an external circuit, provided independently of each other and the external terminal sections have been formed directly on one side of the conductive substrate by plating, or preferably, the external terminal sections in the circuit section have been formed in such a manner that the cross section perpendicular to the substrate face has an approximately U shape, or preferably, the external terminal section comprises a laminated plating of palladium, nickel, silver, and gold or a plating of an alloy of said metals, or preferably, the separating metal plating is a metal plating selected from the group consisting of copper, nickel, chromium, zinc, and a group of alloys of said metals.

Furthermore, in the above circuit member for a semiconductor device, the circuit section and the like have been formed so that a plurality of semiconductor elements are mounted thereon.

Furthermore, in the above circuit member for a semiconductor device, the conductive substrate is made of an iron-nickel-chromium-base metal, an iron-nickel-base metal, or an iron-carbon-base metal.

A further process for producing a circuit member for a semiconductor device, comprising: a conductive substrate; and a circuit section and the like at least two-dimensionally formed using a conductive metal by plating on the conductive substrate, at least a part of the circuit section having been provided directly on one side of the conductive substrate by plating, said conductive substrate on its one side having a circuit section being provided with a separating metal plating serving to separate the conductive substrate from the circuit section in the production of a semiconductor device, according to the present invention, is characterized by comprising, in sequence, using a conductive substrate having a separating metal plating on one side thereof, at least the steps of: (a) coating a resist on one side of the conductive substrate and exposing only an area to be plated with a conductive metal to prepare a plate; and (b) plating the plate on its exposed area with a conductive metal.

A further process for producing a circuit member, for a semiconductor device, comprising: a conductive substrate; and a circuit section and the like at least two-dimensionally formed using a conductive metal by plating on the conductive substrate, at least a part of the circuit section having been provided directly on one side of the conductive substrate by plating, said conductive substrate on its one side having a circuit section being provided with a separating metal plating serving to separate the conductive substrate from the circuit section in the production of a semiconductor device, according to the present invention, is characterized by comprising, in sequence, using a conductive substrate having a separating metal plating on one side thereof, at least the steps of: (d) providing an insulating layer on one side of the conductive substrate so as to expose at least the external terminal section in the circuit section and to cover a lead forming area; (e) electrolessly plating the conductive substrate on its whole surface provided with the insulating layer to form a first conductive layer, thereby covering said whole surface; (f) providing a resist so as to expose an external terminal section forming area and a lead section forming area in the circuit section of the conductive substrate on its side provided with the first conductive layer; (g) plating the exposed area to form a second conductive layer, thereby simultaneously forming the external terminal section and the lead section; (h) separating and removing the resist alone; and (i) removing the exposed first conductive layer by etching.

In the above process for producing a circuit member for a semiconductor device, the first conductive layer is provided by electroless nickel plating and the second conductive layer comprises a gold layer, a copper layer, a nickel layer, and a gold layer provided in that order by electroplating on the first conductive layer.

A further process for producing a circuit member, for a semiconductor device, comprising: a conductive substrate; and a circuit section and the like at least two-dimensionally formed using a conductive metal by plating on the conductive substrate, at least a part of the circuit section having been provided directly on one side of the conductive substrate by plating, said conductive substrate on its one side having a circuit section being provided with a separating metal plating serving to separate the conductive substrate from the circuit section in the production of a semiconductor device, according to the present invention, is characterized by comprising, in sequence, using a conductive substrate having a separating metal plating on one side thereof, at least the steps of: (k) providing an insulating layer on one side of the conductive substrate so as to expose at least the external terminal section in the circuit section and to cover a lead forming area; (l) covering the conductive substrate on its whole surface, provided with the insulating layer, with a resist, subjecting the surface of the resist to water repellent treatment, and treating the resist so as to expose the external terminal section forming area and the lead forming section in the circuit section of the conductive substrate; (m) providing and activating a catalyst and then providing a first conductive layer by electroless plating on the exposed areas; (n) providing a second conductive layer by electroplating on the first conductive layer to simultaneously form an external terminal section and a lead section; and (o) separating and removing the resist alone.

In the above process for producing a circuit member for a semiconductor device, preferably, the first conductive layer is provided by electroless nickel plating and the second conductive layer comprises a gold layer, a copper layer, a nickel layer, and a gold layer provided in that order by electroplating on the first conductive layer.

Further, in the above process for producing a circuit member for a semiconductor device, preferably, the circuit section comprises a plurality of external terminal sections, for electrical connection to an external circuit, provided independently of each other and the external terminal sections are formed directly on one side of the conductive substrate by plating.

Furthermore, in the above process for producing a circuit member, preferably, the step of forming a jig hole for registration is carried out at lest before the preparation of the plate.

A further process for producing a semiconductor device using a circuit member, for a semiconductor device, comprising: a conductive substrate; and a circuit section and the like at least two-dimensionally formed using a conductive metal by plating on the conductive substrate, at least a part of the circuit section having been provided directly on one side of the conductive substrate by plating, said conductive substrate on its one side having a circuit section being provided with a separating metal plating serving to separate the conductive substrate from the circuit section in the production of a semiconductor device, according to the present invention, is characterized by comprising, in sequence, at least the steps of: (A) conducting die attachment by mounting a semiconductor element on the circuit member for a semiconductor device in its place excluding an external terminal section area; (B) wire-bonding the terminal of the semiconductor element to the circuit section to electrically connect the terminal of the semiconductor element to the external terminal section; (C) subjecting one side of the circuit member for a semiconductor device to plastic molding so as to cover the semiconductor element, the wire, and the circuit section in their entirety; and (D) dissolving and removing the separating metal plating section in the conductive substrate to separate the conductive substrate alone.

In the above process for producing a semiconductor device, preferably, the circuit section in the circuit member for a semiconductor device comprises a plurality of external terminal sections, for electrical connection to an external circuit, provided independently of each other and the external terminal sections are formed directly on one side of the conductive substrate by plating.

The above process for producing a semiconductor device preferably further comprises, after the step of removing the conductive substrate, (e) the step of attaching a solder ball to the exposed external terminal section.

The further circuit member for a semiconductor device according to the present invention, by virtue of the above constitution, can cope with a demand for a further increase in number of terminals, is excellent in productivity and quality, and can provide a semiconductor device which, as compared with TSOP and the like, can realize a smaller size, and a circuit member used therefor.

Specifically, this is attained by a circuit member for a semiconductor device, wherein at least a part of the circuit section has been provided directly on one side of the conductive substrate by plating and the conductive substrate on its one side having a circuit section is provided with a separating metal plating serving to separate the conductive substrate from the circuit section in the production of a semiconductor device.

The circuit section may have a structure for BGA (ball grid array) or a COL (chip on lead) structure which comprises at least a lead for electrical connection to a semiconductor element and an external terminal section for electrical connection to an external circuit, a plurality of sets of the lead and the external terminal section integrally connected to each other being provided independently of each other, at least a part of the circuit section having been provided directly on one side of the conductive substrate by plating. Alternatively, the circuit section may comprise a plurality of external terminal sections, for electrical connection to an external circuit, provided independently of each other, the external terminal sections having been formed directly on one side of the conductive substrate by plating.

Figure 10:
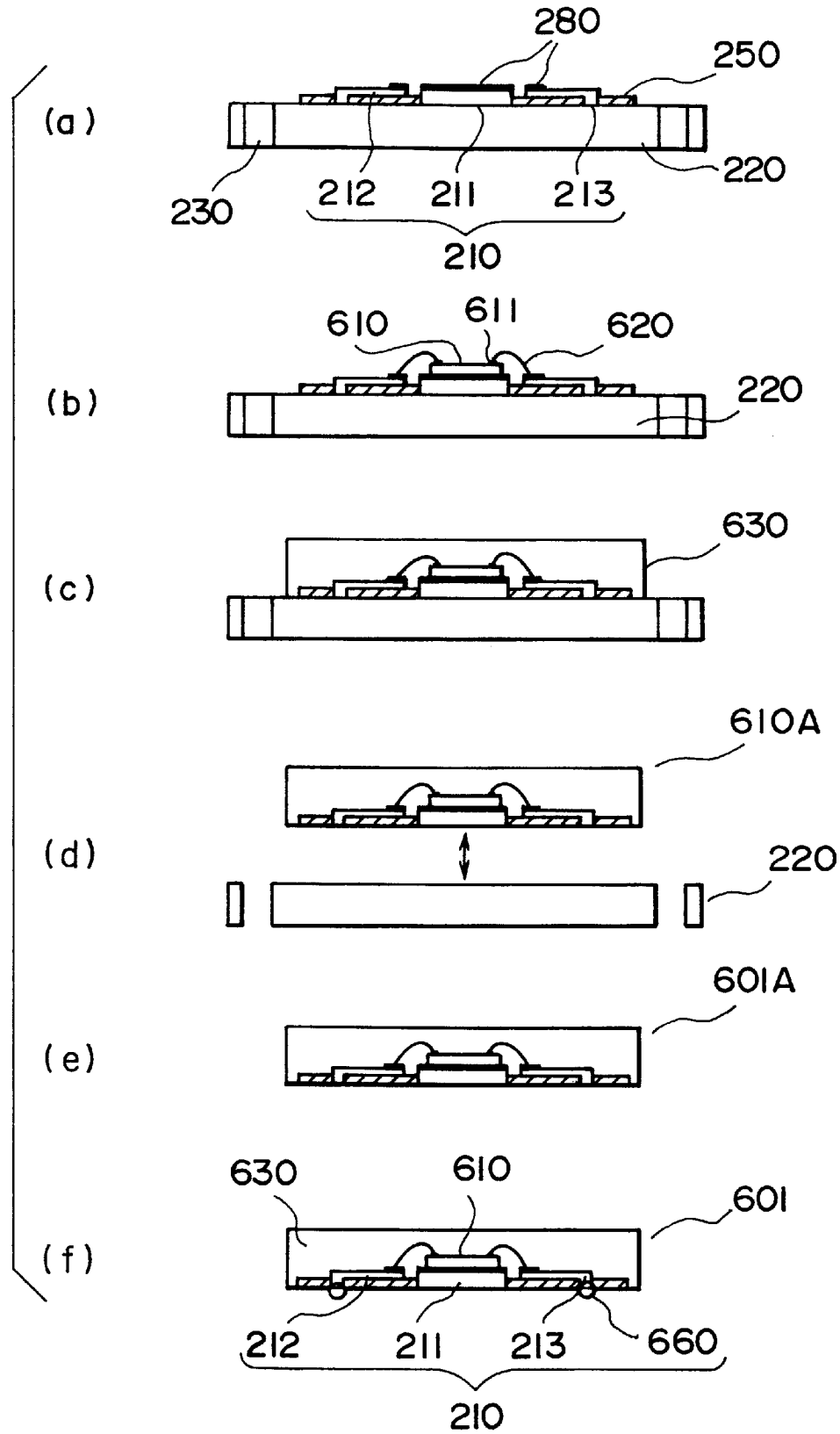
FIG. 10 is a process diagram showing a process for producing a semiconductor device of Example A8 of the present invention.

Further, as shown in FIG. 10, in the process for producing a semiconductor device, a solder ball external electrode can be produced by simply separating and removing the conductive substrate, thus simplifying the process for producing a semiconductor device.

Furthermore, when the circuit section is for BGA (ball grid array) or COL (chip on lead), the preparation of the lead section in the circuit by plating enables the whole circuit to be finely fabricated.

The construction of the circuit member in such a manner that a plurality of semiconductor elements can be mounted enables the circuit member to be applied to a multi-chip type semiconductor device. Further, it is applicable to CSP.

In the conventional lead frame member shown in FIG. 41c, when a lead frame prepared by finely fabricating an inner lead is used, a complicate process is necessary such that, as shown in FIG. 41a, etching is performed in such a state that a connecting section 917 for connecting inner leads among one another to fix them, an inner lead fixing tape 960 is then applied (FIG. 41b) and the connecting section 917 is removed. Further, when the conventional lead frame member shown in FIG. 41c is used to produce a semiconductor device, as shown in FIG. 42, plastic molding of a supporting lead 915 for supporting an external terminal section 913 followed by removal of the dam bar (frame section) 914 by pressing is necessary. This poses problems of productivity and cost. By contrast, the circuit member, for a semiconductor device, wherein the circuit member is for BGA (ball grid array) or COL (chip on lead), can solve these problems because a plurality of sets of a lead and an external terminal section integrally connected to each other are provided independently of each other.

The further circuit member for a semiconductor device according to the present invention comprises a plurality of external terminal sections, for electrical connection to an external circuit, provided independently of each other. Further, the external terminal section is formed directly on one side of the conductive substrate by plating and, as compared with TSOP and the like, can realize a smaller size of the semiconductor device and can increase the degree of freedom in the design of a chip. Further, an improvement in adhesion to the molding resin can be expected by forming the external terminal sections in the circuit section in such a manner that the cross section perpendicular to the substrate face has an approximately U shape.

The further process for producing a circuit member according to the present invention, by virtue of the above construction, can cope with a demand for a further increase in number of terminals, is excellent in productivity and quality, and can provide a semiconductor device which, as compared with TSOP and the like, can realize the production of a package having a smaller size and better mounting.

Specifically, the formation of a circuit section using a conductive metal provided by plating on the conductive substrate can realize a fine circuit section without creating significant deformation and with an excellent accuracy. Further, provision of a plating, for separation, on the conductive substrate permits the conductive substrate to be relatively easily separated from a semiconductor device in the production of a semiconductor device.

When the step of preparing a jig hole for registration is provided before the step of preparing a plate, the plate preparation accuracy can be ensured.

The further process for producing a semiconductor device, by virtue of the above constitution, can cope with a demand for multiple terminals and, at the same time, can surely produce a semiconductor device having good quality.

At the same time, the production of a package having a smaller size than TSOP and the like can be realized, and the freedom in chip design can be increased.

The further semiconductor device according to the present invention is one produced using the circuit member for a semiconductor device according to the present invention by the process for producing a semiconductor device according to the present invention. This process is simplified in its entirety and hence is advantageous in productivity as well as in cost and can realize the production of a BGA type or COL type plastic molded semiconductor device which can cope with a demand for a further increase in number of terminals. At the same time, a package having a smaller size than TSOP and the like can be provided.

Furthermore, a multi-chip semiconductor device with a plurality of semiconductor elements mounted thereon and CSP (chip scale package) can be provided.

Furthermore, it is needless to say that, unlike the conventional BGA using a printed board as shown in FIG. 39, the semiconductor device of the present invention requires no complicate production process and poses no problem of the moisture resistance.

EXAMPLES

Examples of the circuit member for a semiconductor device, the process for producing a circuit member for a semiconductor device, the process for producing a semiconductor device, and the semiconductor device according to the present invention will be described in more detail with reference to the accompanying drawings.

Example A1

Figure 1A:
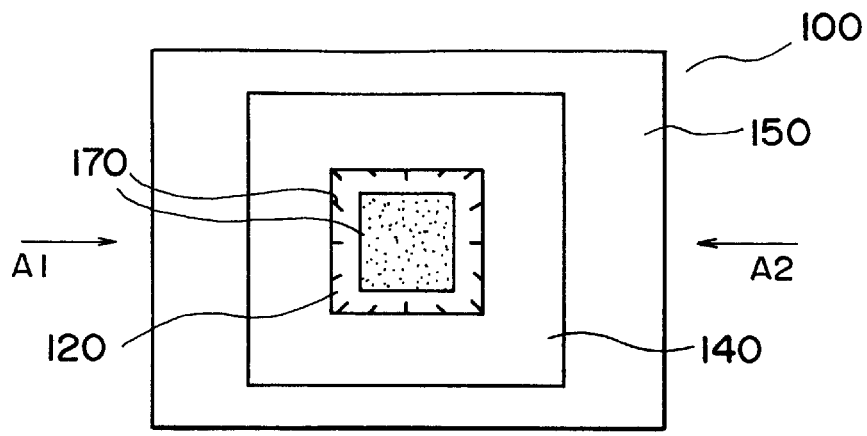
FIGS. 1a–1c are schematic diagrams showing a circuit member for a semiconductor device of Example A1 of the present invention.
Figure 1B:
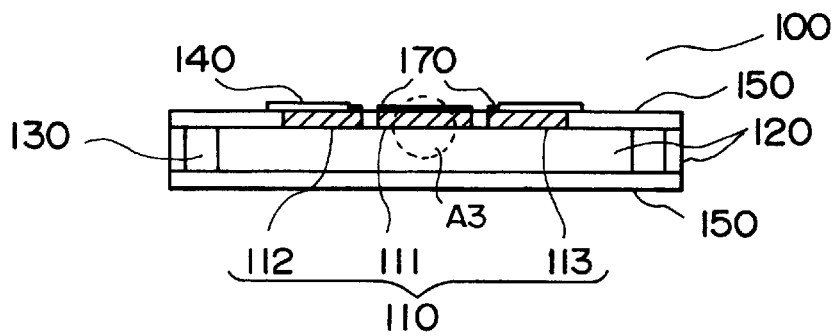
Figure 1C:
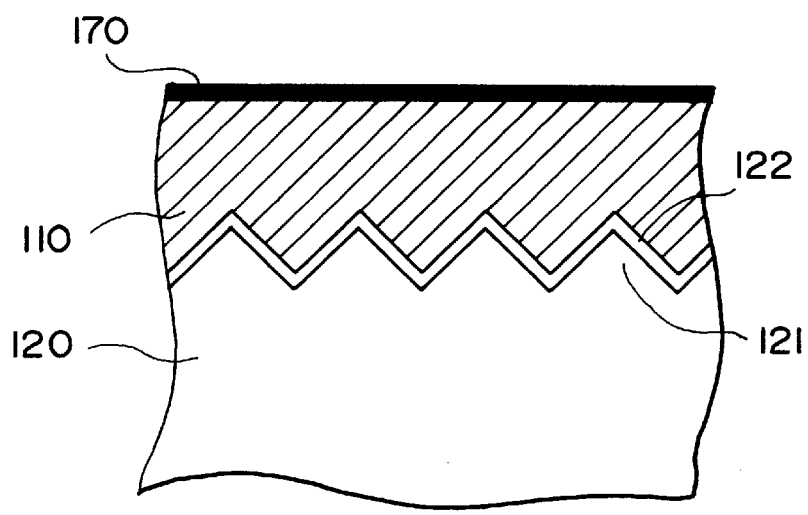

FIG. 1a is a simplified plan view of a circuit member for a semiconductor device of Example A1, FIG. 1b a cross-sectional view taken on line A1–A2 of FIG. 1a, and FIG. 1c an enlarged cross-sectional view of a portion A3 of FIG. 1a.

Figure 2A:
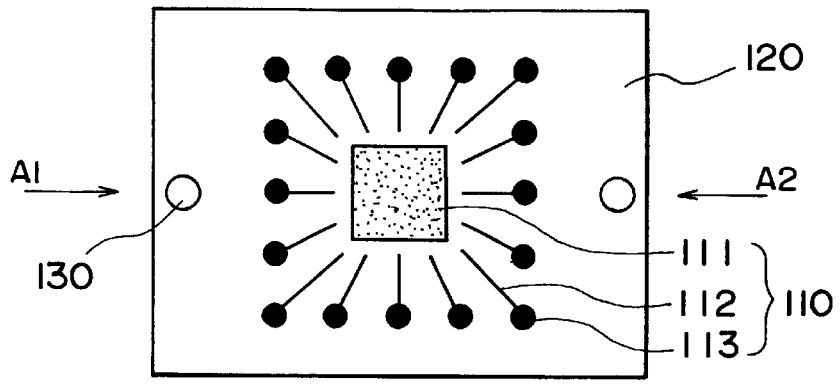
FIGS. 2a–2c are plan views showing a part of a circuit section in a circuit member for a semiconductor device of Example A1 of the present invention.
Figure 2B:
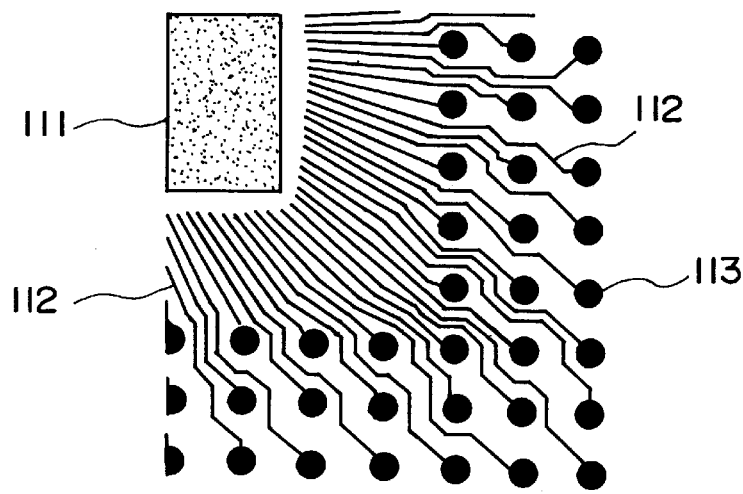
Figure 2C:
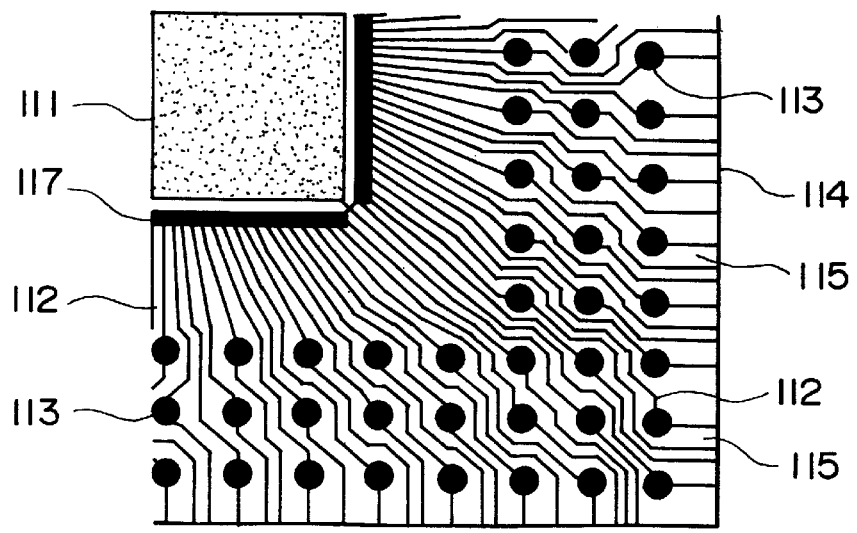

FIG. 2a is a developed, simplified plan view of a circuit section 110 and a conductive substrate 120 alone in FIG. 1, wherein inner leads and external terminal sections are shown in a reduced number for simplifying the whole. FIG. 2b is an enlarged view of about one-fourth of the circuit section shown in FIG. 2a. FIG. 2c is an enlarged view of about one-fourth of a lead frame (a circuit member) used in a BGA type semiconductor device shown in FIG. 40 below. FIG. 3 is a diagram showing a variant of Example A1.

In FIGS. 1, 2, and 3, numerals 100, 100A, and 100B each designate a circuit member for a semiconductor device, numeral 110 a circuit section, numeral 111 a die pad, numeral 112 a lead, numeral 113 an eternal terminal section, numeral 114 a dam bar (a frame section), numeral 115 a supporting lead, numeral 117 a connecting section, numeral 120 a conductive substrate, numeral 130 a jig hole, numeral 140 a plating resist, numeral 150 a photosensitive resist, and numeral 170 a silver plating.

The circuit member 100 for a semiconductor device in Example A1 is a circuit member for a BGA type, plastic molded type semiconductor device and, as shown in FIG. 1, comprises a conductive substrate 120, made of stainless steel (SUS 430), and a circuit section 110 comprising a conductive copper material provided by plating on the conductive substrate 120. It has a photosensitive resist 150 prepared for the formation of the circuit section 110, a solder resist 140 for providing a silver plating 170 in a predetermined area, and a jig hole 130 for ensuring the positional accuracy in the course of the preparation.

In the circuit member 100 for a semiconductor device in this state, a semiconductor element is mounted on the circuit section 110 side of the conductive substrate 120, the semiconductor element mounted side alone is molded using a molding resin to prepare a semiconductor device on the conductive substrate 120, and the conductive substrate 120 is removed to prepare a semiconductor device.

The circuit section 110 comprises a die pad 111 for mounting a semiconductor element thereon, a lead 112, and an external terminal section 113 integrally connected to the lead 112, and a plurality of sets of the lead 112 and the external terminal section 113 are provided independently of each other and arranged in a two dimensional form along the face of the circuit section 110.

The external terminal section 113 functions to perform electrical connection to an external circuit, and, in the preparation of a BGA type semiconductor device, a solder ball is provided in this section.

As shown in FIG. 1c, irregularities are provided by sand blasting on the conductive substrate 120, made of 0.1 mm-thick stainless steel (SUS 430), in its side where the circuit section 110 is to be formed. Further, an oxide film is provided on the surface of the irregularities. In the preparation of a semiconductor device, molding of only the circuit section 110 with the semiconductor element provided thereon can permit the adhesion between the conductive substrate 120 and the circuit section 110 to be maintained and facilitates the removal of the whole semiconductor device, after molding, from the conductive substrate 120.

As shown in FIG. 1c, the circuit section 110 is a circuit member for a BGA type semiconductor device made of copper provided by plating. In the present example, since the circuit section 110 is fixed onto the conductive substrate 120, there is no need to use a connecting section 117, integrally connected to inner leads, for fixing the inner leads to one another, a supporting lead 115 for fixing the external terminal section, and a dam bar (frame) 114 which have been necessary in the lead frame (circuit member), shown in FIG. 2c used in the conventional BGA type semiconductor device shown in FIG. 39.

In the present example, the thickness of the circuit section 110 is as small as 40 μm, and the pitch of the lead 112 in its front end is as small as 0.12 mm. This construction can cope with a tendency toward the adoption of a multi-terminal of semiconductor devices.

A variant of Example A1 is shown in FIG. 3.

A circuit member 100A, for a semiconductor device, shown in FIG. 3a is a variant 1 and shown in such a state that the plating resist 140 and the photosensitive resist 150 have been removed in the circuit member 100 for a semiconductor device of Example 1. In this state, a semiconductor element is mounted on the circuit 110 side of the conductive substrate 120, the semiconductor element mounted side alone is molded using a molding resin to prepare a semiconductor device on the conductor substrate 120, and the conductive substrate 120 is removed to prepare a semiconductor device.

A circuit member 100B, for a semiconductor device, shown in FIG. 3b is a variant 2 where, in the circuit member 100 for a semiconductor device of Example A1, no photosensitive resist 150 is provided. In this state, a semiconductor element is mounted on the circuit 110 side of the conductive substrate 120, the semiconductor element mounted side alone is molded using a molding resin to prepare a semiconductor device on the conductive substrate 120, and the conductive substrate 120 is removed to prepare a semiconductor device.

Example A2

Figure 4A:
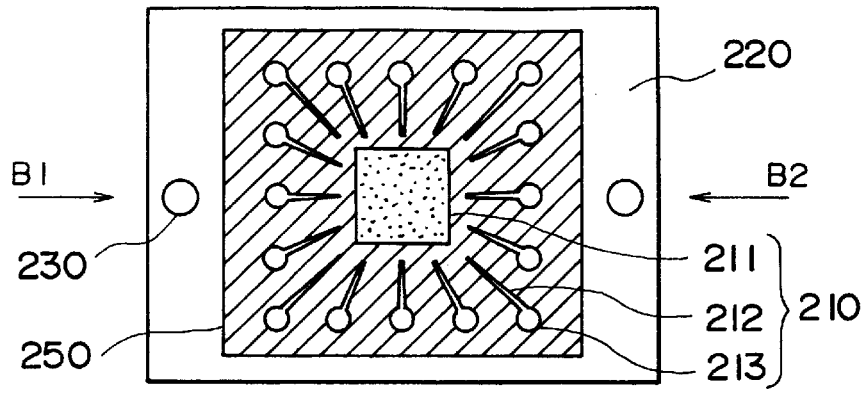
FIGS. 4a–4c are schematic views showing a circuit member for a semiconductor device of Example A2 of the present invention.
Figure 4B:
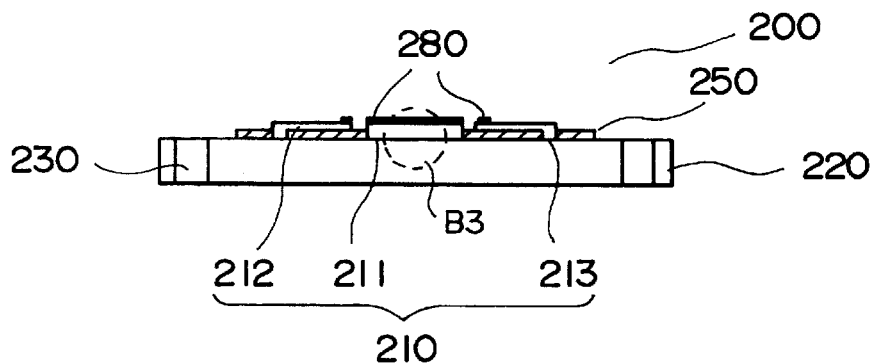
Figure 4C:
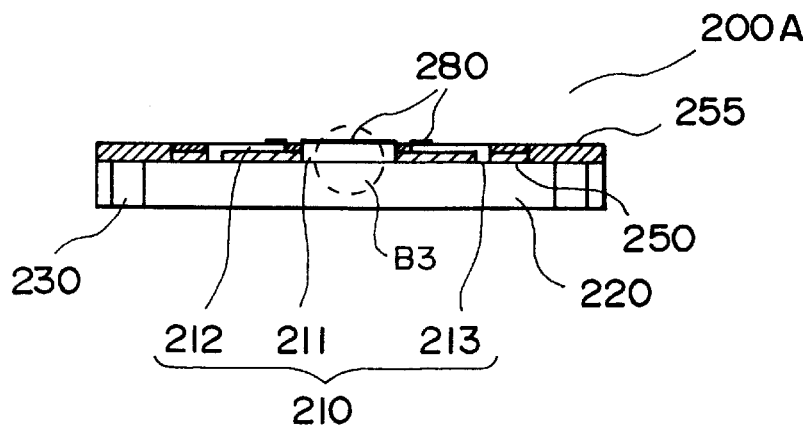

FIG. 4a is a plan view of a circuit member for a semiconductor device of Example A2, FIG. 4b a cross-sectional view taken on line B1–B2 of FIG. 4a, and FIG. 4c a diagram showing a variant of Example A2.

In the circuit member for a semiconductor device of the present example, the planar form of the circuit section 210 and the conductive substrate 220 is the same as described above in connection with the circuit member for a semiconductor device of Example A1 shown in FIG. 2.

In FIG. 4, numeral 200 designates a circuit member for a semiconductor device, numeral 210 a circuit member, numeral 211 a die pad, numeral 212 a lead, numeral 213 an external terminal section, numeral 220 a conductive substrate, numeral 230 a jig hole, numeral 250 a solder resist (an insulating photosensitive resist ), numeral 255 an insulating photosensitive resist, and numeral 280 a silver plating.

As with the circuit member described in Example A1, the circuit member 200 for a semiconductor device is a circuit member for a BGA type, plastic molded type semiconductor device and, as shown in FIG. 4, comprises a conductive substrate 220, made of stainless steel (SUS 430), and a circuit member 210 comprising a conductive copper material provided by plating on the conductive substrate 220. The form of the circuit section 210 is the same as that in Example A1.

Example A2 is characterized in that a solder resist (an insulating photosensitive resist) 250 prepared for the formation of an external terminal section 213 (see the processes shown in FIGS. 8 and 9 described below) is used as such. Further, the structure is such that the preparation of a plate using an insulating photosensitive resist (a solder resist) for a solder ball external electrode and the formation of a solder resist film by screen printing are unnecessary in the preparation of a semiconductor device using a circuit member 200 for a semiconductor device of Example A10 shown in FIG. 11b described below.

Specifically, the solder resist (insulating photosensitive resist) 250 is formed by placing, in the preparation of a semiconductor device, a solder ball external electrode on the semiconductor device forming side and providing a solder resist so as to cover the circumference of the external terminal section 213.

In this connection, it should be noted that, in the circuit member for a semiconductor device of Example A1, the photosensitive resist 150 used for the preparation of a plate for plating of the whole circuit section 110 as such is used as a part of the member.

Also in this example, a conductive substrate 220 made of 0.1 mm-thick stainless steel (SUS 430) is used, and as shown in FIG. 1c, irregularities are created by sand blasting on the substrate 220 in its side where the circuit section 210 is to be formed (a dotted line portion 133 in FIGS. 4b and 4c). Further, an oxide film is provided on the surface of the irregularities. In the preparation of a semiconductor device, molding of only the circuit section 210 with the semiconductor element provided thereon can permit the adhesion between the conductive substrate 220 and the circuit section 210 to be maintained and facilitates the removal of the whole semiconductor device, after molding, from the conductive substrate 220.

As described above, the circuit section 210 is a circuit member for a BGA type semiconductor device made of copper provided by plating. Since the circuit section 210 is fixed onto the conductive substrate 220, there is no need to use a connecting section 117, integrally connected to inner leads, for fixing the inner leads to one another, a supporting lead 115 for fixing the external terminal section, and a dam bar (frame) 114 which have been necessary in the lead frame (circuit member) shown in FIG. 2c used in the conventional BGA type semiconductor device shown in FIG. 39. The thickness of the circuit section 210 is as small as 40 μm, and the pitch of the lead 212 in its frond end is as small as 0.12 mm. This construction can cope with a tendency toward the adoption of a multi-terminal of semiconductor devices.

A variant of Example A2 is shown in FIG. 4c.

A circuit member 200A for a semiconductor device, which is a variant, shown in FIG. 4c is such that, in the circuit member 200, for a semiconductor device, of Example A2 shown in FIG. 4b, an insulating photosensitive resist 255 is provided. This insulating photosensitive resist 255 is an insulating photosensitive resist which has been prepared for the formation of a lead 212 and a die pad 211 by plating in the preparation of the circuit member 200 for a semiconductor device in the process shown in FIGS. 8 and 9 described below and as such is left.

The present variant is the same as Example A2 in that the solder resist (insulating photosensitive resist) 250 prepared for the formation of the external terminal section 213 as such is used. As with the circuit member in Example A2, the circuit member in this example has such a structure that the preparation of a plate using an insulating photosensitive resist (a solder resist) for a solder ball external electrode and the formation of a solder resist film by screen printing are unnecessary in the preparation of a semiconductor device.

Example A3

Example A3 demonstrates a process for producing a circuit member 100 for a semiconductor device of Example A1 shown in FIG. 1 wherein the whole circuit section is directly prepared by plating.

Figure 5:
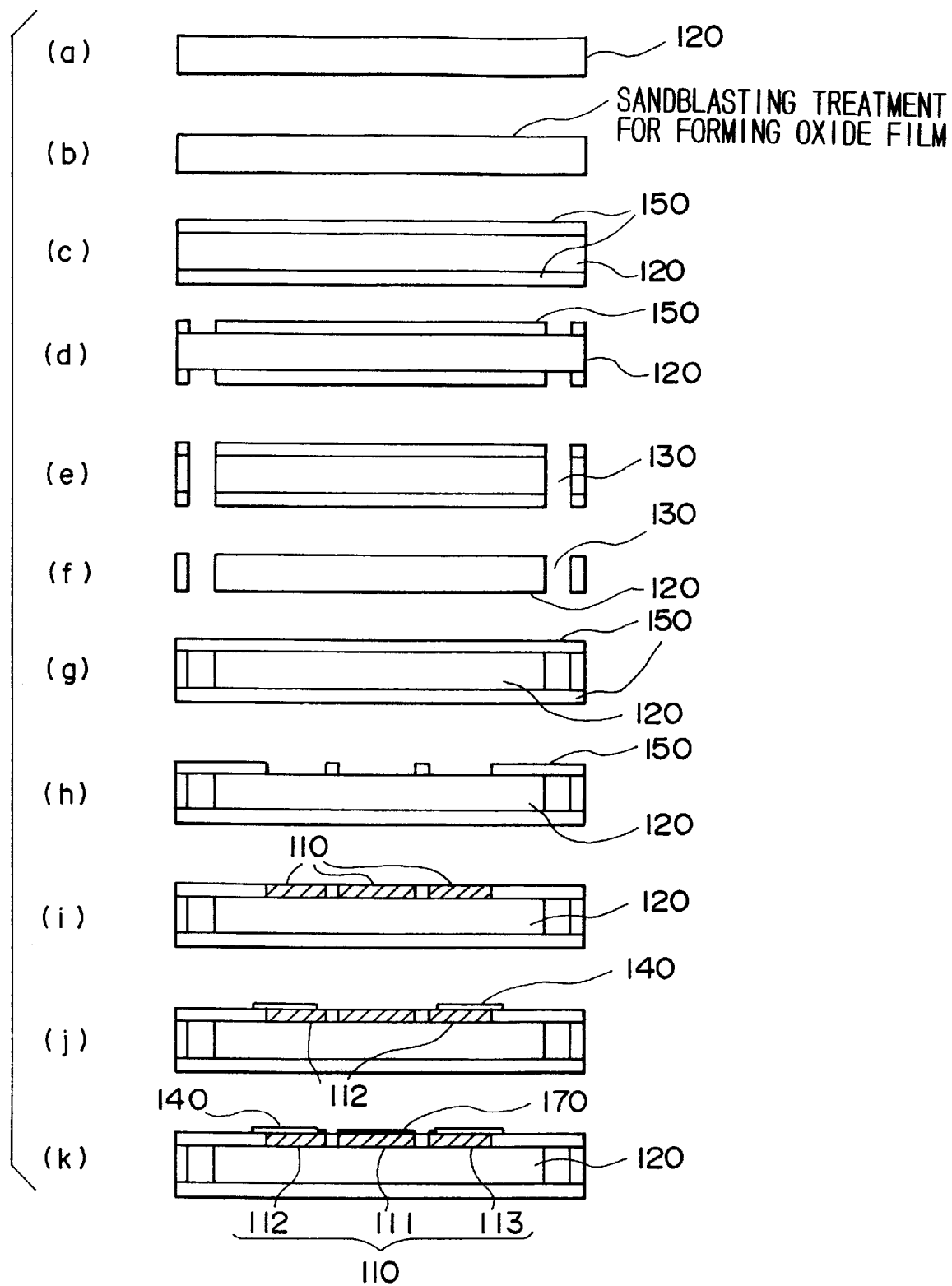
FIG. 5 is a process diagram showing a process for producing a circuit member for a semiconductor device of Example A3 of the present invention.

At the outset, a conductive substrate 120 made of stainless steel (SUS 430) was provided (FIG. 5a). The conductive substrate on its side, where a circuit section is to be formed, was surface treated by sand blasting to create irregularities and then subjected to release treatment wherein the surface was oxidized with a chromic acid solution to form an oxide film, that is, release treatment for facilitating the removal of the conductive metal (copper) formed by plating or the molding resin after plastic packaging from the conductive substrate (FIG. 5b).

Thereafter, in order to prepare a jig hole, for ensuring the registration, in the conductive substrate 120, a photosensitive resist 150 was applied using a dry film resist on both sides of the conductive substrate 120 (FIG. 5c), exposure and development were performed to prepare a plate (FIG. 5d), and a through hole was formed by etching to prepare a jig hole 130 (FIG. 5e).

The dry film resist generally comprises three layers of a film substrate for supporting a resist, a resist, and a protective coat film. The protective coat film is removed, the dry film resist with the resist surface exposed thereon is laminated onto the substrate 120 so that the resist surface faces the surface of the conductive substrate 120, followed by removal of the film substrate to apply the resist on one side of the conductive substrate 120.

Thereafter, the photosensitive resist 150 provided on both sides of the conductive substrate 120 was removed, and the conductive substrate 120 was cleaned (FIG. 5f), and, in order to form a circuit section by plating on the substrate in its side subjected to the surface treatment and release treatment, a photosensitive resist 150 was again applied onto both sides of the conductive substrate 120 using a dry film (FIG. 5g).

The photosensitive resist 150 in its predetermined area alone on the side, where a circuit section is to be formed, was exposed and developed to prepare a plate (FIG. 5h), and the area exposed from the photosensitive resist 150 was plated with copper to prepare a circuit section 110 (FIG. 5i).

The copper plating was performed using the conventional copper plating bath so that the thickness of the circuit section was 40 μm.

A plating resist 140 for designating a plating area in the surface treatment by noble metal plating, such as silver plating, necessary for wire bonding for mounting a semiconductor element and wire bonding for connection of a semiconductor element to a lead 112 was coated onto a predetermine area (FIG. 5j).

The plating resist 140 was coated by screen printing.

The circuit section on its area exposed from the plating resist 140 was plated with silver (surface treatment) to prepare a circuit member 100 for a semiconductor device (FIG. 5k).

In the preparation of the circuit member 100A for a semiconductor device shown in FIG. 3a, the plating resist 140 and the photosensitive resist 150 are then removed.

Example A4

Example A4 demonstrates a process for producing the circuit member 100B for a semiconductor device of the variant 2 of Example A1 shown in FIG. 3b wherein the copper section formed by plating is etched to form a circuit section.

Figure 6:
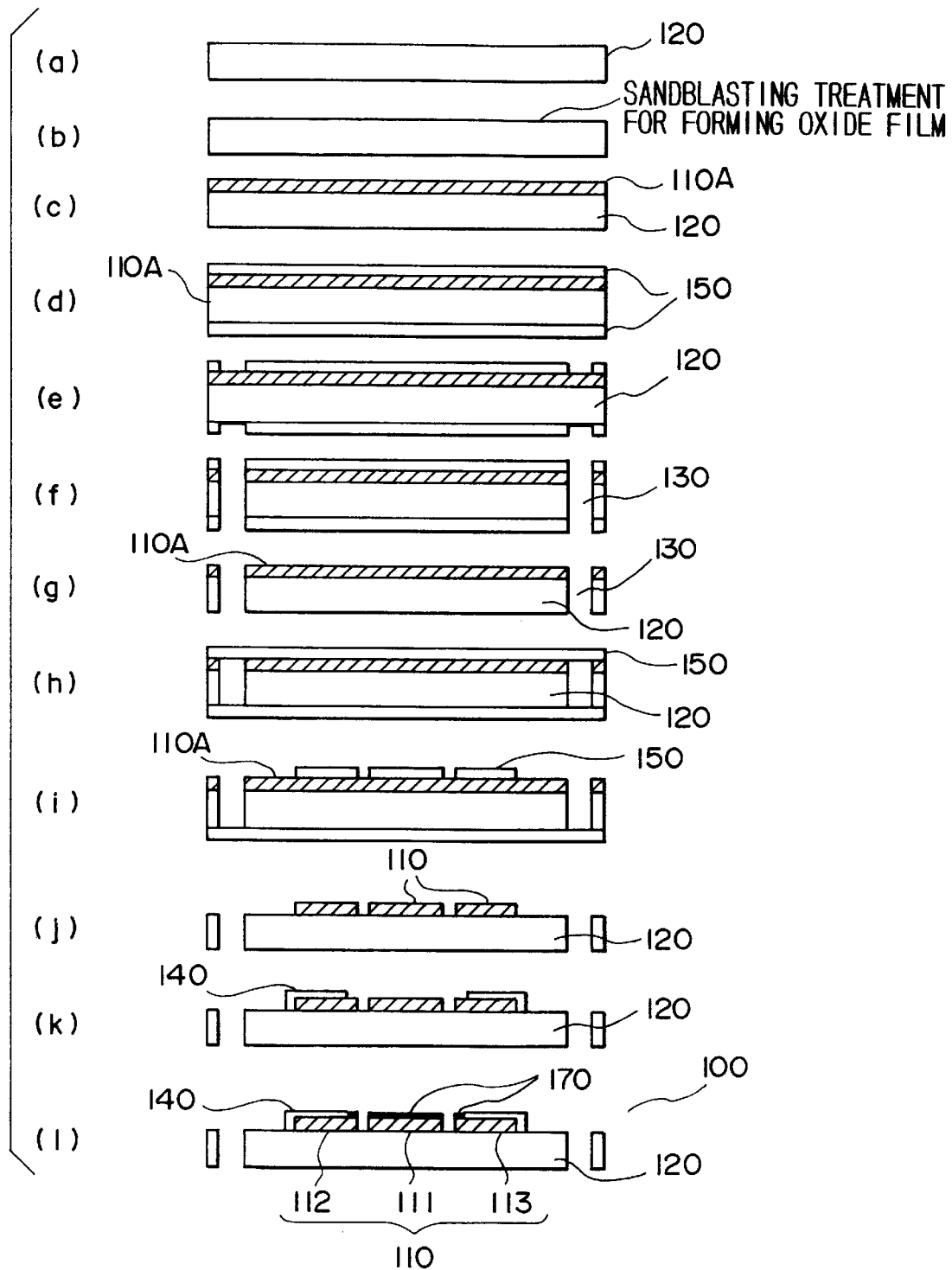
FIG. 6 is a process diagram showing a process for producing a circuit member for a semiconductor device of Example A4 of the present invention.

At the outset, a conductive substrate 120 made of stainless steel (SUS 430) was provided (FIG. 6a). The conductive substrate on its side, where a circuit section is to be formed, was surface treated by sand blasting to create irregularities and then subjected to release treatment wherein the surface was oxidized with a chromic acid solution to form an oxide film, that is, release treatment for facilitating the removal of the conductive metal (copper) formed by plating or the molding resin after plastic packaging from the conductive substrate (FIG. 6b).

The conductive substrate 120 on its whole side subjected to the surface treatment and release treatment was plated with copper (FIG. 6c).

Thereafter, in order to prepare a jig hole, for ensuring the registration, in the conductive substrate 120 and the copper plated area 110A, a photosensitive resist 150 was applied using a dry film resist on both sides of the conductive substrate 120 (FIG. 6d), exposure and development were performed to prepare a plate (FIG. 6e), and a through hole was formed by etching to prepare a jig hole 130 (FIG. 6f).

Thereafter, the photosensitive resist provided on both sides of the conductive substrate 120 was removed, and the conductive substrate 120 was cleaned (FIG. 6g), and, in order to form a circuit section by etching of the copper plated area 110A on the substrate in its side subjected to the surface treatment and release treatment, a photosensitive resist 150 was again applied onto both sides of the conductive substrate 120 using a dry film (FIG. 6h).

The photosensitive resist 150 in its predetermined area alone on the side, where a circuit section is to be formed, was exposed and developed to prepare a plate (FIG. 6i), and the copper plated area 110A exposed from the photosensitive resist 150 was etched to prepare a circuit section 110 followed by removal of the photosensitive resist 150 to prepare a circuit section 110 (FIG. 6j).

A solder resist 140 for designating a plating area in the surface treatment by noble metal plating, such as silver plating, necessary for die bonding for mounting a semiconductor element on a die pad 111 and wire bonding for connection of a semiconductor element to a lead 112 was coated onto a predetermined area (FIG. 6k).

As with the coating of the solder resist in Example A3, the coating of the solder resist 140 was performed by screen printing.

The circuit section on its area exposed from the solder resist 140 was plated with silver (surface treatment) to prepare a circuit member 100 for a semiconductor device (FIG. 6l).

In the preparation of the circuit member 100A for a semiconductor device shown in FIG. 3a, the solder resist 140 is then removed.

Example A5

Figure 8:
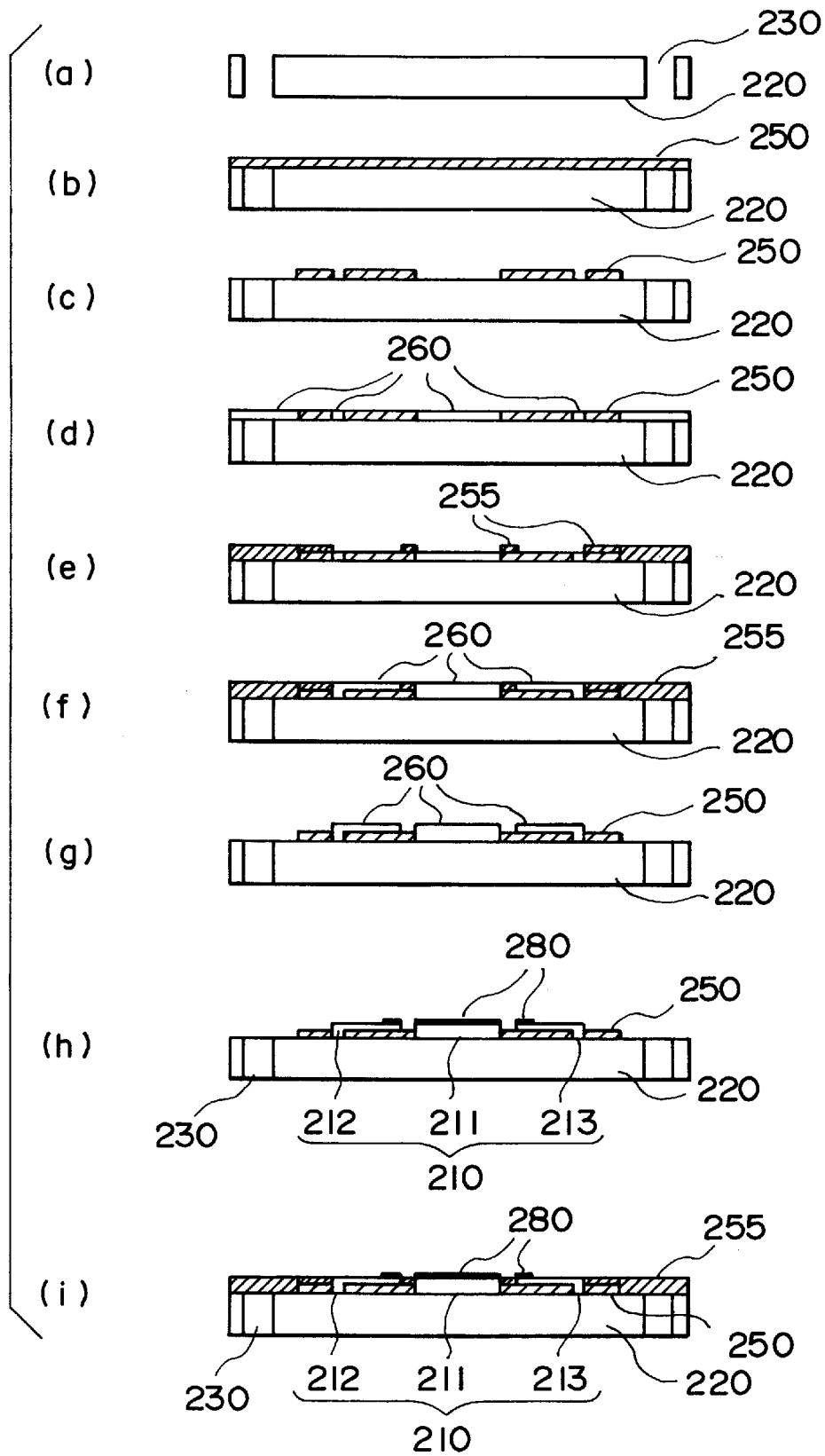
FIG. 8 is a process diagram showing a process for producing a circuit member for a semiconductor device of Example A5 of the present invention.

FIG. 8 shows a process diagram showing a process for producing a circuit member for a semiconductor device of Example A5.

The present example demonstrates a process for producing the circuit member 200 for a semiconductor device of Example A2 shown in FIGS. 4a and 4b. In this process, a solder resist (an insulating photosensitive resist) 250 is coated on a conductive substrate and treated to prepare a plate, an external terminal section 213 and a part (a part in terms of thickness) of a die pad are directly formed by first plating on one side of the conductive substrate 220 in its exposed area, a resist plate is prepared thereon without leaving the solder resist (insulating photosensitive resist) 250, and second plating is performed to form the whole circuit section 210.

At the outset, in the same manner as described above in connection with the process for producing a circuit member for a semiconductor device of Example A3, a conductive substrate 220, made of stainless steel (SUS 430), on its side, where a circuit section is to be formed, was surface treated by sand blasting to create irregularities, the surface of the irregularities was subjected to release treatment wherein the surface was oxidized with a chromic acid solution to form an oxide film, and a jig hole 230 for ensuring the registration was prepared (FIG. 8*a*).

Subsequently, in order to prepare an external terminal section 213 and a die pad 211 in a circuit section 210 by plating on the side subjected to the surface treatment and release treatment, a photosensitive resist 250 as a dry film was coated on the conductive substrate 220 (FIG. 8*b*).

The photosensitive resist 250 in its predetermined area alone on the side, where the external terminal section 213 and the die pad 211 in the circuit section 210 are to be formed, was exposed and subjected to development and the like to prepare a plate (FIG. 8*c*). The area exposed from the photosensitive resist 250 was plated with copper 260 (first plating), and the external terminal section 213 and a part of the die pad 211 in the circuit section 210 shown in FIGS. 4*a* and 4*b* were prepared (FIG. 8*d*).

As with the copper plating of Examples A3 and A4, the copper plating was carried out using the conventional copper plating bath, and the thickness of the circuit section was brought to 40 μm.

Thereafter, in order to designate the area, where a lead 212 and a part (a part in the thicknesswise direction) of a die pad 211 in the circuit section 210 are to be formed by electroplating, an insulating photosensitive resist 255 was coated in a predetermined form (FIG. 8*e*).

In this case, the insulating photosensitive resist 255 may be applied using the above dry film.

The area exposed from the insulating photosensitive resist 255 was plated with copper by electroless plating (second plating) to prepare the whole circuit section 210 shown in FIGS. 4*a* and 4*b* (FIG. 8*f*).

Thereafter, the insulating photosensitive resist 255 was removed (FIG. 8*g*), and a silver plating 280 was provided in a predetermined area to prepare a circuit member 200 for a semiconductor device of Example A2 shown in FIG. 4*b* (FIG. 8*h*).

In the above embodiment, after the step of FIG. 8*f*, a silver plating 280 may be provided in a predetermined area to prepare the variant 200A of Example A2 shown in FIG. 4*c*.

Example A6

FIG. 9 shows a process diagram showing a process for producing a circuit member for a semiconductor device of Example A6.

The present example demonstrates a process for producing the circuit member 200 for a semiconductor device of Example A2 shown in FIGS. 4*a* and 4*b*. In this process, as with the process for producing the circuit member for a semiconductor device described in Example A5, an external terminal section 213 and a part (a part in terms of thickness) of a die pad are formed directly on one side of the conductive substrate 220 by first plating. Thereafter, the solder resist (insulating photosensitive resist) 250 is left without removal, and a plating is provided by electroless plating (second plating) on the whole surface, followed by process etching to prepare the whole circuit section 210.

Also in this example, at the outset, in the same manner as described above in connection with the process for producing a circuit member for a semiconductor device of Example A3, a conductive substrate 220, made of stainless steel (SUS 430), on its side, where a circuit section is to be formed, was surface treated by sand blasting to create irregularities, the surface of the irregularities was subjected to release treatment wherein the surface was oxidized with a chromic acid solution to form an oxide film, and a jig hole 230 for ensuring the registration was prepared (FIG. 9*a*).

Subsequently, in order to prepare an external terminal section 213 and a die pad 211 in a circuit section 210 by plating on the side subjected to the surface treatment and release treatment, a photosensitive resist 250 as a dry film was coated on the conductive substrate 220 (FIG. 9*b*).

In the same manner as in Example A5, the photosensitive resist 250 in its predetermined area alone on the side, where the external terminal section 213 and the die pad 211 in the circuit section 210 are to be formed, was exposed and subjected to development and the like to prepare a plate (FIG. 9*c*). The area exposed from the photosensitive resist 250 was plated with copper 260 (first plating), and the external terminal section 213 and a part of the die pad 211 in the circuit section 210 shown in FIGS. 4*a* and 4*b* were prepared (FIG. 9*d*).

As with the copper plating of Examples A3, A4, and A5, the copper plating was carried out using the conventional copper plating bath, and the thickness of the circuit section was brought to 40 μm.

The photosensitive resist 250 was left as it is, and an electroless copper plating (second plating) was then provided on the external terminal section 213, the die pad 211, and the photosensitive resist 250 in the circuit section 210, thereby forming a copper plating 260 on the whole surface (FIG. 9*e*).

Thereafter, a resist 257 was coated on the copper plating 260 and treated to prepare a plate in a predetermined form (FIG. 9*f*), and the exposed area was removed by etching to form the whole circuit section 210 (FIG. 9*g*).

The resist 257 may be applied by using a dry film.

Thereafter, the resist 257 was removed (FIG. 9*h*), and a predetermined area was plated with silver 280 to prepare a circuit member 200 for a semiconductor device of Example A2 shown in FIGS. 4*a* and 4*b* (FIG. 9*i*).

Example A7

FIG. 7 shows a process diagram showing a process for producing a semiconductor device of Example A7.

In the process for producing a semiconductor device of the present example, the circuit member 100 for a semiconductor device of Example A1 shown in FIG. 1 is provided, and plastic molding is performed.

At the outset, the circuit member 100 for a semiconductor device was provided (FIG. 7*a*), and a semiconductor element 610 was mounted on the exposed die pad 111 so that the terminal 611 side faced upward, followed by wire bonding of the terminal 611 to the lead 112 (FIG. 7*b*).

Subsequently, one side of the conductive substrate 120 was subjected to plastic molding using a molding resin 630 so as to cover the semiconductor element 610, the wire 620, and the circuit section 110 in their entirety to prepare a semiconductor device 600A on one side of the conductive substrate 120 (FIG. 7*c*).

The conductive substrate 120, together with the photosensitive resist 150, was then removed from the semiconductor device 600A (FIG. 7*d*).

Thereafter, a solder resist 640 was coated so as to expose the circuit section 110, exposed by the separation of the semiconductor device 600A, in its external terminal section 113 alone to prepare a plate (FIG. 7e), and a solder ball 660 was provided so as to be integrally connected to the external terminal section 113 (FIG. 7f).

When the preparation of a semiconductor device using the circuit member 100A for a semiconductor device in the variant 1 shown in FIG. 3a or the circuit member 100B for a semiconductor device in the variant 2 shown in FIG. 3b is contemplated, the semiconductor device can be prepared in the same manner as described above in connection with the process for producing a semiconductor device shown in FIG. 7, except that the circuit member, for a semiconductor device, per se is different from the circuit member 100 for a semiconductor described in Example A1.

Example A8

FIG. 10 shows a process diagram showing a process for producing a semiconductor device of Example A8.

In the process for producing a semiconductor device of the present example, plastic molding is performed utilizing the circuit member 200 for a semiconductor device, described in Example A2, shown in FIG. 4b or the variant of Example A2 shown in FIG. 4c.

The steps shown in FIGS. 10a to 10d are the same as those described above in connection with the process for producing a semiconductor device described in Example A7. In the present example, after the step shown in FIG. 10d, a solder ball external electrode shown in FIG. 10e is prepared.

In the circuit members for a semiconductor device shown in FIGS. 4b and 4c, in the step shown in FIG. 10d, the external terminal section 213 alone is exposed on one surface (the surface which has been in contact with the surface on the conductive substrate 220 side). Therefore, unlike the process for producing a semiconductor device described in Example A7, the plate making for this purpose is unnecessary.

Examples A9 and A10

Figure 11A:
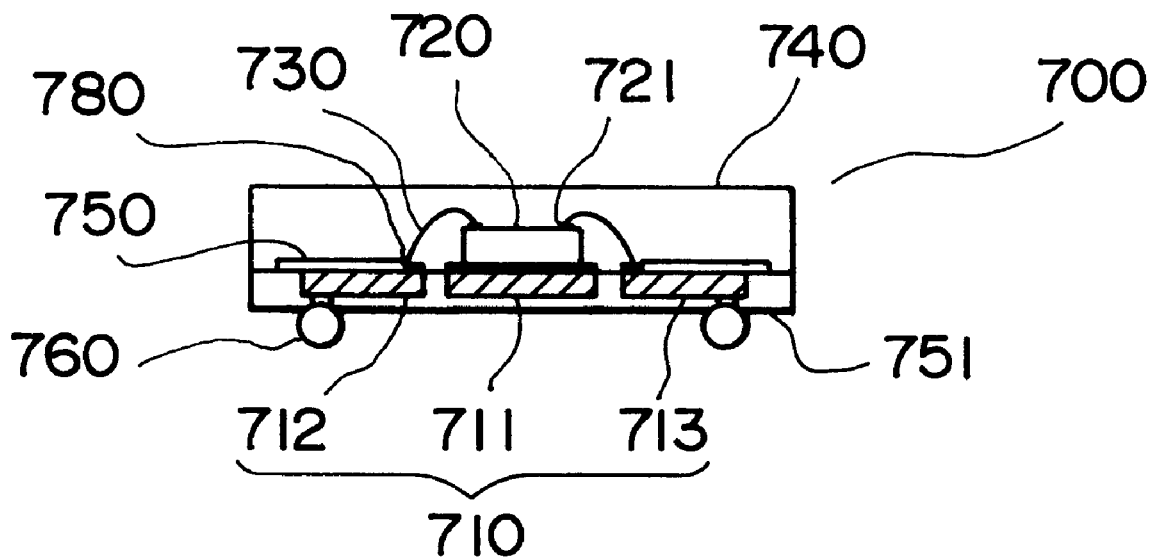
FIG. 11a is a cross-sectional view of a semiconductor device of Example A9 of the present invention.

Example A9 of the semiconductor device according to the present invention will be described with reference to FIG. 11a.

In FIG. 11, numeral 700 designates a semiconductor device, numeral 710 a circuit section, numeral 711 a die pad, numeral 712 a lead, numeral 713 an external terminal section, numeral 720 a semiconductor element, numeral 721 a terminal, numeral 730 a wire, numeral 740 a molding resin, numeral 750 a plating resist, numeral 751 a solder resist, and numeral 760 a solder ball.

In the present example, Example A7, a semiconductor device is prepared using a circuit member for a semiconductor device shown in FIG. 1 by a process for producing a semiconductor device shown in FIG. 7. The circuit member prepared by plating is fixed using a molding resin, and, further, the circuit member is covered with a solder resist so that the external terminal section 713 alone is exposed. By virtue of use of the circuit member for a semiconductor device, which can be finely fabricated, this construction can satisfactorily cope with a tendency toward the adoption of a multi-terminal of semiconductor devices. In addition, use of the above production process can ensure the quality.

A semiconductor device produced by using the circuit member for a semiconductor device shown in FIG. 3a according to the process for producing a semiconductor device shown in FIG. 7 is the same as the semiconductor device, shown in FIG. 7, except that the solder resist 751 is not provided.

Figure 11B:
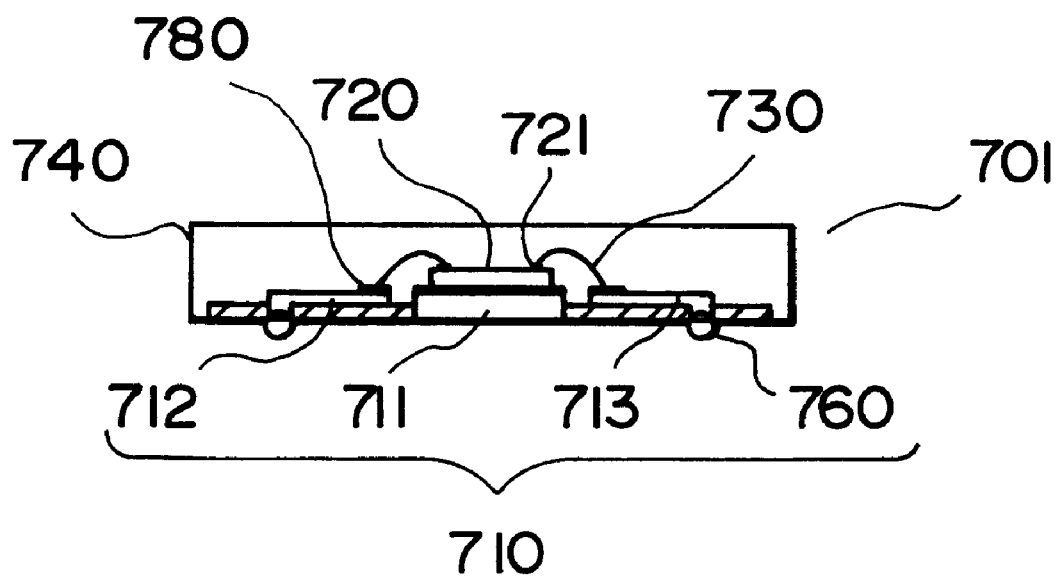
FIG. 11b is cross-sectional view of a semiconductor device of Example A10 of the present invention.

Another example of the semiconductor device according to the present invention, Example A10, is shown in FIG. 11b. The semiconductor device of Example A10 was produced by using the circuit member 200 for a semiconductor device shown in FIGS. 4a and 4b according to the process for producing a semiconductor device shown in FIG. 10. This semiconductor device can be produced more easily than the semiconductor device 700 shown in FIG. 11a.

Example B1

FIG. 12a is a simplified plan view of a circuit member for a semiconductor device of Example B1, FIG. 12b a cross-sectional view taken on line A1–A2 of FIG. 12a, and FIG. 12c an enlarged cross-sectional view of a portion A3 of FIG. 12b.

In FIG. 12a, leads and external terminal sections is shown in a reduced number for simplification.

Figure 13A:
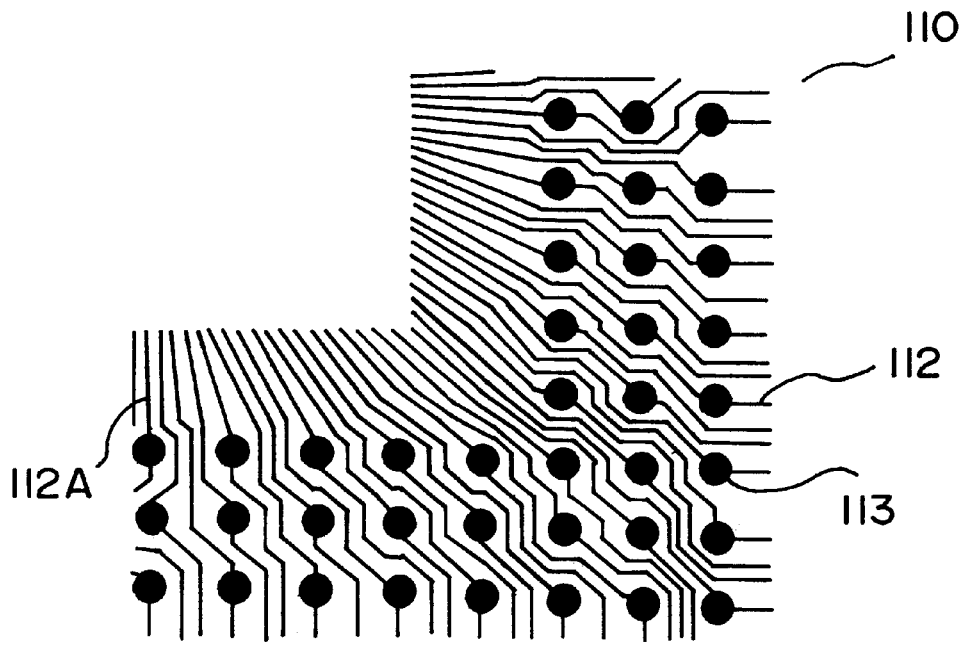
FIG. 13a is a plan view showing a part of a circuit section in a circuit member for a semiconductor device of Example B1 of the present invention.

FIG. 13a is a plan view illustrating one embodiment of the circuit section 110 in FIG. 12 and is an enlarged view of about one-fourth of the plan view.

Figure 13B:
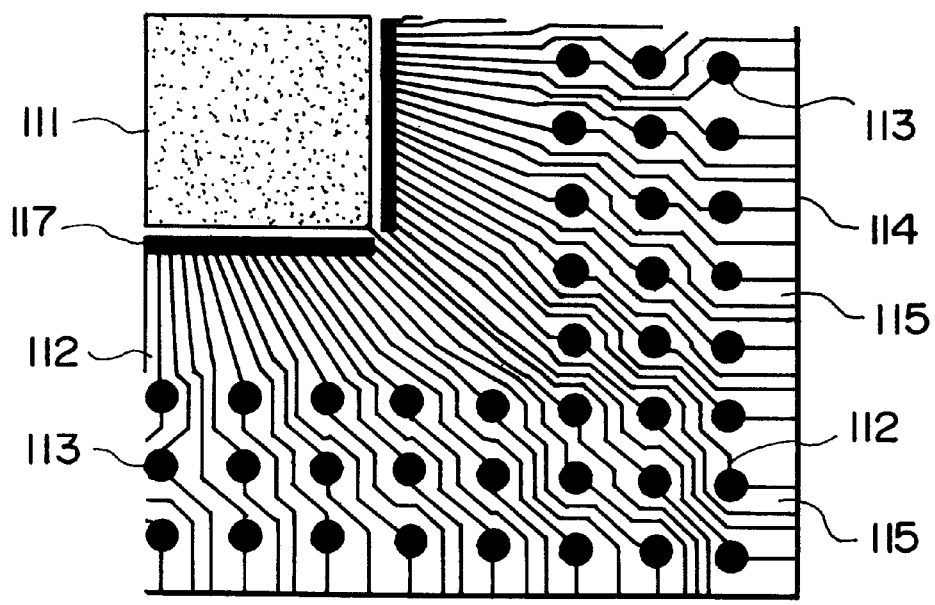
FIG. 13b is a plan view of a conventional circuit section.

FIG. 13b is an enlarged view of about one-fourth of a lead frame (a circuit member) used in a BGA type semiconductor device shown in FIG. 39 described below.

In FIGS. 12 and 13, numerals 100 designates a circuit member for a semiconductor device, numeral 110 a circuit section, numeral 111 a die pad, numerals 112 and 112A a lead, numeral 113 an eternal terminal section, numeral 114 a dam bar (a frame section), numeral 115 a supporting lead, numeral 117 a connecting section, numeral 120 a conductive substrate, numeral 130 a jig hole, and numeral 170 a silver plating.

The circuit member 100 for a semiconductor device in Example B1 is a circuit member for a BGA type, plastic molded type semiconductor device and, as shown in FIG. 12, comprises a conductive substrate 120, made of stainless steel (SUS 430), and a circuit member 110 comprising a conductive copper material provided by plating on the conductive substrate 120. It has a jig hole 130 for ensuring the positional accuracy in the course of the preparation.

In the circuit member 100 for a semiconductor device in the present example, in this state, a semiconductor element is mounted on the circuit section 110 side of the conductive substrate 120, the semiconductor element mounted side alone is molded using a molding resin to prepare a semiconductor device on the conductive substrate 120, and the conductive substrate 120 is removed to prepare a semiconductor device.

In the present example, the circuit section 110 comprises leads 112 and 112A and an external terminal section 113 integrally connected to the lead 112.

A plurality of sets of the lead 112 and the external terminal section 113 and the lead 112A are provided independently of each other and arranged in a two dimensional form along the face of the circuit section 110.

In the plan view shown in FIG. 12a, the lead 112 is provided so as to extend outward from the external terminal 113, and the lead 112A is provided so as to extend inward from the external terminal. The length of the lead 112A may be if necessary regulated to a suitable one in order to facilitate the mounting of the semiconductor element, and, in some cases, the provision of the lead 112A is unnecessary.

The silver plating section 170, when a semiconductor element is mounted on the circuit section 110, permits the terminal (bump) of the semiconductor element and the circuit section to be electrically connected to each other by wire bonding and is provided at the external front end of the lead 112 provided outward from the external terminal 113.

The external terminal section 113 functions to perform electrical connection to an external circuit, and, in the preparation of a BGA type semiconductor device, a solder ball is provided in this section.

As shown in FIG. 12c, irregularities are provided by sand blasting on the conductive substrate 120, made of 0.1 mm-thick stainless steel (SUS 430), in its side where the circuit section 110 is to be formed. Further, an oxide film is provided on the surface of the irregularities. In the preparation of a semiconductor device, molding of only the circuit section 110 with the semiconductor element provided thereon can permit the adhesion between the conductive substrate 120 and the circuit section 110 to be maintained and facilitates the removal of the whole semiconductor device, after molding, from the conductive substrate 120.

In Example B1, the thickness of the circuit section 110 is as small as 40 μm, and the pitch of the lead 112 in its front end is as small as 0.12 mm. This construction can cope with a tendency toward the adoption of a multi-terminal of semiconductor devices.

Example B2

Figure 14A:
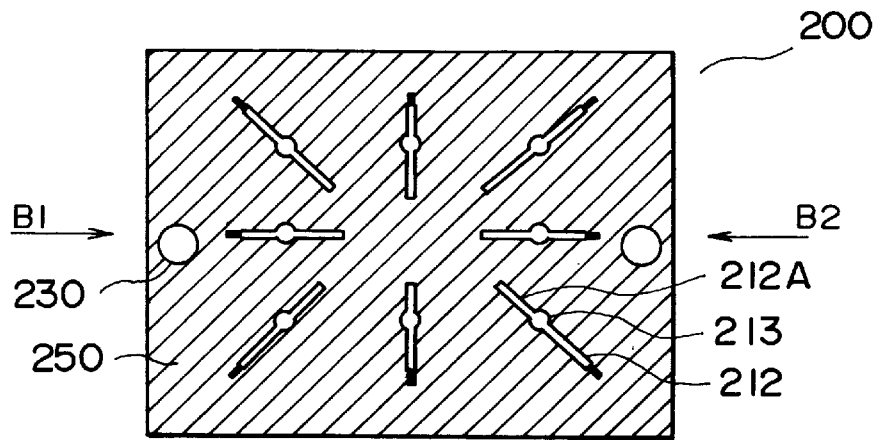
FIGS. 14a–14c are schematic diagrams showing a circuit member for a semiconductor device of Example B2 of the present invention.
Figure 14B:
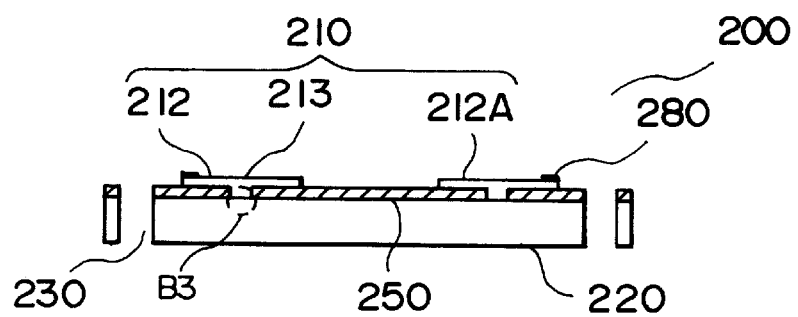
Figure 14C:
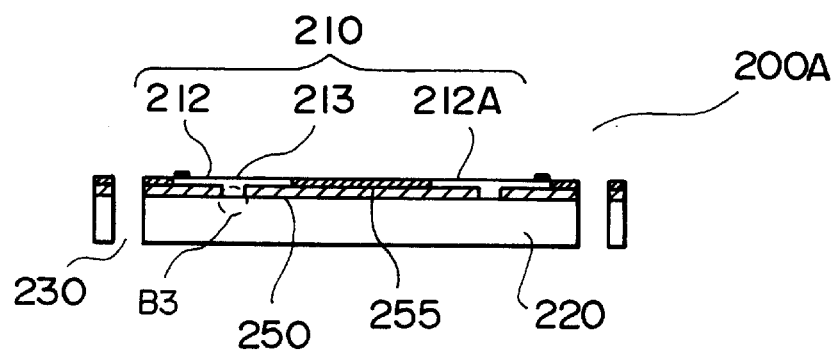

FIG. 14a is a plan view of a circuit member for a semiconductor device of Example B2, FIG. 14b a cross-sectional view taken on line B1–B2 of FIG. 14a, and FIG. 14c a diagram showing a variant of the present example.

In FIG. 14a, leads and external terminal sections are shown in a reduced number for simplification.

In the circuit member for a semiconductor device of the present example, the planar form of the circuit section 210 and the conductive substrate 220 is the same as described above in connection with the circuit member for a semiconductor device of Example B1 shown in FIG. 13.

In FIG. 14, numeral 200 designates a circuit member for a semiconductor device, numeral 210 a circuit member, numerals 212 and 212A leads, numeral 213 an external terminal section, numeral 220 a conductive substrate, numeral 230 a jig hole, numeral 250 a solder resist (an insulating photosensitive resist), numeral 255 an insulating photosensitive resist, and numeral 280 a silver plating.

As with the circuit member described in Example B1, the circuit member 200 for a semiconductor device of the present example is a circuit member for a BGA type, plastic molded type semiconductor device and, as shown in FIG. 14, comprises a conductive substrate 220, made of stainless steel (SUS 430), and a circuit member 210 comprising a conductive copper material provided by plating on the conductive substrate 220. The form of the circuit section 210 is the same as that in Example B1.

The present example is characterized in that a solder resist (an insulating photosensitive resist) 250 prepared for the formation of an external terminal section 213 (see the processes shown in FIGS. 18 and 19 described below) is used as such. Further, the structure is such that the preparation of a plate using an insulating photosensitive resist (a solder resist) for a solder ball external electrode and the formation of a solder resist film by screen printing are unnecessary in the preparation of a semiconductor device using a circuit member 200 for a semiconductor device shown in FIG. 14b.

Specifically, the solder resist (insulating photosensitive resist) 250 is formed by placing, in the preparation of a semiconductor device, a solder ball external electrode on the semiconductor device forming side and providing a solder resist so as to cover the circumference of the external terminal section 213.

In the present example, a conductive substrate 220 made of 0.1 mm-thick stainless steel (SUS 430) is used, and as shown in FIG. 12c, as with Example B1, irregularities are created by sand blasting on the conductive substrate 220 in its side where the circuit section 210 is to be formed (a dotted line portion B3 in FIGS. 14b and 14c). Further, an oxide film is provided on the surface of the irregularities, and a thin film of stearic acid is provided thereon as a release layer. In the preparation of a semiconductor device, molding of only the circuit section 210 with the semiconductor element provided thereon can permit the adhesion between the conductive substrate 220 and the circuit section 210 to be maintained and facilitates the removal of the whole semiconductor device, after molding, from the conductive substrate 220.

Since the circuit section 210 is fixed to the conductive substrate 220, as with Example B1, there is no need to use a connecting section, integrally connected to inner leads, for fixing the inner leads to one another, a supporting lead 115 for fixing the external terminal section, and a dam bar (frame) which have been necessary in the lead frame (circuit member) used in the conventional BGA type semiconductor device.

In the present example, as with Example B1, the thickness of the circuit section 210 is as small as 40 μm, and the pitch of the lead 212 in its front end is as small as 0.12 mm. This construction can cope with a tendency toward the adoption of a multi-terminal of semiconductor devices.

A variant of the present example is shown in FIG. 14c.

A circuit member 200A for a semiconductor device is such that, in the circuit member 200 for a semiconductor device, an insulating photosensitive resist 255 is provided. This insulating photosensitive resist 255 is an insulating photosensitive resist which has been prepared for the formation of a lead 212 by plating in the preparation of the circuit member 200 for a semiconductor device of Example B2 in the process shown in FIGS. 18 and 19 described below and as such is left. The present variant is the same as Example B2 in that the solder resist (insulating photosensitive resist) 250 prepared for the formation of the external terminal section 213 as such is used. As with the circuit member in Example B2, the circuit member in this example has such a structure that the preparation of a plate using an insulating photosensitive resist (a solder resist) for a solder ball external electrode and the formation of a solder resist film by screen printing are unnecessary in the preparation of a semiconductor device.

Example B3

Example B3 demonstrates a process for producing a circuit member 100 for a semiconductor device of Example B1 shown in FIG. 12 wherein the whole circuit section is directly prepared by plating.

At the outset, a conductive substrate 120 made of stainless steel (SUS 430) was provided (FIG. 15a). The conductive substrate on its side, where a circuit section is to be formed, was surface treated by sand blasting to create irregularities and then subjected to release treatment wherein the surface was oxidized with a chromic acid solution to form an oxide film, that is, release treatment for facilitating the removal of the conductive metal (copper) formed by plating or the molding resin after plastic packaging from the conductive substrate (FIG. 15b).

Thereafter, in order to prepare a jig hole, for ensuring the registration, in the conductive substrate 120, a photosensitive resist 150 was applied using a dry film resist on both sides of the conductive substrate 120 (FIG. 15*c*), exposure and development were performed to prepare a plate (FIG. 15*d*), and a through hole was formed by etching to prepare a jig hole 130 (FIG. 15*e*).

The dry film resist generally comprises three layers of a film substrate for supporting a resist, a resist, and a protective coat film. The protective coat film is removed, the dry film resist with the resist surface exposed thereon is laminated onto the substrate 120 so that the resist surface faces the surface of the conductive substrate 120, followed by removal of the film substrate to apply the resist on one side of the conductive substrate 120.

Thereafter, the photosensitive resist 150 provided on both sides of the conductive substrate 120 was removed, and the conductive substrate 120 was cleaned (FIG. 15*f*), and, in order to form a circuit section by plating on the substrate in its side subjected to the surface treatment and release treatment, a photosensitive resist 150 was again applied onto both sides of the conductive substrate 120 using a dry film (FIG. 15*g*).

The photosensitive resist 150 in its predetermined area alone on the side, where a circuit section is to be formed, was exposed and developed to prepare a plate (FIG. 15*h*), and the area exposed from the photosensitive resist 150 was plated with copper to prepare a circuit section 110 (FIG. 15*i*).

The copper plating was performed using the conventional copper plating bath so that the thickness of the circuit section was 40 $\mu$m.

A plating resist 140 for designating a plating area in the surface treatment by noble metal plating, such as silver plating, necessary for wire bonding for connection of a semiconductor element to a lead was coated onto a predetermined area (FIG. 15*j*).

The solder resist 140 was coated by screen printing.

The circuit section on its area exposed from the solder resist 140 was plated with silver (surface treatment) (FIG. 15*k*).

Thereafter, the solder resist 140 portion and the photosensitive resist 150 portion were removed to prepare a circuit member 100 for a semiconductor device 100 (FIG. 15*l*).

Example B4

Example B4 demonstrates a process for producing the circuit member 100 for a semiconductor device of Example B1 shown in FIG. 12 wherein the copper section formed by plating is etched to form a circuit section.

Figure 16:
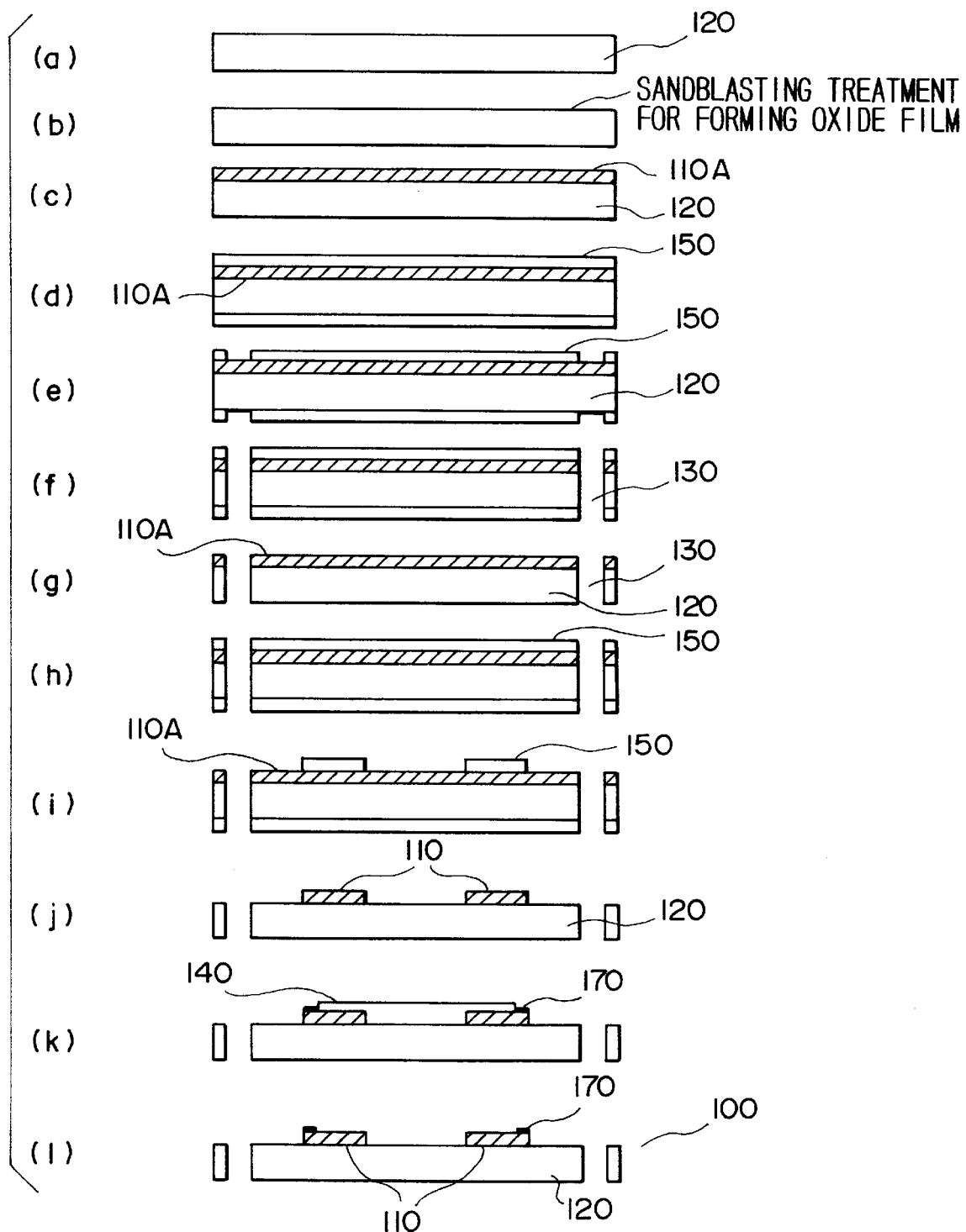
FIG. 16 is a process diagram showing a process for producing a circuit member for a semiconductor device of Example B4 of the present invention.

At the outset, a conductive substrate 120 made of stainless steel (SUS 430) was provided (FIG. 16*a*). The conductive substrate on its side, where a circuit section is to be formed, was surface treated by sand blasting to create irregularities and then subjected to release treatment wherein the surface was oxidized with a chromic acid solution to form an oxide film, that is, release treatment for facilitating the removal of the conductive metal (copper) formed by plating or the molding resin after plastic packaging from the conductive substrate (FIG. 16*b*).

The conductive substrate 120 on its whole side subjected to the surface treatment and release treatment was plated with copper (FIG. 16*c*).

Thereafter, in order to prepare a jig hole, for ensuring the registration, a photosensitive resist 150 was applied using a dry film resist on both sides of the copper-plated conductive substrate 120 (FIG. 16*d*), exposure and development were performed to prepare a plate (FIG. 16*e*), and a through hole was formed by etching to prepare a jig hole 130 (FIG. 16*f*).

Thereafter, the photosensitive resist provided on both sides of the conductive substrate 120 was removed, and the conductive substrate 120 was cleaned (FIG. 16*g*), and, in order to form a circuit section by etching of the copper plated area 110A on the substrate in its side subjected to the surface treatment and release treatment, a photosensitive resist 150 was again applied onto both sides of the conductive substrate 120 using a dry film (FIG. 16*h*).

The photosensitive resist 150 in its predetermined area alone on the side, where a circuit section is to be formed, was exposed and developed to prepare a plate (FIG. 16*i*), and the copper plated area 110A exposed from the photosensitive resist 150 was etched to prepare a circuit section 110 followed by removal of the photosensitive resist 150 (FIG. 16*j*).

A solder resist 140 for designating a plating area in the surface treatment by noble metal plating, such as silver plating, necessary for wire bonding for connection of a semiconductor element to the circuit section 110 was coated onto a predetermined area, and the circuit section in its area exposed from the solder resist 140 was plated with silver (surface treatment) (FIG. 16*k*).

As with the coating of the solder resist in Example B3, the coating of the plating resist 140 was performed by screen printing.

The plating resist 140 portion was then removed to prepare a circuit member 100 for a semiconductor device (FIG. 16*l*).

Example B5

Figure 18:
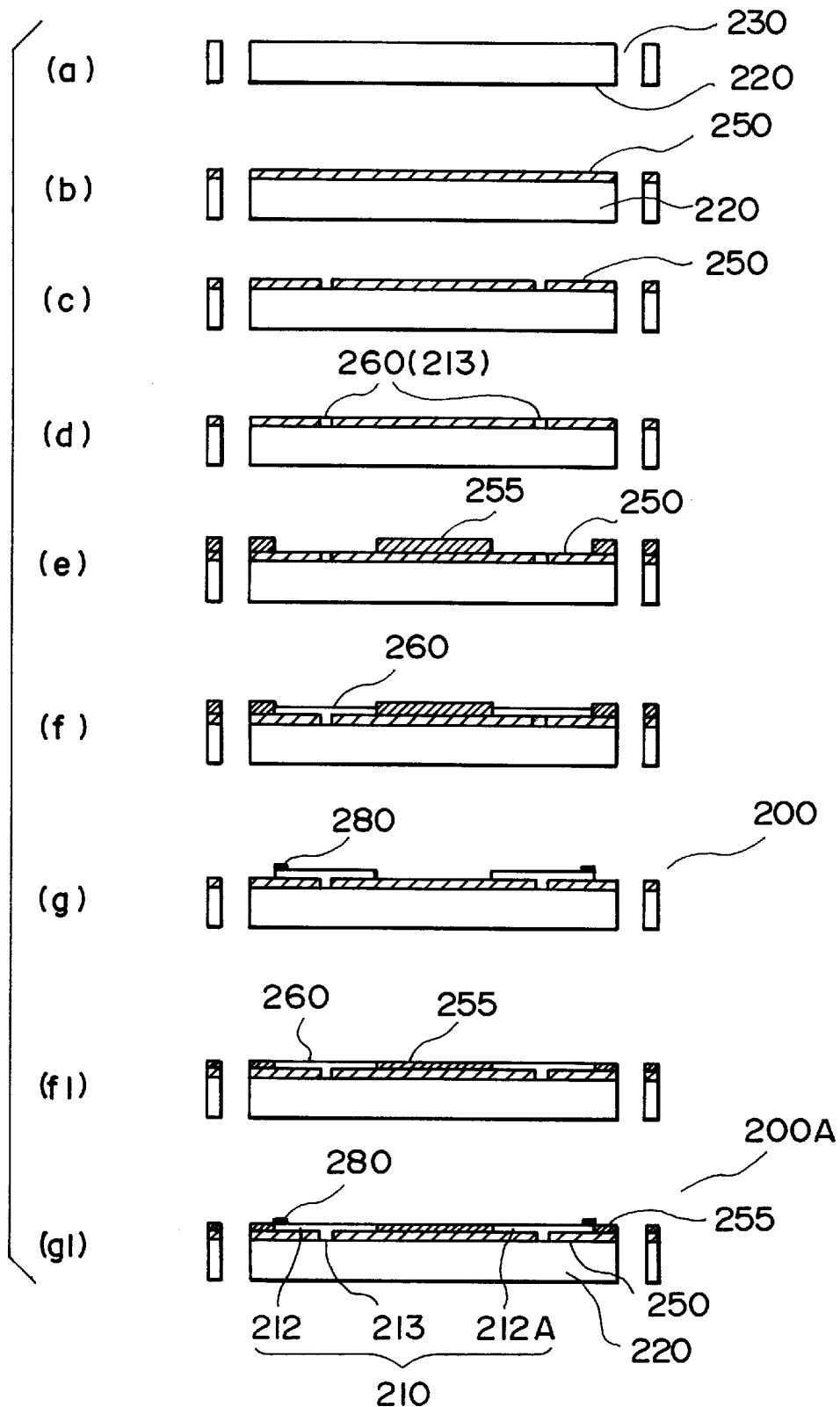
FIG. 18 is a process diagram showing a process for producing a circuit member for a semiconductor device of Example B5 of the present invention.

FIG. 18 shows a process diagram showing a process for producing a circuit member for a semiconductor device of Example B5.

The present example demonstrates a process for producing the circuit member 200 for a semiconductor device of Example B2 shown in FIGS. 14*b* and 14*c*. In this process, a solder resist (an insulating photosensitive resist) 250 is coated on a conductive substrate and treated to prepare a plate, a part (a part in terms of thickness) of an external terminal section 213 is directly formed by first plating on one side of the conductive substrate 220 in its exposed area, a resist plate is prepared thereon without leaving the solder resist (insulating photosensitive resist) 250, and second plating is performed to form the whole circuit section 210.

At the outset, in the same manner as described above in connection with the process for producing a circuit member for a semiconductor device of Example B3, a conductive substrate 220, made of stainless steel (SUS 430), on its side, where a circuit section is to be formed, was surface treated by sand blasting to create irregularities, and the surface of the irregularities was subjected to release treatment wherein the surface was oxidized with a chromic acid solution to form an oxide film, followed by dipping in stearic acid to form a thin release film. Thereafter, a jig hole 230 for ensuring the registration was prepared (FIG. 18*a*).

The thin release film of stearic acid (release layer) serves to control the adhesion between the substrate and the solder resist.

Subsequently, in order to prepare an external terminal section 213 in a circuit section 210 by plating on the side subjected to the surface treatment and release treatment, a photosensitive resist 250 was applied using a dry film onto both sides of the conductive substrate 220 (FIG. 18b).

The photosensitive resist 250 in its predetermined area alone on the side, where the external terminal section 213 in the circuit section 210 is to be formed, was exposed and subjected to development and the like to prepare a plate (FIG. 18c). The area exposed from the photosensitive resist 250 was plated with copper 260 (first plating) to prepare a part of the external terminal section 213 in the circuit section 210 shown in FIGS. 14b and 14c (FIG. 18d).

As with the copper plating of Examples B3 and B4, the copper plating was carried out using the conventional copper plating bath, and the thickness of the circuit section was brought to 40 µm.

Thereafter, in order to designate the area, where a part (a part in the thicknesswise direction) of a lead in the circuit section 210 are to be formed by electroless plating, an insulating photosensitive resist 255 was coated in a predetermined form (FIG. 18e).

In this case, the insulating photosensitive resist 255 may be applied using the above dry film.

The area exposed from the insulating photosensitive resist 255 was plated with copper by electroless plating (second plating) to prepare a lead 212 and a part of the external terminal section 213 in the circuit section 210 shown in FIGS. 14b and 14c (FIG. 18f).

Thereafter, the insulating photosensitive resist 255 was removed, and a silver plating 280 was provided in a predetermined area to prepare a circuit member 200 for a semiconductor device of Example B2 shown in FIG. 14b (FIG. 18g).

In the above embodiment, in FIG. 18f, after the step of FIG. 18f1, a silver plating 280 may be provided in a predetermined area to prepare the variant 200A of Example B2 shown in FIG. 14c (FIG. 18g1).

Example B6

FIG. 19 shows a process diagram showing a process for producing a circuit member for a semiconductor device of Example B6.

The present example demonstrates a process for producing the circuit member 200 for a semiconductor device of Example B2 shown in FIGS. 14a and 14b. In this process, as with the process for producing the circuit member for a semiconductor device described in Example B5, a part (a part in terms of thickness) of an external terminal section 213 is formed directly on one side of the conductive substrate 220 by first plating. Thereafter, the solder resist (insulating photosensitive resist) 250 is left without removal, and a plating is provided by electroless plating (second plating) on the whole surface, followed by process etching to prepare the whole circuit section 210.

In the present example, at the outset, in the same manner as described above in connection with the process for producing a circuit member for a semiconductor device of Example B3, a conductive substrate 220, made of stainless steel (SUS 430), on its side, where a circuit section is to be formed, was surface treated by sand blasting to create irregularities, the surface of the irregularities was subjected to release treatment wherein the surface was oxidized with a chromic acid solution to form an oxide film, followed by dipping in stearic acid to form a thin release film. Thereafter, a jig hole 230 for ensuring the registration was prepared (FIG. 19a).

Subsequently, in order to prepare an external terminal section 213 in a circuit section 210 by plating on the side subjected to the surface treatment and release treatment, a photosensitive resist 250 was applied using a dry film onto the conductive substrate 220 (FIG. 19b).

In the same manner as in Example B5, the photosensitive resist 250 in its predetermined area alone on the side, where the external terminal section 213 in the circuit section 210 is to be formed, was exposed and subjected to development and the like to prepare a plate (FIG. 19c). The area exposed from the photosensitive resist 250 was plated with copper 260 (first plating), and a part of the external terminal section 213 in the circuit section 210 shown in FIGS. 14b and 14c were prepared (FIG. 19d).

As with the copper plating of Examples B3, B4, and B5, the copper plating was carried out using the conventional copper plating bath, and the thickness of the circuit section was brought to 40 µm.

The photosensitive resist 250 was left as it is, and an electroless copper plating (second plating) was then provided on the external terminal section 213 and the photosensitive resist 250 in the circuit section 210, thereby forming a copper plating 260 on the whole surface (FIG. 19e).

Thereafter, a resist 257 was coated on the copper plating 260 and treated to prepare a plate in a predetermined form (FIG. 19f), and the exposed area was removed by etching to prepare the lead 212 and a part of the external terminal section 213 in the circuit section 210 (FIG. 19g).

The resist 257 may be applied by using a dry film.

Thereafter, the resist 257 was removed, and a predetermined area was plated with silver 280 to prepare a circuit member 200 for a semiconductor device of Example B2 shown in FIGS. 14a and 14b (FIG. 19h).

Example B7

FIG. 17 shows a process diagram showing a process for producing a semiconductor device of Example B7.

In the process for producing a semiconductor device of the present example, the circuit member 100 for a semiconductor device of Example B1 shown in FIG. 12 is provided, and plastic molding is performed.

At the outset, the circuit member 100 for a semiconductor device was provided (FIG. 17a), and a semiconductor element 610 was mounted on the exposed lead 112 through an insulating adhesive layer 630 so that the terminal 611 side faced upward, followed by wire bonding of the terminal 611 to the lead 112 (FIG. 17b).

The insulating adhesive layer 630 may be formed by screen printing, dispensing or the like. An insulating, pressure sensitive adhesive double coated tape may be used instead of the insulating adhesive layer 630.

Subsequently, one side of the conductive substrate 120 was subjected to plastic molding using a molding resin 640 so as to cover the semiconductor element 610, the wire 620, and the circuit section 110 in their entirety to prepare a semiconductor device 600A on one side of the conductive substrate 120 (FIG. 17c).

The conductive substrate 120 was then removed from the semiconductor device 600A (FIG. 17d).

Thereafter, a solder resist was coated so as to expose the circuit section 110, exposed by the separation of the semiconductor device 600A, in its external terminal section 113 alone to prepare a plate (FIG. 17e), and a solder ball 660 was provided so as to be integrally connected to the external terminal section (FIG. 17f).

Example B8

In the process for producing a semiconductor device of Example B8, plastic molding is performed utilizing the circuit member 200 for a semiconductor device, described in Example B2, shown in FIGS. 14a and 14b or the circuit member 200A for a semiconductor device, described in the variant of Example B2, shown in FIG. 14c.

The steps shown in FIGS. 20a to 20d are the same as those described above in connection with the process for producing a semiconductor device described in Example B7. In the present example, after the step shown in FIG. 20d, a solder ball external electrode is prepared on 601A (FIG. 20e).

In the circuit members for a semiconductor device shown in FIGS. 14a, 14b and 14c, in the step shown in FIG. 20d, the external terminal section 213 alone is exposed on one surface (the surface which has been in contact with the surface on the conductive substrate 220 side). Therefore, unlike the process for producing a semiconductor device described in Example B7, the plate making for this purpose is unnecessary.

Examples B9 and B10

Examples B9 and B10 of the semiconductor device according to the present invention will be described with reference to FIG. 21.

In FIG. 21, numerals 700 and 701 each designate a semiconductor device, numeral 710 a circuit section, numerals 712 and 712A each a lead, numeral 713 an external terminal section, numeral 720 a semiconductor element, numeral 721 a terminal, numeral 725 a wire, numeral 730 an insulating adhesive layer, numeral 740 a molding resin, numeral 750 a solder resist, and numeral 760 a solder ball.

In the present example, Example B9, a semiconductor device was produced using the circuit member for a semiconductor device shown in FIG. 12 by the process for producing a semiconductor device shown in FIG. 17. The circuit member prepared by plating was fixed using a molding resin, and, further, the external terminal section 713 was exposed. By virtue of use of the circuit member for a semiconductor device, which can be finely fabricated, this semiconductor device can satisfactorily cope with a tendency toward the adoption of a multi-terminal of semiconductor devices. In addition, use of the above production process can ensure the quality.

Figure 20:
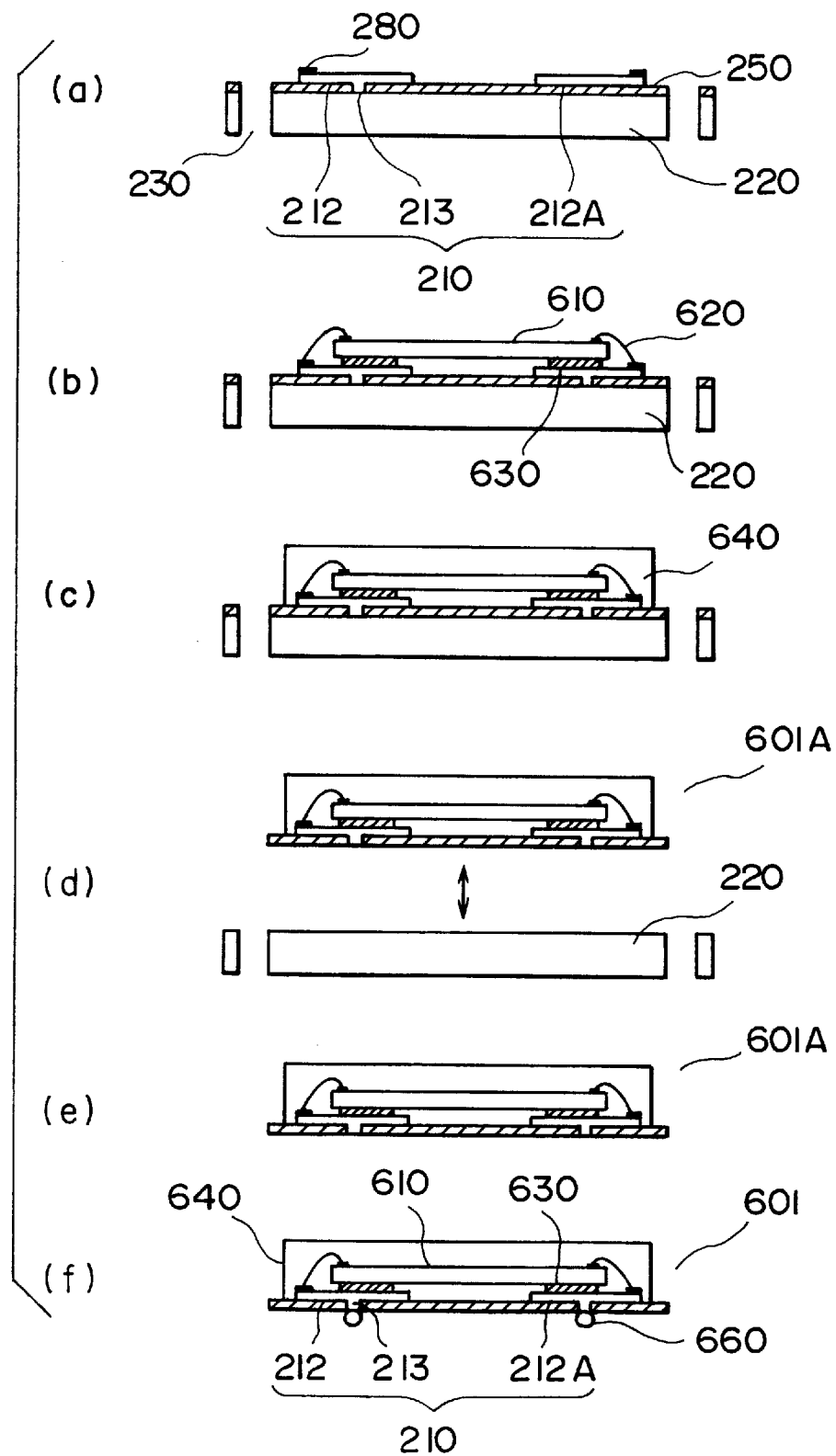
FIG. 20 is a process diagram showing a process for producing a semiconductor device of Example B8 of the present invention.

The semiconductor device of Example B10 was produced by using the circuit member 200 for a semiconductor device shown in FIGS. 14a and 14b according to the process for producing a semiconductor device shown in FIG. 20. This semiconductor device can be produced more easily than the semiconductor device 700 shown in FIG. 21a.

Example C1

Figure 22A:
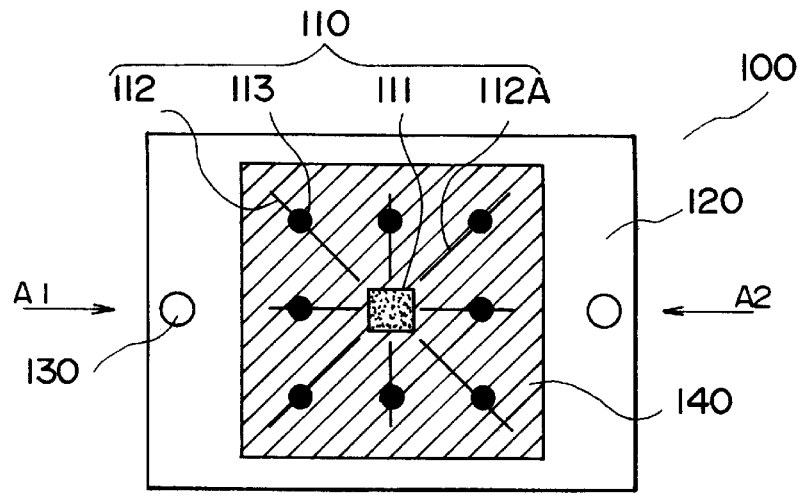
FIGS. 22a–22b are schematic diagrams showing a circuit member for a semiconductor device of Example C1 of the present invention.
Figure 22B:
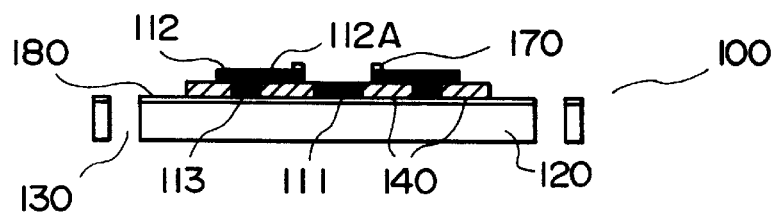
Figure 22C:
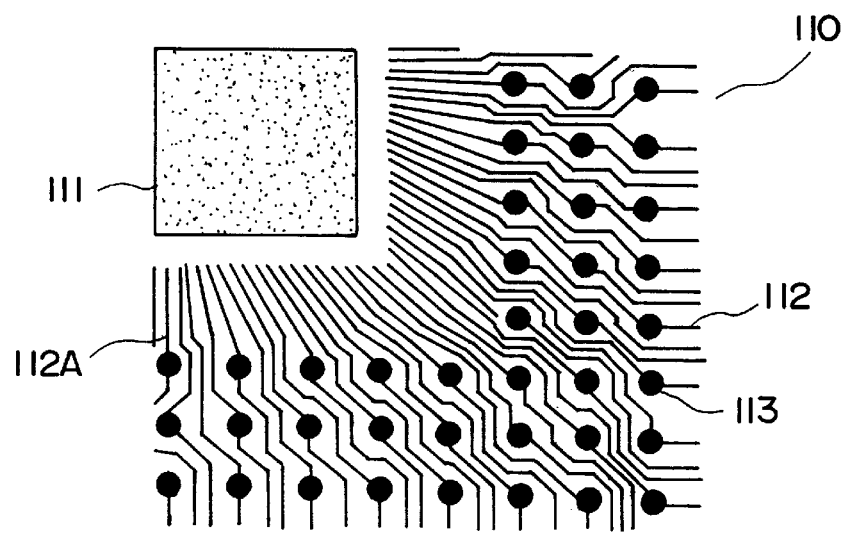

FIG. 22a is a simplified plan view of a circuit member for a semiconductor device of Example C1, FIG. 22b a cross-sectional view taken on line A1–A2 of FIG. 22a, and FIG. 22c an enlarged plan view showing the circuit section 110 alone (about one-fourth of the whole circuit section) in FIGS. 22a and 22b.

In FIG. 22a, leads and external terminal sections are shown in a reduced number for simplification.

In FIG. 22, numeral 100 designates a circuit member for a semiconductor device, numeral 110 a circuit section, numeral 111 a die pad, numerals 112 and 112A a lead, numeral 113 an eternal terminal section, numeral 120 a conductive substrate, numeral 130 a jig hole, numeral 140 an epoxy resin layer, numeral 170 a silver plating, and numeral 180 a release layer.

The circuit member 100 for a semiconductor device in Example C1 is a circuit member for a BGA type, plastic molded type semiconductor device and, as shown in FIG. 22, comprises: a conductive substrate 120 made of stainless steel (SUS 430); and, provided on the conductive substrate 120, a circuit member 110 comprising a conductive copper material provided by plating and an insulating epoxy resin layer 140 provided by transfer molding. Further, it has a jig hole 130 for ensuring the positional accuracy in the course of the preparation.

In the circuit member 100 for a semiconductor device in the present example, in this state, a semiconductor element is mounted on the circuit section 110 side of the conductive substrate 120, the semiconductor element mounted side alone is molded using a molding resin to prepare a semiconductor device on the conductive substrate 120, and the conductive substrate 120 is removed to prepare a semiconductor device.

In the present example, the circuit section 110 comprises a die pad 111, leads 112 and 112A, and an external terminal section 113 integrally connected to the lead 112.

A plurality of sets of the lead 112 and the external terminal section 113 and the lead 112A are provided independently of each other and arranged in a two dimensional form along the face of the circuit section 110.

In the plan view shown in FIG. 22a, the lead 112 is provided so as to extend outward from the external terminal 113, and the lead 112A is provided so as to extend inward from the external terminal 113. In the present example, since the lead 112A in its internal front end is electrically connected to the terminal of the semiconductor element by wire bonding, the lead 112 provided inward from the external terminal 113 is in some cases unnecessary.

The external terminal section 113 is provided for electrical connection to an external circuit. In the preparation of a BGA type semiconductor device, a solder ball is provided on the side opposite to the side with the semiconductor element mounted thereon, and electrical connection to the external circuit is performed through the solder ball section.

The silver plating section 170, when a semiconductor element is mounted on the die pad 111 of the circuit section 110, permits the terminal (bump) of the semiconductor element and the circuit section 110 to be electrically connected to each other by wire bonding and is provided at the internal front end of the lead 112A extended inward from the external terminal 113.

The conductive substrate 120 is made of 0.1 mm-thick stainless steel (SUS 430), and irregularities are provided by sand blasting on the conductive substrate 120 in its side where the circuit section 110 is to be formed. Further, an oxide film is provided on the surface of the irregularities, and a release layer 180 of stearic acid is provided on the oxide film. In the preparation of a semiconductor device, molding of only the circuit section 110 with the semiconductor element provided thereon can permit the adhesion between the conductive substrate 120 and the circuit section 110 to be maintained and facilitates the removal of the whole semiconductor device, after molding, from the conductive substrate 120.

In the present example, the thickness of the circuit section 110 is as small as 40 $\mu$m, and the pitch of the lead 112 in its front end is as small as 0.12 mm. This construction can cope with a tendency toward the adoption of a multi-terminal of semiconductor devices.

A variant of the lead frame member 100 in the present example will be described.

Figure 23A:
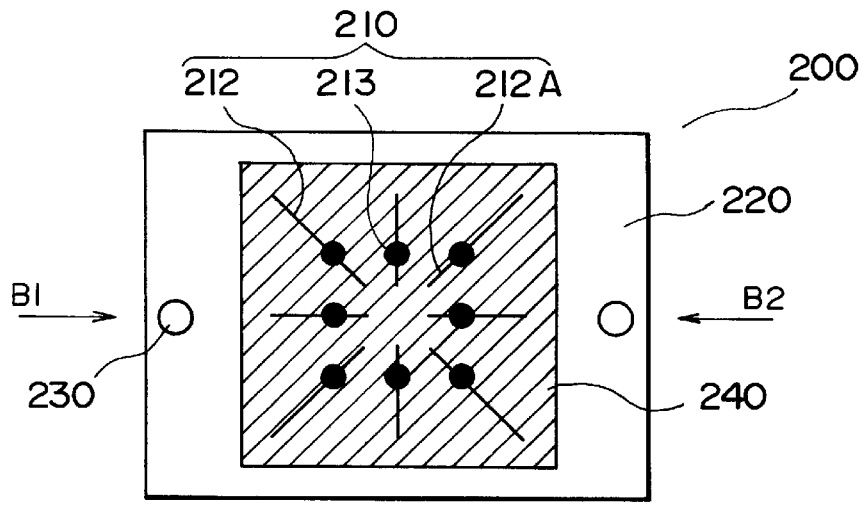
FIGS. 23a–23c are schematic diagrams showing a circuit member for a semiconductor device which is a variant of Example C1 of the present invention.
Figure 23B:
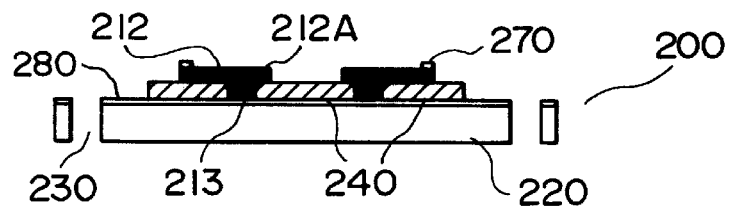
Figure 23C:
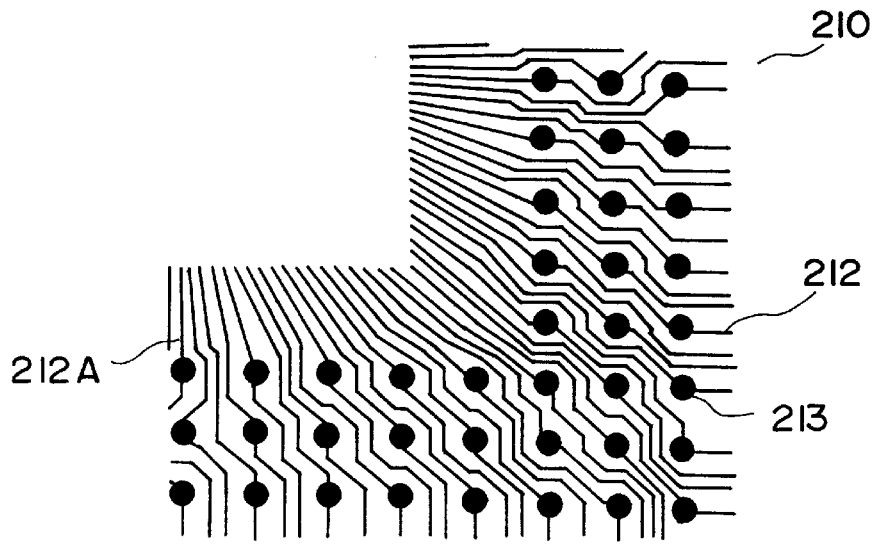

FIG. 23a is a plan view of a lead frame member 200 according to the variant, and FIG. 23b is a cross-sectional view taken on line B1–B2 of FIG. 23a. FIG. 23c is an enlarged plan view showing the circuit section 210 alone (about one-fourth of the whole circuit section) in FIGS. 23a and 23b.

In FIG. 23a, leads and external terminal sections are shown in a reduced number for simplification.

In FIG. 23, numeral 200 designates a circuit member for a semiconductor device, numeral 210 a circuit section, numerals 212 and 212A each a lead, numeral 213 an external terminal section, numeral 220 a conductive substrate, numeral 230 a jig hole, numeral 240 an epoxy resin layer, numeral 270 a silver plating, and numeral 280 a release layer.

The lead frame member 200 according to the variant is not provided with a die pad, and a lead 212 extended outward from the external terminal 213 and a plating section 270 for wire bonding are provided.

A lead 212A is provided extended inward from the external terminal 213, and the length thereof may be if necessary regulated to a suitable one in order to facilitate the mounting of the semiconductor element.

The silver plating section 270, when a semiconductor element is mounted on the circuit section 210, permits the terminal (bump) of the semiconductor element and the circuit section to be electrically connected to each other by wire bonding and is provided at the external front end of the lead 212 extended outward from the external terminal 213.

Example C2

Example C2 demonstrates a process for producing a circuit member 100 for a semiconductor device of Example C1 shown in FIG. 22 wherein the whole circuit section is directly prepared by plating.

At the outset, a conductive substrate 120 made of stainless steel (SUS 430) was provided (FIG. 24a), a jig hole for registration was formed in the conductive substrate 120 (FIG. 24b), and the conductive substrate 120 on its side, where a circuit section is to be formed, was surface treated by sand blasting to create irregularities (FIG. 24c). Thereafter, the treated surface was oxidized with a chromic acid solution to form an oxide film, and the metallic substrate with an oxide film formed thereon was dipped in stearic acid to form a release layer (a release film) 180 (FIG. 24d).

A 40 μm-thick insulating epoxy resin layer 140 (MP-190M, manufactured by Nitto Denko Corp.) was formed by transfer molding so as to expose the area to be served as an external terminal section (FIG. 24e).

The epoxy resin 140 is not limited to this only, and, further, a suitable thickness of 40 to 60 μm or the like may be selected according to need.

The conductive substrate 120 in its exposed area not covered with the insulating epoxy resin layer 140 is electroplated with a conductive metal to form a conductive metal plating 110A having a thickness approximately equal to the thickness of the insulating epoxy resin layer, thereby forming an external terminal section 113 (FIG. 24f).

An insulating resist 190 was then coated on the plating surface and treated to prepare a plate so that the insulating resist 190 was removed so as to expose only the area where a circuit section is to be formed (FIG. 24g).

Thereafter, an electroless plating 110B was provided on only the exposed area where a circuit section is to be formed (FIG. 24h). Further, an electroplating 110A was provided (FIG. 24i), and the insulating resist 190 was removed to form a circuit section (FIG. 24j).

In the process for producing a circuit member for a semiconductor device of the present example shown in FIG. 24, it is also possible to use a method wherein the external terminal section (bump) and the circuit section are formed at a time by the electroless plating alone without performing the electroplating.

Example C3

The present example demonstrates a process for producing a circuit member 200 for a semiconductor device of the variant shown in FIG. 23 wherein the whole circuit section is directly prepared by selectively etching a plated area.

At the outset, a conductive substrate 220 made of stainless steel (SUS 430) was provided (FIG. 25a), a jig hole for registration was formed in the conductive substrate 220 (FIG. 25b), and the conductive substrate 220 on its side, where a circuit section is to be formed, was surface treated by sand blasting to create irregularities (FIG. 25c). Thereafter, the treated surface was oxidized with a chromic acid solution to form an oxide film, and the metallic substrate with an oxide film formed thereon was dipped in stearic acid to form a release layer (a release film) 280 (FIG. 25d).

A 40 μm-thick insulating epoxy resin layer 240 (MP-190M, manufactured by Nitto Denko Corp.) was formed by transfer molding so as to expose the area to be served as an external terminal section (FIG. 25e).

The epoxy resin is not limited to this only, and, further, a suitable thickness of 40 to 60 μm or the like may be selected according to need.

The conductive substrate in its exposed area not covered with the insulating epoxy resin layer is electroplated with a conductive metal to form a conductive metal plating 210A having a thickness approximately equal to the thickness of the insulating epoxy resin layer 240, thereby forming an external terminal section 213 (FIG. 25f).

A conductive metal plating 210B was then provided by electroless plating on the whole surface with the electroplating 210A provided thereon (FIG. 25g). Thus, a plating was provided by electroless plating alone on the whole surface (FIG. 25h).

A resist 290 was then coated on the electroless plating 210B and treated to prepare a plate in a circuit form (FIG. 25i). This resist was used as an etching resistant mask to etch the electroless plating 210B (FIG. 25j), and the resist 290 was then removed to form a circuit section 210 (FIG. 25k).

Example C4

FIG. 26 is a process diagram showing a process for producing a semiconductor device of Example C4.

In the process for producing a semiconductor device according to the present example, a semiconductor device is produced by plastic molding using the circuit member 100 for a semiconductor device of the example shown in FIG. 22.

At the outset, a circuit member 100 for a semiconductor device (FIG. 26a) was provided, a semiconductor element 510 was mounted through an insulating adhesive layer 530 onto an exposed die pad 111 so that the terminal 511 side faced upward, and the terminal 511 was wire bonded to the plating section 170 provided at the front end of the lead 112A (FIG. 26b).

The insulating adhesive layer 530 may be formed by screen printing, dispensing or the like. An insulating, pressure sensitive adhesive double coated tape may be used instead of the insulating adhesive layer 530.

Subsequently, one side of the conductive substrate 120 was subjected to plastic molding using a molding resin 540 so as to cover the semiconductor element 510, the wire 520, and the circuit section 110 in their entirety to prepare a semiconductor device 500A on one side of the conductive substrate 120 (FIG. 26c).

The conductive substrate 120, together with the release layer, was then removed from the semiconductor device 500A (FIG. 26d).

Thereafter, a solder ball 560 was provided so as to be integrally connected to the external terminal section 113 in the circuit section 110 exposed by the separation of the semiconductor device 500A, thereby preparing a semiconductor device 500 (FIG. 26e).

Example C5

In the process for producing a semiconductor device according to the present example, Example C5, a semiconductor device is produced by plastic molding using the circuit member 200 for a semiconductor device of the variant shown in FIG. 23.

At the outset, a circuit member 200 for a semiconductor device (FIG. 27a) was provided, a semiconductor element 610 was mounted through an insulating adhesive layer 630 onto an exposed lead 112 so that the terminal 611 side faced upward, and the terminal 611 was wire bonded to the plating section 170 of the lead 212 (FIG. 27b).

The insulating adhesive layer 630 may be formed by screen printing, dispensing or the like. An insulating, pressure sensitive adhesive double coated tape may be used instead of the insulating adhesive layer 630.

Subsequently, one side of the conductive substrate 220 was subjected to plastic molding using a molding resin 640 so as to cover the semiconductor element 610, the wire 620, and the circuit section in their entirety to prepare a semiconductor device 600A on one side of the conductive substrate 220 (FIG. 27c).

The conductive substrate 220, together with the release layer 280, was then removed from the semiconductor device 600A (FIG. 27d).

Thereafter, a solder ball 660 was provided so as to be integrally connected to the external terminal section 213 in the circuit section 210 exposed by the separation of the semiconductor device 600A, thereby preparing a semiconductor device 600 (FIG. 27e).

Examples C6 and C7

Figure 28A:
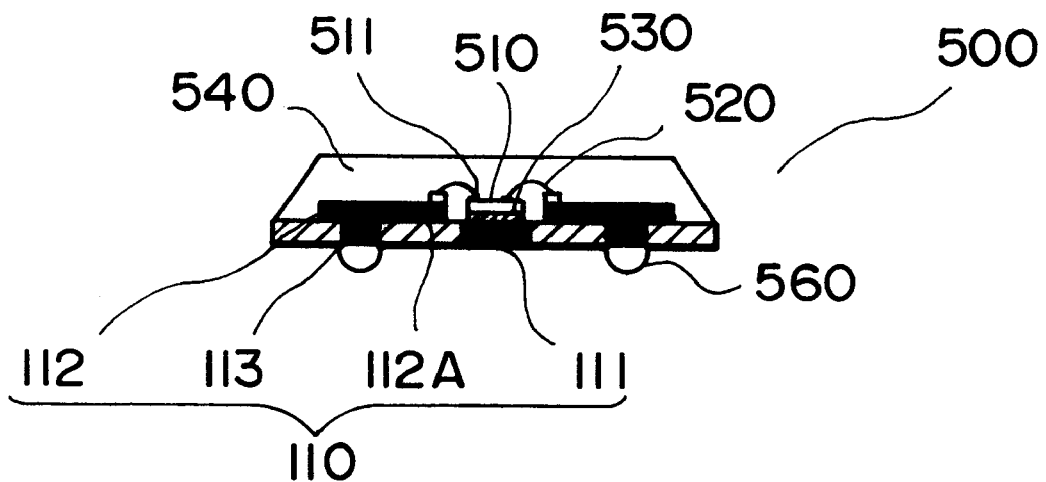
FIG. 28a is a cross-sectional view showing a semiconductor device of Example C6 of the present invention.
Figure 28B:
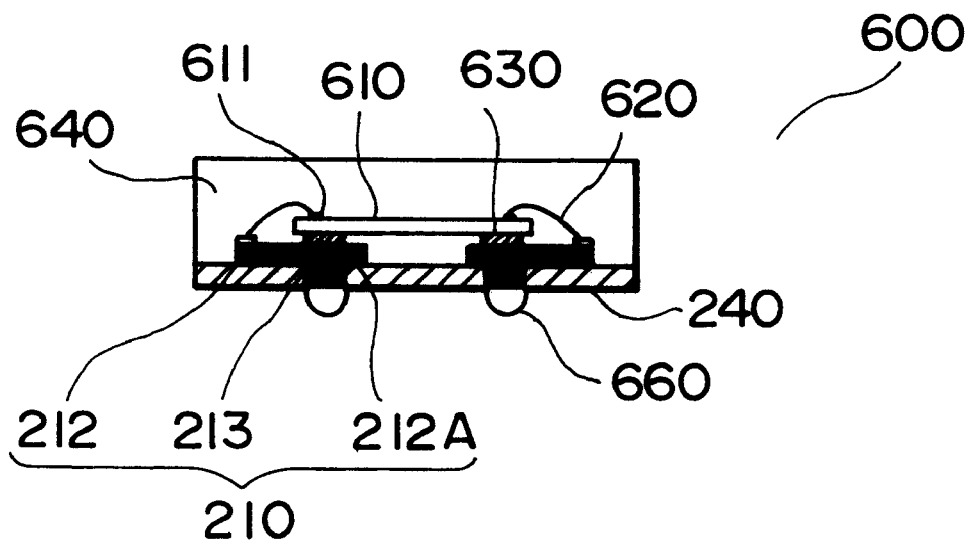
FIG. 28b is a cross-sectional view showing a semiconductor device of Example C7 of the present invention.

A semiconductor device of Example C6 is shown in FIG. 28a, and a semiconductor device of Example C7 is shown in FIG. 28b.

In FIG. 28a, numeral 500 designates a semiconductor device, numeral 110 a circuit section, numeral 111 a die pad, numerals 112 and 112A each a lead, numeral 113 an external terminal section, numeral 510 a semiconductor element, numeral 511 a terminal, numeral 520 a wire, numeral 530 an insulating adhesive layer, numeral 540 a molding resin, and numeral 560 a solder ball.

In the present example, Example C6, a semiconductor device was prepared using the circuit member 100 for a semiconductor device shown in FIG. 22 by the process for producing a semiconductor device shown in FIG. 26. The circuit member 100 prepared by plating was fixed using a molding resin 540, and a solder ball 560 was provided as an external electrode on the external terminal section 113 in its side where no semiconductor element was mounted.

By virtue of use of the circuit member 100 for a semiconductor device, which can be finely fabricated, the semiconductor device 500 of the present example can satisfactorily cope with a tendency toward the adoption of a multi-terminal of semiconductor devices. In addition, the semiconductor device 500, because it was produced by the above production process, has an excellent quality.

On the other hand, in FIG. 28b, numeral 600 designates a semiconductor device, numeral 210 a circuit section, numerals 212 and 212A each a lead, numeral 213 an external terminal section, numeral 610 a semiconductor element, numeral 611 a terminal, numeral 620 a wire, numeral 630 an insulating adhesive layer, numeral 640 a molding resin, and numeral 660 a solder ball.

Figure 25:
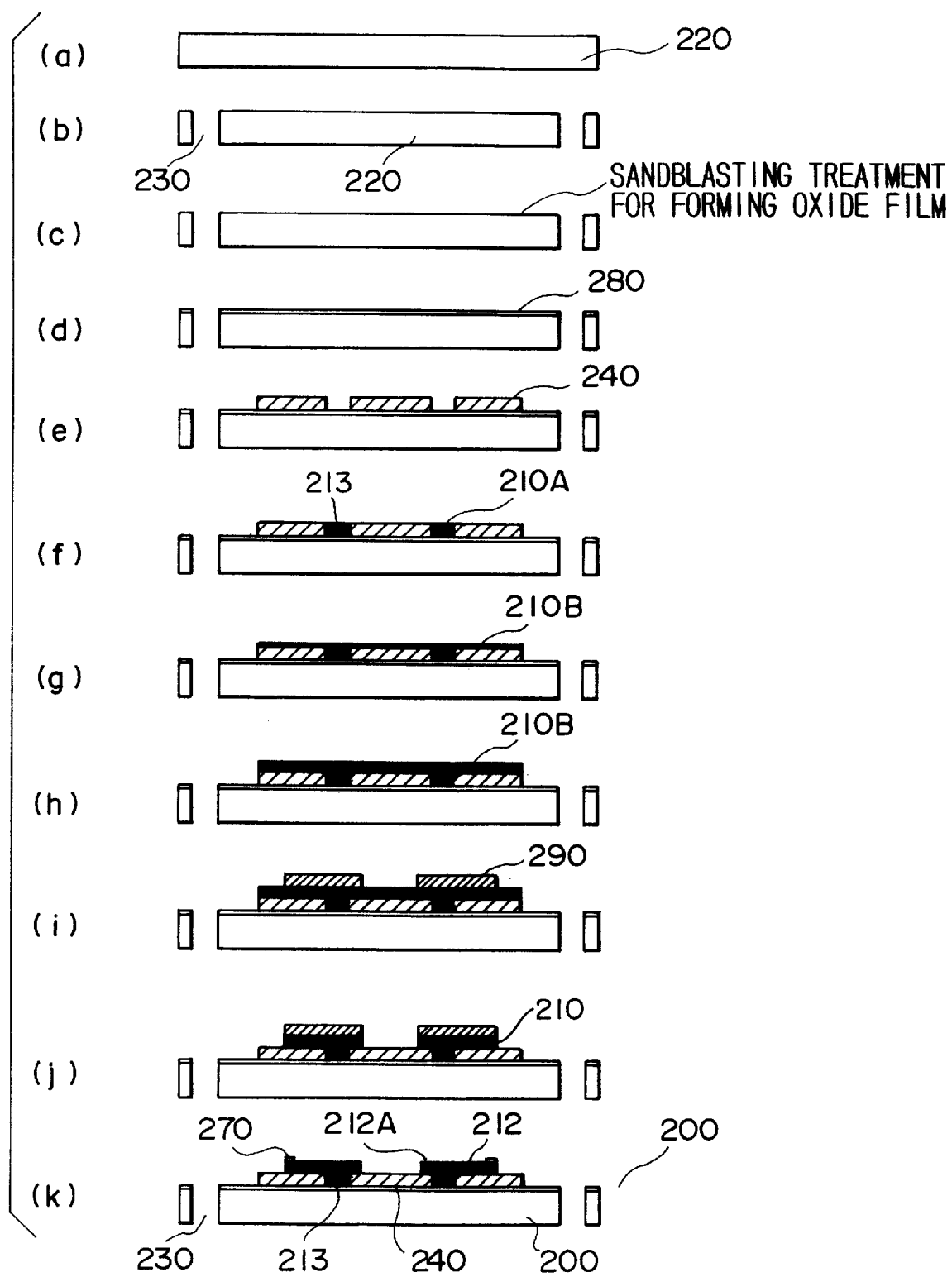
FIG. 25 is a process diagram showing a process for producing a circuit member for a semiconductor device of Example C3 of the present invention.

The semiconductor device of Example C7 was produced by using the circuit member 200 for a semiconductor device shown in FIG. 23 according to the process for producing a semiconductor device shown in FIG. 25.

By virtue of use of the circuit member 200 for a semiconductor device, which can be finely fabricated, the semiconductor device 600 of the present example also can satisfactorily cope with a tendency toward the adoption of a multi-terminal of semiconductor devices. In addition, the semiconductor device 600, because it was produced by the above production process, has an excellent quality.

Examples D1 and D2

FIG. 29a is a simplified plan view showing a first embodiment of the circuit member for a semiconductor device according to the present invention, FIG. 29b is a cross-sectional view taken on line A1–A2 of FIG. 29a, and FIGS. 29c and 29d are diagrams showing the sectional form and layer construction of an external terminal section.

In FIG. 29a, external terminal sections are shown in a reduced number for simplification. Numeral 100 designates a circuit member for a semiconductor device, numeral 110 a circuit section, numeral 113 an external terminal section, numeral 120 a conductive substrate, numeral 123 a substrate, numeral 125 a metal plating, and numeral 128 a jig hole.

The circuit member 100 for a semiconductor device shown in FIG. 29 is a circuit member for a small package and comprises: a conductive substrate 120 comprising a metal plating 125 of copper plating provided on a substrate 123, made of stainless steel (SUS 430), in its one side where a circuit section 110 is provided; and a circuit section 110 comprising a plurality of conductive external terminal sections 113 provided thereon by plating. Further, it has a jig hole 128 for registration in the preparation of a semiconductor device.

The circuit member 100 for a semiconductor device is used in such a manner that a semiconductor element is mounted on the metal plating 125 on the circuit section 110 side of the conductive substrate 120, and the semiconductor element mounted side alone is subjected to plastic molding using a molding resin to prepare a semiconductor device on the conductive substrate 120 and the metal plating 125 is then dissolved and removed to separate the semiconductor device from the conductive substrate 120.

The circuit section 110 of the circuit member for a semiconductor device shown in FIG. 29 comprises a plurality of the external terminal sections 113 which are provided independently of each other and arranged in a two dimensional form along the face of the conductive substrate. If necessary, the circuit section may be constructed so that a plurality of semiconductor elements may be mounted.

The conductive substrate 120 serves to fix the circuit section 110 (that is, a plurality of the external terminal sections 113), and the metal plating 125 of copper or the like is provided on one side thereof. Examples of substrates suitable for this purpose include an iron-nickel-chromium-base metal, an iron-nickel-base metal, and an iron-carbon-base metal.

The purpose of providing the metal plating 125 is such that, after plastic molding is performed to prepare a semiconductor device on the conductive substrate 120, the metal plating is dissolved and removed without dissolving the conductive metal constituting the external terminal section 113 to separate the semiconductor device from the conductive substrate 120.

The external terminal section 113 should not be dissolved when the metal plating 125 on the conductive substrate 120 is dissolved after the plastic molding. Further, the external terminal section should have good wire bondability. The thickness of layers constituting the external terminal section should be suitable for this purpose.

The cross section of the external terminal section 113 may have, for example, an approximately U shape as shown in FIG. 29c or an approximately quadrilateral shape as shown in FIG. 29d1.

As shown in FIG. 29, the external terminal section 113 may have a layer construction wherein a gold layer 113A, a first nickel layer (an electroless plating) 113B, a second nickel layer (an electroplating) 113C, and a palladium layer 113D are provided in that order on the conductive substrate 120. Alternatively, as shown in FIG. 29d2, the external terminal section 113 may have a layer construction wherein a first palladium layer 113E, a nickel layer 113F, and a second palladium layer 113G are provided in that order on the conductive substrate 120.

A plating of a metal selected from copper, nickel, chromium, zinc, and a group of alloys of these metals and the like may be used as the metal plating 125.

The second nickel layer 113C in the construction shown in FIG. 29C1 and the nickel layer 113F in the construction shown in FIG. 29d1 may be replaced with a lead layer or a nickel-palladium alloy layer. Further, silver may be replaced with gold. The layer construction of the external terminal section 113 is not limited to the above one.

In FIG. 29c, the gold layer 113A and the first nickel layer (electroless plating) 113B are an undercoating for the second nickel layer 113C for imparting electrical conductivity. The gold layer 113A functions also as an etching resistant layer (a barrier layer) when the metal plating 125 of the condutive substrate 120 is dissolved.

Further, the gold layer 113A facilitates the preparation of an external electrode of a solder in the preparation of a semiconductor device. The palladium layer 113D imparts wire bondability.

Likewise, in FIG. 29d, the first palladium layer 113E is an undercoating for the nickel layer 113F for imparting electrical conductivity and functions also as an etching resistant layer (a barrier layer) when the metal plating 125 of the condutive substrate 120 is dissolved. Further, the first palladium layer 113E facilitates the preparation of an external electrode of a solder in the production of a semiconductor device.

The second palladium layer 113G imparts wire bondability. The reason why the approximately U shape is used as the sectional form of the external terminal section 113 is that, in the plastic molding in the preparation of a semiconductor device, the adhesion between the external terminal section 113 and the molding resin is improved.

Associated with the first embodiment shown in FIG. 29, Example D1 of the circuit member for a semiconductor device, wherein the cross section of the external terminal section 113 has an approximately U shape, will be described.

In the circuit member for a semiconductor device of Example D1, use is made of a 0.1 mm-thick stainless steel (SUS 430) conductive substrate 120 having a metal plating 125 of copper thereon in its one side where a circuit section 110 (that is, a plurality of the external terminal sections 113) is formed. As shown in FIG. 29c, a gold layer 113A, a first nickel layer (an electroless plating) 113B, a second nickel layer (an electroplating) 113C, and a palladium layer 113D were formed in respective thicknesses of 50 to 100 Å, 0.1 $\mu$m, 5 $\mu$m, and 0.1 $\mu$m in that order on the conductive substrate 120. The cross section of the circuit section has an approximately U shape.

The conductive substrate 120 on its side, where a circuit section 110 is to be formed, has irregularities created by sand blasting which improves the adhesion of the metal plating 125 to the conductive substrate 120.

In Example D1, the overall thickness of the external terminal section 113 is as small as about 5.2 $\mu$m, which can cope with a tendency toward a narrow pitch of the external terminal section 113 and can cope with a tendency toward the adoption of a multi-terminal of semiconductor devices.

The thickness of the metal plating 125 of copper was 2 $\mu$m. It, however, is not particularly limited to this value.

The lowermost layer of the external terminal section 113 is formed of a noble metal. This layer, when the metal plating 125 is dissolved, functions as an etching resistant layer (a barrier layer). On the other hand, the outermost layer of the external terminal section 113 is constituted by a noble metal plating, and the surface of this layer can be used as a wire bonding surface.

Associated with the first embodiment shown in FIG. 29, Example D2 of the circuit member for a semiconductor device, wherein the cross section of the external terminal section 113 has an approximately quadrilateral shape, will be described.

In the circuit member for a semiconductor device of Example D2, use is made of a 0.1 mm-thick stainless steel (SUS 430) conductive substrate 120 having a metal plating 125 of copper thereon in its one side where a circuit section 110 (that is, a plurality of the external terminal sections 113) is formed. As shown in FIG. 29d1, a first palladium layer 113E, a nickel layer 113F, and a second palladium layer 113G were formed in respective thicknesses of 0.1 $\mu$m, 5 $\mu$m, and 0.1 $\mu$m in that order on the conductive substrate 120. The cross section of the circuit section has an approximately quadrilateral shape.

Also in Example D2, the thickness of the metal plating 125 of copper was 2 $\mu$m. It, however, is not particularly limited to this value.

Example D3

FIG. 30a is a simplified plan view showing a second embodiment of the circuit member for a semiconductor device according to the present invention, FIG. 30b is an enlarged cross-sectional view taken on line B1–B2 of FIG. 30a, and FIGS. 30c1 and 30c2 are cross-sectional views taken respectively on lines B3–B4 and B5–B6 of FIG. 30b.

In FIG. 30, leads and external terminal sections are shown in a reduced number for simplification. Numeral 200 designates a circuit member for a semiconductor device, numeral 210 a circuit section, numerals 212 and 212A each a lead, numeral 213 an external terminal section, numeral 220 a conductive substrate, numeral 223 a substrate, numeral 225 a meal plating, numeral 228 a jig hole, and numeral 270 a gold plating.

The circuit member 200 for a semiconductor device shown in FIG. 30 is a circuit member for a BGA type plastic molded type semiconductor device and comprises: a conductive substrate 220 comprising a metal plating 225 of copper plating provided on a conductive substrate 223 in its one side where a circuit section 210 is provided; and a circuit section 210 provided thereon by plating. Further, it has a jig hole 228 for registration in the preparation of a semiconductor device.

As with the circuit member 100 shown in FIG. 29, the circuit member 200 for a semiconductor device is used in such a manner that a semiconductor element is mounted on the metal plating 225 on the circuit section 210 side of the semiconductor substrate 220, and the semiconductor element mounted side alone is subjected to plastic molding using a molding resin to prepare a semiconductor device on the conductive substrate 220 and the metal plating 225 is then dissolved and removed to separate the semiconductor device from the conductive substrate 220.

The circuit section 210 comprises leads 212 and 212A and an external terminal section 213 integrally connected to the leads 212 and 212A, and a plurality of sets of the lead 212, the external terminal section 213, and the lead 212A are provided independently of each other and two-dimensionally arranged along the face of the circuit section 210.

The lead 212A is provided so as to extend inward from the external terminal section 213.

The gold plating section 270, when a semiconductor element is mounted on the circuit section 210, permits the terminal (bump) of the semiconductor element and the circuit section to be electrically connected to each other by wire bonding and is provided at the external front end of the lead 212 extended outward from the external terminal section 213.

In the second embodiment shown in FIG. 30, the external terminal section 213 and the terminal of the semiconductor element are not directly wire bonded, and the front end of the lead 212A is used as a wire bonding region. For this reason, the wire bondability is required of the wire bonding region alone at the front end of the lead 212A. For example, as shown in FIG. 30*b*, the gold plating 270 is separately provided at the front end of the lead 212A, and, as shown in FIG. 30*c*1, the layer construction of the circuit section 210 is made such that a gold layer 210A, a nickel layer 210B, a copper layer 210C, and a nickel layer 210D are provided in that order on a metal plating 225 provided on the conductive substrate 220. Alternatively, the gold plating 270 shown in FIG. 30*b* may not be provided, and the layer construction of the whole circuit section 210 may be such that, as shown in FIG. 30*d*, a gold layer 210A, a nickel layer 210B, a copper layer 210C, a nickel layer 210D, and a gold 210E are provided in that order on the metal plating of the conductive substrate 220.

The circuit section 210 should not be dissolved when the metal plating 225 on the conductive substrate 220 is dissolved after the plastic molding.

A noble metal plating, such as a silver plating, may be used instead of the gold plating 270.

As with the first embodiment shown in FIG. 29, the purpose of providing the metal plating 225 is such that, after plastic molding is performed to prepare a semiconductor device on the conductive substrate 220, the metal plating is dissolved and removed without dissolving the conductive metal constituting the external terminal section 213 to separate the semiconductor device from the conductive substrate 220.

In the second embodiment shown in FIG. 30, Example D3will be described wherein, as shown in FIG. 30*b*, a gold plating 270 is provided and the layer construction of the circuit section is as shown in FIG. 30*c*1.

The circuit member for a semiconductor device of Example D3 is a circuit member for BGA, and use is made of a 0.1 mm-thick stainless steel (SUS 430) conductive substrate 220 having a metal plating 225 of copper thereon in its one side where a circuit section 210 is formed. As shown in FIG. 30*c*1, a gold layer 210A, a nickel layer 210B, a copper layer 210C, and a nickel layer 210D were formed in respective thicknesses of 50 to 100 Å, 5 $\mu$m, 15 $\mu$m, and 5 $\mu$m in that order on the metal plating 225 of the conductive substrate 220. The thickness of the circuit section 210, such as the external terminal section 213, is about 25 $\mu$m as a whole, and, as shown in FIG. 30*b*, a gold plating is separately provided in the wire bonding section at the front end of the lead 212A.

Figure 30D:
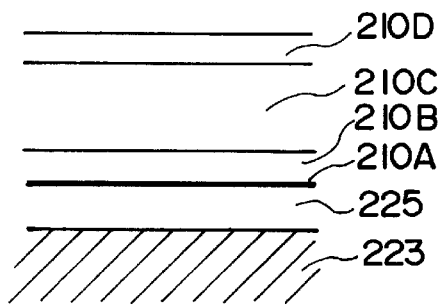
Figure 30D:
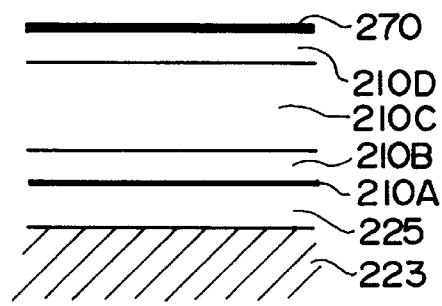
Figure 30D:
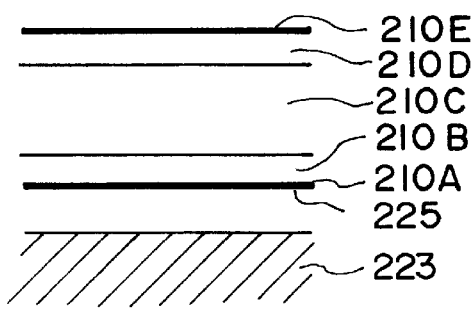

FIG. 30*d* is a cross-sectional view of a variant of Example D3 shown in FIG. 30. As shown in FIG. 30*d*, a circuit member 210 comprises a conductive substrate 220 having a metal plating 225; a gold layer 210A, a nickel layer 210B, a copper layer 210C, a nickel layer 210D, and a gold layer 210E provided in respective thicknesses of 50 to 100 Å, 5 $\mu$m, 15 $\mu$m, and 5 $\mu$m in that order on the metal plating 225; and an about 50 to 100 Å-thick gold layer provided on the whole surface thereof. This construction is different from that in Example D3 wherein a gold plating is separately provided on the lead 212A in its front end alone.

Examples D4 and D5

FIG. 31*a* is a simplified plan view showing a third embodiment of the circuit member for a semiconductor device according to the present invention, FIG. 31*b* is an enlarged cross-sectional view taken on line C1–C2 of FIG. 31*a*, and FIG. 31*c* is a cross-sectional view taken on line C3–C4 of FIG. 31*b*.

In FIG. 31*a*, leads and external terminal sections are shown in a reduced number for simplification. Numeral 400 designates a circuit member for a semiconductor device, numeral 410 a circuit section, numeral 411 a die pad, numeral 412 a lead, numeral 413 an external terminal section, numeral 420 a conductive substrate, numeral 423 a substrate, numeral 425 a metal plating, numeral 428 a jig hole, and numeral 440 an insulating layer.

In the circuit member 410 according to the third embodiment shown in FIG. 31, as shown in FIG. 31*b* (cross-sectional view), the external terminal section 413 is formed directly on the conductive substrate 420 by plating, and the lead 412 is formed on the insulating layer 440 through the insulating layer 440 provided directly on the conductive substrate 420 so as to exclude the external terminal section forming area.

In FIG. 31, a die pad is provided in order to mount a semiconductor element thereon. If necessary, the construction may be such that no die pad is provided.

The layer construction of the circuit section 410 may be such that, as shown in FIG. 31*c*, in the lead 412, an electroless nickel plating 410A, a gold layer 410B, a copper layer 410C, a nickel layer 410D, and a gold layer 410E are provided in that order through the insulating layer 440 on the metal plating of the conductive substrate 220.

The circuit section 410 should be such that the external terminal section 413 does not dissolve when, after plastic molding is performed, the metal plating 425 of the conductive substrate 420 is dissolved.

As with Example D1 shown in FIG. 29 and Example D2 shown in FIG. 30, the purpose of providing the metal plating 425 is such that, after plastic molding is performed to prepare a semiconductor device on the conductive substrate 420, the metal plating is dissolved and removed without dissolving the conductive metal constituting the external terminal section 413 to separate the semiconductor device from the conductive substrate 420.

In the third embodiment shown in FIG. 31, Example D4 of the circuit member for a semiconductor device will be described.

The circuit member for a semiconductor device of Example D4 is a circuit member for BGA, and use is made of a 0.1 mm-thick stainless steel (SUS 430) conductive substrate 420 having a metal plating 425 of copper thereon in its one side where a circuit section 410 is formed. After an insulating layer 440 having a predetermined shape is formed on the conductive substrate 420, a gold layer, a copper layer, a nickel layer, and a gold layer are formed by electroplating in that order on the electroless plating (460 in FIG. 35).

In the lead section 412, as shown in FIG. 31c, an electroless nickel layer 410A, a gold layer 410B, a copper layer 410C, a nickel layer 410D, and a gold layer 410E are provided in respective thicknesses of 2 $\mu$m, 5 to 100 Å, 15 $\mu$m, 2 $\mu$m, and 5 to 100 Å in that order through an insulating layer 440 on the metal plating 425 of the conductive substrate 420. The thickness of the lead section is as large as about 20 $\mu$m. The external terminal section 413 is thickly formed by the insulating layer 440. The insulating layer 440 is an epoxy resin layer having a thickness of 40 $\mu$m.

In the third embodiment shown in FIG. 31, Example D5 of the circuit member 400 for a semiconductor device produced in the production process shown in FIG. 36 below has the same layer construction as Example D4 in the lead section. An electroless nickel layer 410A, a gold layer 410B, a copper layer 410C, a nickel layer 410D, and a gold layer 410E are provided in respective thicknesses of 1 $\mu$m, 5 to 100 Å, 15 $\mu$m, 2 $\mu$m, and 5 to 100 Å.

Example D6

Example D6 demonstrates the process for producing the circuit member for a semiconductor device of Example D1 and will be described with reference to FIG. 32.

Previously, a 0.1 mm-thick stainless steel (SUS 430) conductive substrate 123 was provided (FIG. 32a), a jig hole 128 for registration was provided (FIG. 32b), the substrate 123 on its side where a circuit section is to be formed was surface treated by sand blasting to create irregularities (FIG. 32c), and a metal plating 125 constituted by a 2 $\mu$m-thick copper plating was formed on the substrate 123 on its circuit section forming side (FIG. 32d).

Subsequently, a dry film resist 140 was provided on the conductive substrate 120 on its circuit section forming side, and the whole surface of the dry film resist 140 was coated with a water-repellent (FC 722 manufactured by Sumitomo 3M Ltd.), exposure was performed using a plate having a predetermined pattern, and the plate was subjected to treatment such as development to expose the external terminal section forming area (FIG. 32e).

The exposed external terminal section forming area (corresponding to an opening 141 of the resist 140) was plated (FIG. 32f).

FIGS. 32f1 and 32f2 show the sectional form in the course of the plating in D0 shown in FIG. 32f.

Specifically, at the outset, a 50 to 100 Å-thick first gold layer 113A was provided on a metal plating 125 by electroplating, the exposed external terminal section forming area (corresponding to an opening 141 of the resist 140) was catalytically activated, and a 0.1 $\mu$m-thick first nickel layer 113B was electrolessly plated (FIG. 32f1).

Since the dry film resist 140 has been treated for rendering the surface water-repellent, the electroless nickel plating is not adhered. Therefore, as shown in FIG. 32f1, the first nickel layer 113B was formed in U shape in section.

Thereafter, a 5 $\mu$m-thick second nickel layer and a 0.1 $\mu$m-thick palladium layer were then electroplated in that order (FIG. 32f2).

A second nickel layer 113C and a palladium layer 113D were then successively electroplated along the shape of the nickel layer 113B provided in U shape in section. Therefore, the laminate thus formed also has an approximately U shape in section.

Subsequently, the dry film resist 140 was removed to prepare a circuit member, for a semiconductor device shown in FIG. 29, having an external terminal section 113 with the section having an approximately U shape (FIG. 32g).

According to the present example, the step of providing a noble metal plating, for wire bonding, on a wire bonding face of the external terminal section 113 can be incorporated into the step of preparing the external terminal section 113.

Example D7

Example D7 of the process for producing a semiconductor device according to the present invention will be described with reference to FIG. 33.

The present example demonstrates a process for producing a circuit member for a semiconductor device shown in FIG. 29 wherein the external terminal section has an approximately quadrilateral sectional form as shown in FIG. 29d.

Previously, a conductive substrate 123 made of stainless steel (SUS 430) was provided (FIG. 33a), the substrate 123 on its side where a circuit section is to be formed was surface treated to create surface irregularities by sand blasting (FIG. 33b), and a metal plating constituted by a copper plating was formed on the substrate 123 on its circuit section forming side (FIG. 33c).

Subsequently, a dry film resist 170 was provided on the conductive substrate 120 on its circuit section forming side, exposure was performed using a plate having a predetermined pattern, and the plate was subjected to treatment such as development to expose the external terminal section forming area (corresponding to an opening 171) and a jig hole forming area for registration (corresponding to an opening 171A) (FIG. 33d).

ALPHO NCP 240 having a thickness of 40 $\mu$m manufactured by Nippon Synthetic Chemical Industry Co., Ltd. was used as the dry film resist 170.

Only the external terminal section forming area 171A exposed in the preparation of a plate of the dry FILM resist 170 was then masked with a resin 190 soluble in a weak alkali so that this area is not removed by etching for forming a jig hole (FIG. 33e).

Etching was then performed with a ferric chloride solution to form a jig hole 128 (FIG. 33f).

Thereafter, the resin 190 in the external terminal section forming area was dissolved and removed by sodium carbonate (FIG. 33g), and the external terminal section forming area (corresponding to an opening 171) was plated (FIG. 33h).

FIGS. 33h1 and 33h2 show the sectional form in the course of plating in E0 of FIG. 33h.

Specifically, at the outset, a 0.1 µm-thick first palladium layer 113E was provided by electroplating on the metal plating 125 (FIG. 33h1).

A 5 µm-thick nickel layer 113F and a 50.1 µm-thick second palladium layer 113G were then provided in that order by electroplating (FIG. 33h2).

The laminated circuit section has an approximately quadrilateral sectional form as shown in FIG. 33h2.

The dry film resist 170 was then removed to prepare a circuit member for a semiconductor device shown in FIG. 29 (FIG. 33i).

Example D8

Example D8 of the process for producing a semiconductor device according to the present invention will be described with reference to FIG. 34.

The present example demonstrates a process for producing a circuit member 200 for a semiconductor device of Example D2 shown in FIG. 30, wherein the whole circuit section 210 is formed directly by plating on a metal plating 225 of a conductive substrate 220.

Previously, a 0.1 mm-thick stainless steel (SUS 430) conductive substrate 223 was provided (FIG. 34a), a jig hole 228 for registration was provided (FIG. 34b), the substrate 223 on its side where a circuit section is to be formed was surface treated by sand blasting to create irregularities (FIG. 34c), and a metal plating 225 constituted by a 2 µm-thick copper plating was formed on the substrate 223 on its circuit section forming side (FIG. 34d).

Subsequently, a dry film resist 240 was provided on the conductive substrate 220 on its circuit section forming side, exposure was performed using a plate having a predetermined pattern, and the plate was subjected to treatment such as development to expose the circuit section forming area 241 (FIG. 34f).

ALPHO NCP 240 having a thickness of 40 µm manufactured by Nippon Synthetic Chemical Industry Co., Ltd. was used as the dry film resist 240.

Thereafter, the exposed circuit section forming area (corresponding to an opening 241 of a resist 240) was plated (FIG. 34g).

FIGS. 34g1, 34g2, and FIG. 34g3 show the sectional form in the course of plating in F0 of FIG. 34g.

Specifically, a 50 to 100 Å-thick gold plating 210A was first provided on the metal plating 225 (FIG. 34g1), and a 5 µm-thick first nickel layer 210B, a 15 µm-thick copper layer 210C, and a 5 µm-thick second nickel layer 210D were electroplated thereon in that order (FIG. 34g2).

The laminated circuit section thus formed has an approximately quadrilateral sectional form as shown in FIG. 34g2.

The dry film resist 240 was then removed, and the front end of the lead was plated with gold to prepare a circuit member for a semiconductor device (FIG. 34h).

In FIG. 34g, after the step shown in FIG. 34g2, a 50 to 100 Å-thick gold layer 210E may be subsequently electroplated on the whole circuit section (FIG. 34g3) followed by removal of the dry film resist 240 to prepare a variant of the circuit member for a semiconductor device of the present example, that is, Example D8.

Further, the production process shown in FIG. 32 also can provide a circuit member which has a flat shape as shown in FIG. 30a with the cross section having an approximately U shape as shown in FIG. 29c.

Example D9

Example D9 demonstrates a process for producing a circuit member 400 for a semiconductor device of Example D4 shown in FIG. 31.

Previously, a 0.1 mm-thick stainless steel (SUS 430) conductive substrate 423 was provided (FIG. 35a), a jig hole 428 for registration was provided, the substrate 423 on its side where a circuit section is to be formed was surface treated by sand blasting to create irregularities (FIG. 35b), and a metal plating 425 constituted by a 2 µm-thick copper plating was formed on the substrate 423 on its circuit section forming side (FIG. 35c).

A 40 µm-thick insulating layer 440 formed of an epoxy resin was coated by screen printing on the metal plating 425 of the conductive substrate 420 so that the external terminal section forming area and the die pad forming area were exposed (FIG. 35d).

A 2 µm-thick electroless nickel plating 460 was then provided on the conductive substrate in its side where the insulating layer 440 was formed (FIG. 35e).

A plate was then prepared using a dry film resist 470 on the electroless nickel plating 460 so that the circuit section forming area was exposed (FIG. 35f).

The exposed circuit section forming area was electroplated with a gold layer, a copper layer, a nickel layer, and a gold layer in respective thicknesses of 0.005 to 0.01 mm, 15 µm, 2 µm, and 0.005 to 0.01 mm in that order to provide an electroplating 470 (FIG. 35g).

The dry film resist 470 was then removed (FIG. 35h).

Thereafter, the exposed electroless nickel plating 460 was removed by etching to prepare a circuit member for a semiconductor device (FIG. 35i).

FIG. 35i1 shows a circuit section (a black solid) constituted by the electroless plating 460 and the electroplating 470 of FIG. 35i and has substantially the same shape as FIG. 31b.

Example D10

Example D10 demonstrates a process for producing a circuit member for a semiconductor device of Example D5 shown in FIG. 31, wherein the sectional form is as shown in FIG. 31b.

Previously, a 0.1 mm-thick stainless steel (SUS 430) conductive substrate 423 was provided (FIG. 36a), a jig hole 428 for registration was provided, the substrate 423 on its side where a circuit section is to be formed was surface treated by sand blasting to create irregularities (FIG. 36b), and a metal plating 425 constituted by a 2 µm-thick copper plating was formed on the substrate 423 on its circuit section forming side (FIG. 36c).

A 40 µm-thick insulating layer 440 formed of an epoxy resin was coated by screen printing on the metal plating 425 of the conductive substrate 420 so that the external terminal section forming area and the die pad forming area were exposed (FIG. 36d).

The conductive substrate 420 on its whole side provided with the insulating layer 440 formed of an epoxy resin was covered with a dry film resist 470, the resist 470 was treated for the surface water-repellent, and a plate was prepared so that the circuit section forming area was exposed (FIG. 36*e*).

After catalytic activation, a 1 μm-thick electroless nickel plating 460 was provided on the exposed areas, that is, the metal plating 425 of the conductive substrate 420 and the insulating layer 440 (FIG. 36*f*).

The exposed electroless nickel plating 460 of the circuit section forming area was electroplated with a gold layer, a copper layer, a nickel layer, and a gold layer in respective thicknesses of 0.005 to 0.01 mm, 15 μm, 2 μm, and 0.005 to 0.01 mm in that order to provide an electroplating 465 (FIG. 36*g*).

The dry film resist 470 was then removed to prepare a circuit member for a semiconductor device (FIG. 36*h*).

FIG. 36*h*1 shows a circuit section (a black solid) constituted by the electroless plating 460 and the electroplating 470 of FIG. 36*h* and has substantially the same shape as FIG. 31*b*.

The process for producing a circuit member for a semiconductor device of Example D9 shown in FIG. 35 and the process for producing a circuit member for a semiconductor device of Example D10 shown in FIG. 36 can be applied also to a circuit board for a semiconductor device wherein a conductive substrate 423 alone is used without the metal plating 425 in the conductive substrate 420 and the circuit section forming side is subjected to release treatment to impart releasability. The term "release treatment" used herein refers to not only surface treatment for creating irregularities on the conductive substrate 423 on its circuit section forming side but also release treatment, such as formation of an oxide film, after the surface treatment.

Example D11

Example D11, which demonstrates a process for producing a semiconductor device using the circuit member 100, for a semiconductor device according to the present invention, shown in FIG. 29, will be described with reference to FIG. 37.

At the outset, a circuit member 100 for a semiconductor device was provided (FIG. 37*a*), a semiconductor element 710 was die-attached on the exposed metal plating 125 in a conductive substrate 120 so that the terminal 711 side faced upward, and the terminal 711 was wire bonded onto the top surface of the external terminal section 113 (FIG. 37*b*).

Subsequently, the conductive substrate 120 on its one side was subjected to plastic molding using a molding resin 730 so as to cover the semiconductor element 710, the wire 720, and the external terminal section 113 in their entirety, thereby preparing a semiconductor device 700A on one side of the conductive substrate 120 (FIG. 37*c*).

The metal plating 125 was then dissolved to release the semiconductor device 700A from the substrate 123 (FIG. 37*d*), thereby separating the semiconductor device 700A and the substrate 123 from each other (FIG. 37*d*1).

Thereafter, a solder ball 740 was provided so as to be integrally connected to the exposed external terminal section 113 in the circuit section 110 of the semiconductor deice 700A, thereby preparing a semiconductor device 700 (FIG. 37*e*).

Examples D12 to D14

Examples D12 to D14 of the semiconductor device according to the present invention will be described.

A semiconductor device can be produced using any of the circuit member 200 for a semiconductor device shown in FIG. 30 and the circuit member 400 for a semiconductor device shown in FIG. 31 fundamentally by the process shown in FIG. 37.

The process for producing a semiconductor device shown in FIG. 37 can provide semiconductor devices of Examples D12, D13, and D14 shown respectively in FIGS. 38*a*, 38*b*, and 38*c*.

FIG. 38*a* shows a semiconductor device using the circuit member for a semiconductor device shown in FIG. 29, and FIG. 38*b* shows a semiconductor device using the circuit member for a semiconductor device of Example D3 shown in FIG. 30.

FIG. 38*c* shows a semiconductor device using a circuit member for a semiconductor device of Example D4 or D5 shown in FIG. 31. In these semiconductor devices, a solder ball 740 is provided so as to be integrally connected to the external terminal section exposed from the molding resin 730.

What is claimed is:

1. A circuit member for a semiconductor device, comprising: a conductive substrate; and a circuit section and the like at least two-dimensionally formed using a conductive metal by plating on the conductive substrate, characterized in that at least a part of the conductive metal constituting the circuit section is provided by plating on at least one side of the conductive substrate after subjecting the one side of the conductive substrate to surface treatment to create irregularities and to release treatment to impart releasability.

2. The circuit member for a semiconductor device according to claim 1, characterized in that the circuit section comprises at least a die pad section for mounting a semiconductor element thereon, a lead for electrical connection to a semiconductor element, and an external terminal for electrical connection to an external circuit and a plurality of sets of the lead and the external terminal section integrally connected to each other are provided independently of each other.

3. The circuit member for a semiconductor device according to claim 2, characterized in that the two-dimensionally formed circuit section in its entirety has been formed directly on one side of the conductive substrate by plating.

4. The circuit member for a semiconductor device according to claim 2, characterized in that only the die pad section and the external terminal section in the circuit section have been formed directly on one side of the conductive substrate by plating with the other sections in the circuit section having been formed through an insulating resist.

5. The circuit member for a semiconductor device according to claim 1, characterized in that the surface treatment is sand blasting.

6. The circuit member for a semiconductor device according to claim 1, characterized in that the release treatment is a treatment for forming an oxide film on the surface of the conductive substrate.

7. The circuit member for a semiconductor device according to claim 1, characterized in that a plurality of semiconductor devices can be mounted.

8. The circuit member for a semiconductor device according to claim 1, characterized in that the conductive substrate is made of an iron-nickel-chromium-base metal, an iron-chromium-base metal, an iron-nickel-base metal, or an iron-carbon-base metal and the conductive metal plating is either copper plating or copper plating using nickel as a substrate.

9. A process for producing a circuit member, for a semiconductor device, comprising: a conductive substrate; and a circuit section in its entirety two-dimensionally formed directly on one side of the conductive substrate by plating, said process being characterized by comprising, in sequence, at least the steps of: (A) surface-treating at least one side of the conductive substrate to provide irregularities; (B) subjecting the conductive substrate on its at least one side with irregularities provided thereon to release treatment for imparting releasability; (C) coating a resist on the conductive substrate on its one side subjected to the surface treatment and the release treatment and exposing only an area to be plated with a conductive metal to prepare a plate; and (D) plating the plate on its exposed area with a conductive metal.

10. The process for producing a circuit member for a semiconductor device according to claim 9, characterized in that the conductive substrate is made of an iron-nickel-chromium-base metal, an iron-chromium-base metal, an iron-nickel-base metal, or an iron-carbon-base metal and the conductive metal plating is either copper plating or copper plating using nickel as a substrate.

11. A process for producing a circuit member, for a semiconductor device, comprising: a conductive substrate; and a circuit section in its entirety two-dimensionally formed directly on one side of the conductive substrate by plating, said process being characterized by comprising, in sequence, at least the steps of: (G) surface-treating at least one side of the conductive substrate to provide irregularities; (H) subjecting the conductive substrate on its one side with irregularities provided thereon to release treatment for imparting releasability; (I) plating the conductive substrate on its whole surface subjected to the surface treatment and the release treatment with a conductive metal; (J) coating a resist on the surface of the plating and treating the coating so as to cover an area where a circuit section and the like are formed, thereby preparing a plate; and (K) performing etching so as to pass through the section plated with a conductive metal to form a circuit section and the like.

12. The process for producing a circuit member for a semiconductor device according to claim 11, characterized in that the conductive substrate is made of an iron-nickel-chromium-base metal, an iron-chromium-base metal, an iron-nickel-base metal, or an iron-carbon-base metal and the conductive metal plating is copper plating.

13. The process for producing a circuit member for a semiconductor device according to claim 9, characterized in that the step of forming a jig hole for registration is carried out before the preparation of the plate.

14. The process for producing a circuit member for a semiconductor device according to claim 9, characterized in that the step of forming a jig hole is etching using a resist plate.

15. A process for producing a circuit member, for a semiconductor device, comprising: a conductive substrate; and a circuit section and the like two-dimensionally formed using a conductive metal by plating on the conductive substrate, the circuit section comprising at least a die pad section for mounting a semiconductor element thereon, a lead for electrical connection to a semiconductor element, and an external terminal section for electrical connection to an external circuit, a plurality of sets of the lead and the external terminal section integrally connected to each other being provided independently of each other, only the die pad section and the external terminal section in the circuit section having been formed directly on one side of the conductive substrate by plating with the other sections in the circuit section having been formed through an insulating resist, said process being characterized by comprising, in sequence, at least the steps of: (a) surface-treating one side of the conductive substrate to provide irregularities thereon; (b) subjecting the conductive substrate on its at least one side with irregularities provided thereon to release treatment for imparting releasability; (c) coating a first insulating resist on the conductive substrate on its one side subjected to the surface treatment and the release treatment and exposing only a die pad section and external terminal section forming area by plating to prepare a plate; (d) subjecting the plate on its exposed area to first plating with a conductive metal by electroplating; (e) coating a second insulating resist on the surface of the first plating and exposing only an area where a circuit section is to be prepared by plating; and (f) subjecting the plate on its exposed area to second plating with a conductive metal by electroplating or electroless plating.

16. A process for producing a circuit member, for a semiconductor device, comprising: a conductive substrate; and a circuit section and the like two-dimensionally formed using a conductive metal by plating on the conductive substrate, the circuit section comprising at least a die pad section for mounting a semiconductor element thereon, a lead for electrical connection to a semiconductor element, and an external terminal section for electrical connection to an external circuit, a plurality of sets of the lead and the external terminal section integrally connected to each other being provided independently of each other, only the die pad section and the external terminal section in the circuit section having been formed directly on one side of the conductive substrate by plating with the other sections in the circuit section having been formed through an insulating resist, said process being characterized by comprising, in sequence, at least the steps of: (g) surface-treating at least one side of the conductive substrate to provide irregularities thereon; (h) subjecting the conductive substrate on its at least one side with irregularities provided thereon to release treatment for imparting releasability; (i) coating a first insulating resist on the conductive substrate on its at least one side subjected to the surface treatment and the release treatment and exposing only a die pad section and external terminal section forming area by plating to prepare a first plate; (j) subjecting the plate on its exposed area to first plating with a conductive metal by electroplating; (k) subjecting the whole surface on the first plating side to second plating with a conductive metal by electroless plating; (l) covering the plating, prepared by electroless plating, in its area where a circuit section is formed, thereby preparing a second plate; and (m) removing the area, exposed in the step of preparing the plate, by etching.

17. The process for producing a circuit member for a semiconductor device according to claim 15, characterized in that the conductive substrate is made of an iron-nickel-chromium-base metal, an iron-chromium-base metal, an iron-nickel-base metal, or an iron-carbon-base metal and the conductive metal plating in the step of the first plating is either copper plating or copper plating using nickel as a substrate and the conductive metal plating in the step of the second plating is copper plating.

18. The process for producing a circuit member for a semiconductor device according to claim 9, characterized in that the surface treatment is sand blasting.

19. The process for producing a circuit member for a semiconductor device according to claim 9, characterized in that the release treatment is a treatment for forming an oxide film on the surface of the conductive substrate.

20. A process for producing a semiconductor device using a circuit member, for a semiconductor device, comprising: a conductive substrate; and a circuit section and the like at least two-dimensionally formed using a conductive metal by plating on the conductive substrate, the circuit section comprising at least a die pad section for mounting a semiconductor element thereon, a lead for electrical connection to a semiconductor element, and an external terminal section for electrical connection to an external circuit, a plurality of sets of the lead and the external terminal section integrally connected to each other being provided independently of each other, the whole circuit section having been formed directly on one side of the conductive substrate by plating, said process being characterized by comprising, in sequence, at least the steps of: (i) mounting a semiconductor element, with the terminal facing upward, on a die pad provided on a conductive substrate and wire-bonding the terminal of the semiconductor element to a lead; (ii) subjecting one side of the lead member, for a semiconductor device, to plastic molding so as to cover the semiconductor element, the wire, and the circuit section of the lead member for a semiconductor device in their entirety; and (iii) removing the conductive substrate in the lead member for a semiconductor device.

21. The process for producing a semiconductor device according to claim 20, characterized by further comprising, after the step of removing the substrate, (iv) the step of coating a solder resist on the surface, exposed by removing the substrate, of the circuit section remote from the surface, with the semiconductor element mounted thereon, so as to expose only the external terminal section of the circuit section and (v) the step of attaching a solder ball to the external terminal section exposed from the solder resist.

22. A process for producing a semiconductor device using a circuit member, for a semiconductor device, comprising: a conductive substrate; and a circuit section and the like at least two-dimensionally formed using a conductive metal by plating on the conductive substrate, the circuit section comprising at least a die pad section for mounting a semiconductor element thereon, a lead for electrical connection to a semiconductor element, and an external terminal section for electrical connection to an external circuit, a plurality of sets of the lead and the external terminal section integrally connected to each other being provided independently of each other, only the die pad section and the external terminal section in the circuit section having been formed directly on one side of the conductive substrate by plating with the other sections in the circuit section having been formed through an insulating resist, said process being characterized by comprising, in sequence, at least the steps of: (vi) mounting a semiconductor element, with the terminal facing upward, on a die pad provided on a conductive substrate and wire-bonding the terminal of the semiconductor element to a lead; (vii) subjecting one side of the lead member, for a semiconductor device, to plastic molding so as to cover the semiconductor element, the wire, and the circuit section of the lead member for a semiconductor device in their entirety; and (viii) removing the conductive substrate in the lead member for a semiconductor device.

23. The process for producing a semiconductor device according to claim 22, characterized by further comprising, after the step of removing the substrate, (ix) the step of attaching a solder ball to the exposed external terminal section.

24. A semiconductor device characterized by being produced by the process for producing a semiconductor device according to claim 20.

25. A circuit member for a semiconductor device, characterized by comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, at least a part of the conductive metal constituting the circuit section and the like being provided by plating on at least one side of the conductive substrate after subjecting the one side of the conductive substrate to surface treatment to create irregularities and to release treatment to impart releasability.

26. A circuit member for a semiconductor device according to claim 25, characterized in that the two-dimensionally formed circuit section in its entirety has been formed directly on one side of the conductive substrate by plating.

27. The circuit member for a semiconductor device according to claim 25, characterized in that only the external terminal section in the circuit section has been formed directly on one side of the conductive substrate by plating with the other sections in the circuit section having been formed through an insulating resist.

28. The circuit member for a semiconductor device according to claim 25, characterized in that the surface treatment is sand blasting.

29. The circuit member for a semiconductor device according to claim 25, characterized in that the release treatment is a treatment for forming an oxide film on the surface of the conductive substrate.

30. The circuit member for a semiconductor device according to claim 25, characterized in that a plurality of semiconductor elements can be mounted.

31. The circuit member for a semiconductor device according to claim 25, characterized in that the conductive substrate is made of an iron-nickel-chromium-base metal, an iron-chromium-base metal, an iron-nickel-base metal, or an iron-carbon-base metal and the conductive metal plating is either copper plating or copper plating using nickel as a substrate.

32. A process for producing a circuit member, for a semiconductor device, comprising: a conductive substrate; and a circuit section in its entirety two-dimensionally formed directly on one side of the conductive substrate by plating, the circuit section having no die pad section for mounting a semiconductor element thereon, said process being characterized by comprising, in sequence, at least the steps of: (A) surface-treating at least one side of the conductive substrate to provide irregularities; (B) subjecting the conductive substrate on its at least one side with irregularities provided thereon to release treatment for imparting releasability; (C) coating a resist on the conductive substrate on its at least one side subjected to the surface treatment and the release treatment and exposing only an area to be plated with a conductive metal to prepare a plate; and (D) plating the plate on its exposed area with a conductive metal.

33. The process for producing a circuit member for a semiconductor device according to claim 32, characterized in that the conductive substrate is made of an iron-nickel-chromium-base metal, an iron-chromium-base metal, an iron-nickel-base metal, or an iron-carbon-base metal and the conductive metal plating is either copper plating or copper plating using nickel as a substrate.

34. A process for producing a circuit member, for a semiconductor device, comprising: a conductive substrate; and a circuit section in its entirety two-dimensionally formed directly on one side of the conductive substrate by plating, the circuit section having no die pad section for mounting a semiconductor element thereon, said process being characterized by comprising, in sequence, at least the steps of: (G) surface-treating at least one side of the conductive substrate to provide irregularities; (H) subjecting the conductive substrate on its at least one side with irregularities provided thereon to release treatment for imparting releasability; (I) plating the conductive substrate on its whole surface subjected to the surface treatment and the release treatment with a conductive metal; (J) coating a resist on the surface of the plating and treating the coating so as to cover only an area where a circuit section and the like are formed, thereby preparing a plate; and (K) performing etching so as to pass through the section plated with a conductive metal to form a circuit section and the like.

35. The process for producing a circuit member for a semiconductor device according to claim 34, characterized in that the conductive substrate is made of an iron-nickel-chromium-base metal, an iron-chromium-base metal, an iron-nickel-base metal, or an iron-carbon-base metal and the conductive metal plating is copper plating.

36. The process for producing a circuit member for a semiconductor device according to claim 32, characterized in that the step of forming a jig hole for registration is carried out before the preparation of the plate.

37. The process for producing a circuit member for a semiconductor device according to claim 32, characterized in that the step of forming a jig hole is etching using a resist plate.

38. A process for producing a circuit member, for a semiconductor device, comprising: a conductive substrate; and a circuit section and the like two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, only the external terminal section in the circuit section having been formed directly on one side of the conductive substrate by plating with the other sections in the circuit section having been formed through an insulating resist, said process being characterized by comprising, in sequence, at least the steps of: (a) surface-treating at least one side of the conductive substrate to provide irregularities thereon; (b) subjecting the conductive substrate on its at least one side with irregularities provided thereon to release treatment for imparting releasability; (c) coating a first insulating resist on the conductive substrate on its at least one side subjected to the surface treatment and the release treatment and exposing only an external terminal section forming area to prepare a plate; (d) subjecting the plate on its exposed area to first plating with a conductive metal by electroplating; (e) coating a second insulating resist on the surface of the first plating and exposing only an area where a circuit section is prepared by plating; and (f) subjecting the plate on its exposed area to second plating with a conductive metal by electroplating or electroless plating.

39. A process for producing a circuit member, for a semiconductor device, comprising: a conductive substrate; and a circuit section and the like two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, only the external terminal section in the circuit section having been formed directly on one side of the conductive substrate by plating with the other sections in the circuit section having been formed through an insulating resist, said process being characterized by comprising, in sequence, at least the steps of: (g) surface-treating at least one side of the conductive substrate to provide irregularities thereon; (h) subjecting the conductive substrate on its at least one side with irregularities provided thereon to release treatment for imparting releasability; (i) coating a first insulating resist on the conductive substrate on its at least one side subjected to the surface treatment and the release treatment and exposing only an external terminal section forming area to prepare a first plate; (j) subjecting the plate on its exposed area to first plating with a conductive metal by electroplating; (k) subjecting the whole surface on the first plating side to second plating with a conductive metal by electroless plating; (l) covering the plating, prepared by electroless plating, only in its area where a circuit section is formed, thereby preparing a second plate; and (m) removing the area, exposed in the step of preparing the plate, by etching.

40. The process for producing a circuit member for a semiconductor device according to claim 38, characterized in that the conductive substrate is made of an iron-nickel-chromium-base metal, an iron-chromium-base metal, an iron-nickel-base metal, or an iron-carbon-base metal and the conductive metal plating in the step of the first plating is either copper plating or copper plating using nickel as a substrate and the conductive metal plating in the step of the second plating is copper plating.

41. The process for producing a circuit member for a semiconductor device according to claim 32, characterized in that the surface treatment is sand blasting.

42. The process for producing a circuit member for a semiconductor device according to claim 32, characterized in that the release treatment is a treatment for forming an oxide film on the surface of the conductive substrate.

43. A process for producing a semiconductor device using a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, the whole circuit section having been formed directly on one side of the conductive substrate by plating, said process being characterized by comprising, in sequence, at least the steps of: (i) mounting a semiconductor element, with the terminal facing upward, on a circuit section provided on a conductive substrate and wire-bonding the terminal of the semiconductor element to a lead; (ii) subjecting one side of the lead member, for a semiconductor device, to plastic molding so as to cover the semiconductor element, the wire, and the circuit section of the lead member for a semiconductor device in their entirety; and (iii) removing the conductive substrate in the lead member for a semiconductor device.

44. The process for producing a semiconductor device according to claim 43, characterized by further comprising, after the step of removing the substrate, (iv) the step of coating a solder resist on the surface, exposed by removing the substrate, of the circuit section remote from the surface, with the semiconductor element mounted thereon, so as to expose only the external terminal section of the circuit section and (v) the step of attaching a solder ball to the external terminal section exposed from the solder resist.

45. A process for producing a semiconductor device using a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, the circuit section having no die pad section for mounting a semiconductor element thereon, a plurality of sets of the lead and the external terminal section integrally connected to each other being provided independently of each other, only the external terminal section in the circuit section having been formed directly on one side of the conductive substrate by plating with the other sections in the circuit section having been formed through an insulating resist, said process being characterized by comprising, in sequence, at least the steps of: (vi) mounting a semiconductor element, with the terminal facing upward, on a circuit section provided on a conductive substrate and wire-bonding the terminal of the semiconductor element to a lead; (vii) subjecting one side of the lead member, for a semiconductor device, to plastic molding so as to cover the semiconductor element, the wire, and the circuit section of the lead member for a semiconductor device in their entirety; and (viii) removing the conductive substrate in the lead member for a semiconductor device.

46. The process for producing a semiconductor device according to claim 45, characterized by further comprising, after the step of removing the substrate, (ix) the step of attaching a solder ball to the exposed external terminal section.

47. A semiconductor device characterized by being produced by the process according claim 19.

48. A circuit member, for a semiconductor device, characterized by comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, a plurality of sets of the lead and the external terminal section integrally connected to each other being provided independently of each other, the external terminal section in the circuit section having been formed directly on one side of the conductive substrate by electroplating, the lead in the circuit section having been formed on an insulating epoxy resin layer, the insulating epoxy resin layer having been provided directly on the conductive substrate excluding the external terminal section forming area by transfer molding.

49. The circuit member for a semiconductor device according to claim 48, characterized in that the conductive substrate on its side having the circuit section has been surface-treated to create irregularities and the conductive substrate on its side subjected to surface treatment for creating irregularities thereon has been subjected to release treatment to impart releasability.

50. A process for producing a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, a plurality of sets of the lead and the external terminal section integrally connected to each other being provided independently of each other, the external terminal section in the circuit section having been formed directly on at least one side of the conductive substrate by electroplating, the lead in the circuit section having been formed on an insulating epoxy resin layer, the insulating epoxy resin layer having been provided directly on the conductive substrate excluding the external terminal section forming area by transfer molding, said process being characterized by comprising, in sequence, at least the steps of: (a) surface-treating at least one side of the conductive substrate to provide irregularities thereon; (b) subjecting the conductive substrate on its at least one side with irregularities provided thereon to release treatment for imparting releasability; (c) providing an insulating epoxy resin layer by transfer molding on the conductive substrate in its at least one side subjected to the surface treatment and the release treatment so as to expose only the external terminal section forming area; (d) electroplating the conductive substrate on its exposed area, not covered with the insulating epoxy resin layer, with a conductive metal to a plating thickness approximately equal to the thickness of the insulating epoxy resin layer; (e) coating an insulating resist on the surface of the plating and exposing only a circuit section forming area to prepare a plate; and (f) imparting electrical conductivity to only the exposed area, where a circuit section is to be formed, by plating or coating of a conductive paint or the like to form a circuit section.

51. A process for producing a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, a plurality of sets of the lead and the external terminal section integrally connected to each other being provided independently of each other, the external terminal section in the circuit section having been formed directly on one side of the conductive substrate by electroplating, the lead in the circuit section having been formed on an insulating epoxy resin layer, the insulating epoxy resin layer having been provided directly on the conductive substrate excluding the external terminal section forming area by transfer molding, said process being characterized by comprising, in sequence, at least the steps of: (g) surface-treating at least one side of the conductive substrate to provide irregularities thereon; (h) subjecting the conductive substrate on its at least one side with irregularities provided thereon to release treatment for imparting releasability; (i) providing an insulating epoxy resin layer by transfer molding on the conductive substrate in its at least one side subjected to the surface treatment and the release treatment so as to expose only the external terminal section forming area; (j) subjecting the conductive substrate on its exposed area, not covered with the insulating epoxy resin layer, to first plating with a conductive metal by electroplating to a plating thickness approximately equal to the thickness of the insulating epoxy resin layer; (k) subjecting the whole surface of the first plating to second plating either by electroless plating alone or by electroless plating followed by electroplating, thereby forming a plating of a conductive metal on the whole surface of the first plating; (l) coating an insulating resist on the surface of the electroless plating and preparing a plate in such a manner that only an area, where a circuit section is to be formed, is covered; and (m) etching the electroless plating using the resist as an etching-resistant mask.

52. The process for producing a circuit member for a semiconductor device according to claim 50, characterized in that the step of forming a jig hole for registration is carried out before the preparation of the plate.

53. The process for producing a circuit member for a semiconductor device according to claim 50, characterized in that the surface treatment is sand blasting.

54. The process for producing a circuit member for a semiconductor device according to claim 50, characterized in that the release treatment is a treatment for forming an oxide film on the surface of the conductive substrate.

55. A process for producing a semiconductor device using a circuit member, for a semiconductor device, comprising: a conductive substrate; and a circuit section and the like at least two-dimensionally formed using a conductive metal by plating on the conductive substrate, the circuit section comprising at least a lead for electrical connection to a semiconductor element and an external terminal section for electrical connection to an external circuit, a plurality of sets of the lead and the external terminal section integrally connected to each other being provided independently of each other, only the external terminal section in the circuit section having been formed directly on one side of the conductive substrate by plating with the other sections in the circuit section having been formed through an insulating epoxy resin layer provided by transfer molding, said process being characterized by comprising, in sequence, at least the steps of: (i) mounting a semiconductor element, with the terminal facing upward, on a circuit section provided on a conductive substrate and wire-bonding the terminal of the semiconductor element to a lead; (ii) subjecting one side of the lead section, for a semiconductor device, to plastic molding so as to cover the semiconductor element, the wire, and the circuit section of the lead member for a semiconductor device in their entirety; and (iii) removing the conductive substrate in the lead member for a semiconductor device.

56. The process for producing a semiconductor device according to claim 55, characterized by further comprising, after the step of removing the substrate, (iv) the step of attaching a solder ball to the exposed external terminal section.

57. A semiconductor device characterized by being produced by the process according to claim 55.

58. A circuit member for a semiconductor device, characterized by comprising: a conductive substrate; and a circuit section and the like at least two-dimensionally formed using a conductive metal layer provided by plating on the conductive substrate, at least a part of the circuit section having been provided directly on one side of the conductive substrate by plating, said conductive substrate on its one side having a circuit section being provided with a separating metal plating serving to separate the conductive substrate from the circuit section in the production of a semiconductor device.

59. The circuit member for a semiconductor device according to claim 58, characterized in that the circuit section comprises at least a lead for electrical connection to a semiconductor element and an external terminal section for electrical connection to an external circuit, a plurality of sets of the lead and the external terminal section integrally connected to each other are provided independently of each other and at least a part of the circuit section has been provided directly on one side of the conductive substrate by plating.

60. The circuit member for a semiconductor device according to claim 59, characterized in that the external terminal section in the circuit section has been formed directly on the conductive substrate by plating and the lead in the circuit section has been formed on an insulating layer provided directly on the conductive substrate excluding the external terminal forming area.

61. The circuit member for a semiconductor device according to claim 58, characterized in that the circuit section comprises a plurality of external terminal sections, for electrical connection to an external circuit, provided independently of each other and the external terminal sections have been formed directly on one side of the conductive substrate by plating.

62. The circuit member for a semiconductor device according to claim 61, characterized in that the external terminal sections in the circuit section have been formed in such a manner that the cross section perpendicular to the substrate face has an approximately U shape.

63. The circuit member for a semiconductor device according to claim 61, characterized in that the external terminal comprises a laminated plating of palladium, nickel, silver, and gold or a plating of an alloy of said metals.

64. The circuit member for a semiconductor device according to claim 61, characterized in that the separating metal plating is a metal plating selected from the group consisting of copper, nickel, chromium, zinc, and a group of alloys of said metals.

65. The circuit member for a semiconductor device according to claim 58, characterized in that the circuit section and the like have been formed so that a plurality of semiconductor elements are mounted thereon.

66. The circuit member for a semiconductor device according to claim 58, characterized in that the conductive substrate is made of an iron-nickel-chromium-base metal, an iron-nickel-base metal, or an iron-carbon-base metal.

67. A process for producing a circuit member for a semiconductor device, comprising: a conductive substrate; and a circuit section and the like at least two-dimensionally formed using a conductive metal by plating on the conductive substrate, at least a part of the circuit section having been provided directly on at least one side of the conductive substrate by plating, said conductive substrate on its one side having a circuit section being provided with a separating metal plating serving to separate the conductive substrate from the circuit section in the production of a semiconductor device, said process being characterized by comprising, in sequence, using a conductive substrate having a separating metal plating on at least one side thereof, at least the steps of: (a) coating a resist on at least one side of the conductive substrate and exposing only an area to be plated with a conductive metal to prepare a plate; and (b) plating the plate on its exposed area with a conductive metal.

68. A process for producing a circuit member, for a semiconductor device, comprising: a conductive substrate; and a circuit section and the like at least two-dimensionally formed using a conductive metal by plating on the conductive substrate, at least a part of the circuit section having been provided directly on at least one side of the conductive substrate by plating, said conductive substrate on its one side having a circuit section being provided with a separating metal plating serving to separate the conductive substrate from the circuit section in the production of a semiconductor device, said process being characterized by comprising, in sequence, using a conductive substrate having a separating metal plating on at least one side thereof, at least the steps of: (d) providing an insulating layer on at least one side of the conductive substrate so as to expose at least the external terminal section in the circuit section and to cover a lead forming area; (e) electrolessly plating the conductive substrate on its whole surface provided with the insulating layer to form a first conductive layer, thereby covering said whole surface; (f) providing a resist so as to expose an external terminal section forming area and a lead section forming area in the circuit section of the conductive substrate on its side provided with the first conductive layer; (g) plating the exposed area to form a second conductive layer, thereby simultaneously forming the external terminal section and the lead section; (h) separating and removing the resist alone; and (i) removing the exposed first conductive layer by etching.

69. The process for producing a circuit member for a semiconductor device according to claim 68, characterized in that the first conductive layer is provided by electroless nickel plating and the second conductive layer comprises a gold layer, a copper layer, a nickel layer, and a gold layer provided in that order by electroplating on the first conductive layer.

70. A process for producing a circuit member, for a semiconductor device, comprising: a conductive substrate; and a circuit section and the like at least two-dimensionally formed using a conductive metal by plating on the conductive substrate, at least a part of the circuit section having been provided directly on one side of the conductive substrate by plating, said conductive substrate on its one side having a circuit section being provided with a separating metal plating serving to separate the conductive substrate from the circuit section in the production of a semiconductor device, said process being characterized by comprising, in sequence, using a conductive substrate having a separating metal plating on one side thereof, at least the steps of: (k) providing an insulating layer on one side of the conductive substrate so as to expose at least the external terminal section in the circuit section and to cover a lead forming area; (l) covering the conductive substrate on its whole surface, provided with the insulating layer, with a resist, subjecting the surface of the resist to water repellent treatment, and treating the resist so as to expose the external terminal section forming area and the lead section forming section in the circuit section of the conductive substrate; (m) providing and activating a catalyst and then providing a first conductive layer by electroless plating on the exposed areas; (n) providing a second conductive layer by electroplating on the first conductive layer to simultaneously form an external terminal section and a lead section; and (o) separating and removing the resist alone.

71. The process for producing a circuit member for a semiconductor device according to claim 70, characterized in that the first conductive layer is provided by electroless nickel plating and the second conductive layer comprises a gold layer, a copper layer, a nickel layer, and a gold layer provided in that order by electroplating on the first conductive layer.

72. The process for producing a circuit member for a semiconductor device according to claim 67, characterized in that the circuit section comprises a plurality of external terminal sections, for electrical connection to an external circuit, provided independently of each other and the external terminal sections are formed directly on one side of the conductive substrate by plating.

73. The process for producing a circuit member for a semiconductor device according to claim 67, characterized in that the step of forming a jig hole for registration is carried out at lest before the preparation of the plate.

74. A process for producing a semiconductor device using a circuit member, for a semiconductor device, comprising: a conductive substrate; and a circuit section and the like at least two-dimensionally formed using a conductive metal by plating on the conductive substrate, at least a part of the circuit section having been provided directly on one side of the conductive substrate by plating, said conductive substrate on its one side having a circuit section being provided with a separating metal plating serving to separate the conductive substrate from the circuit section in the production of a semiconductor device, said process being characterized by comprising, in sequence, at least the steps of: (A) conducting die attachment by mounting a semiconductor element on the circuit member for a semiconductor device in its place excluding an external terminal section area; (B) wirebonding the terminal of the semiconductor element to the circuit section to electrically connect the terminal of the semiconductor element to the external terminal section; (C) subjecting one side of the circuit member for a semiconductor device to plastic molding so as to cover the semiconductor element, the wire, and the circuit section in their entirety; and (D) dissolving and removing the separating metal plating section in the conductive substrate to separate the conductive substrate alone.

75. The process for producing a semiconductor device according to claim 74, characterized in that the circuit section in the circuit member for a semiconductor device comprises a plurality of external terminal sections, for electrical connection to an external circuit, provided independently of each other and the external terminal sections are formed directly on one side of the conductive substrate by plating.

76. The process for producing a semiconductor device according to claim 74, characterized by further comprising, after the step of removing the conductive substrate, (e) the step of attaching a solder ball to the exposed external terminal section.

77. A semiconductor device characterized by being produced by the process according to claim 74.

* * * * *